(12) United States Patent
Kim et al.

(10) Patent No.: US 12,159,958 B2
(45) Date of Patent: Dec. 3, 2024

(54) DISPLAY DEVICE

(71) Applicant: Samsung Display Co., Ltd., Yongin-si (KR)

(72) Inventors: Dong Lim Kim, Suwon-si (KR); Cheol Ku Kang, Uiwang-si (KR); Jeong Nyun Kim, Asan-si (KR); Jung Gun Nam, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 487 days.

(21) Appl. No.: 17/454,431

(22) Filed: Nov. 10, 2021

(65) Prior Publication Data
US 2022/0302354 A1 Sep. 22, 2022

(30) Foreign Application Priority Data
Mar. 16, 2021 (KR) .................. 10-2021-0033717

(51) Int. Cl.
*H01L 33/38* (2010.01)
*H01L 25/075* (2006.01)
*H01L 33/62* (2010.01)

(52) U.S. Cl.
CPC ........ *H01L 33/387* (2013.01); *H01L 25/0753* (2013.01); *H01L 33/62* (2013.01)

(58) Field of Classification Search
CPC ... H01L 33/387; H01L 25/0753; H01L 33/62; H01L 27/124; H01L 27/1248; H01L 27/156; H01L 33/38; H01L 33/36; H01L 25/075; H01L 2224/25175; H10K 59/1213; H10K 59/123; H10K 59/124;
(Continued)

(56) References Cited

U.S. PATENT DOCUMENTS

2018/0175009 A1 6/2018 Kim et al.
2018/0175106 A1 6/2018 Kim et al.
(Continued)

FOREIGN PATENT DOCUMENTS

KR 10-2020-0066438 A 6/2020
KR 10-2020-0098767 A 8/2020

OTHER PUBLICATIONS

Extended European Search Report for corresponding EP Application No. 22161253.4, dated Aug. 12, 2022, pp. 1-5.

*Primary Examiner* — Kimberly N Rizkallah
*Assistant Examiner* — Nicholas B Michaud
(74) *Attorney, Agent, or Firm* — Lewis Roca Rothgerber Christie LLP

(57) ABSTRACT

A display device includes a first electrode, a second electrode, and a third electrode extending in one direction on a substrate and being spaced from one another, a first light-emitting element between the first electrode and the second electrode, and a second light-emitting element between the second electrode and the third electrode, a first connection electrode on the first electrode and in contact with a first end of the first light-emitting element, a second connection electrode on one side of the second electrode and in contact with a first end of the second light-emitting element, a third connection electrode on an opposite side of the second electrode and in contact with a second end of the first light-emitting element, and a fourth connection electrode on the third electrode and in contact with a second end of the second light-emitting element.

20 Claims, 39 Drawing Sheets

(58) Field of Classification Search
CPC .. H10K 59/122; H10K 59/131; H10K 59/179; G09G 3/32; G09G 2300/0426; G09G 2300/0809
See application file for complete search history.

(56) References Cited

U.S. PATENT DOCUMENTS

| | | |
|---|---|---|
| 2020/0058701 A1 | 2/2020 | Kim et al. |
| 2021/0375194 A1* | 12/2021 | Kwag ................. H01L 25/0753 |
| 2022/0005975 A1* | 1/2022 | Yang ....................... H01L 33/38 |
| 2022/0093652 A1* | 3/2022 | Park ................... H01L 27/1248 |
| 2022/0140196 A1* | 5/2022 | Kim ................... H01L 25/0753 257/79 |
| 2022/0189939 A1* | 6/2022 | Lee .................... H01L 25/0753 |

* cited by examiner

RME: RME1, RME2, RME3
CNE: CNE1, CNE2, CNE3, CNE4
SA: SA1, SA2
ED: ED1, ED2

DISPLAY DEVICE

CROSS-REFERENCE TO RELATED APPLICATION

This application claims priority to and the benefit of Korean Patent Application No. 10-2021-0033717 filed on Mar. 16, 2021 in the Korean Intellectual Property Office, the entire disclosure of which is incorporated by reference herein.

BACKGROUND

1. Field

The present disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

A display device may include a display panel such as an organic light-emitting display panel and a liquid-crystal display panel for displaying images. Among them, a light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

SUMMARY

Aspects and features of embodiments of the present disclosure provide a display device capable of repairing a dark spot defect that may occur if no light-emitting element is disposed between connection electrodes.

It should be noted that aspects and features of embodiments of the present disclosure are not limited to the above-mentioned aspects and features; and other aspects and features of embodiments of the present disclosure will be apparent to those skilled in the art from the following descriptions.

According to one or more embodiments of the present disclosure, when a current path is disconnected as no light-emitting element is disposed between connection electrodes, an alternative path can be formed between the connection electrodes so that electric current can flow through an electrode pattern and a bridge pattern. For example, if no light-emitting diode is disposed between certain connection electrodes, the current can be guided to other connection electrodes by conducting a repairing process, so that the other light-emitting diodes can emit light normally. In this manner, it is possible to address the issue of a dark spot of the sub-pixel, thereby improving the productivity.

It should be noted that effects, aspects, and features of embodiments of the present disclosure are not limited to those described above, and other effects, aspects, and features of embodiments of the present disclosure will be apparent to those skilled in the art from the following descriptions.

According to one or more embodiments of the present disclosure, a display device includes a first electrode, a second electrode, and a third electrode extending in one direction on a substrate and being spaced from one another, a first light-emitting element between the first electrode and the second electrode, and a second light-emitting element between the second electrode and the third electrode, a first connection electrode on the first electrode and in contact with a first end of the first light-emitting element, a second connection electrode on one side of the second electrode and in contact with a first end of the second light-emitting element, a third connection electrode on an opposite side of the second electrode and in contact with a second end of the first light-emitting element, and a fourth connection electrode on the third electrode and in contact with a second end of the second light-emitting element, a first electrode pattern between the first connection electrode and the third connection electrode and overlapping one end of the first connection electrode and one end of the third connection electrode, and a second electrode pattern between the second connection electrode and the fourth connection electrode and overlapping one end of the second connection electrode and one end of the fourth connection electrode, and a bridge pattern connecting the first electrode pattern with the second electrode pattern.

In one or more embodiments, the display device further includes a bank defining an emission area in which the first light-emitting element and the second light-emitting element are located, and at least one subsidiary area spaced apart from the emission area, wherein the first electrode pattern, the second electrode pattern and the bridge pattern are in the subsidiary area.

In one or more embodiments, the display device further includes one or more insulating layers between the first connection electrode and the first electrode pattern, between the third connection electrode and the first electrode pattern, between the second connection electrode and the second electrode pattern, and between the fourth connection electrode and the second electrode pattern, wherein the first electrode pattern is connected to the third connection electrode and the second electrode pattern is connected to the fourth connection electrode through contact holes penetrating through the one or more insulating layers.

In one or more embodiments, the bridge pattern is connected to the first electrode pattern and the second electrode pattern through other contact holes penetrating through the one or more insulating layers.

In one or more embodiments, the first electrode, the second electrode and the third electrode are under the one or more insulating layers, and wherein the first electrode pattern and the second electrode pattern are at a same layer as the first electrode, the second electrode and the third electrode.

In one or more embodiments, the first connection electrode, the second connection electrode, the third connection electrode, and the fourth connection electrode are on the one or more insulating layers, and wherein the bridge pattern is at a same layer as one of the first connection electrode, the second connection electrode, the third connection electrode, and the fourth connection electrode.

In one or more embodiments, the one or more insulating layers include a first insulating layer on the first electrode, a second insulating layer on the first insulating layer, and a third insulating layer on the second insulating layer, wherein the first connection electrode and the second connection electrode are on the third insulating layer, wherein the third connection electrode and the fourth connection electrode are between the second insulating layer and the third insulating layer, and wherein the bridge pattern is on the third insulating layer.

In one or more embodiments, the one or more insulating layers include a first insulating layer on the first electrode and a second insulating layer on the first insulating layer, wherein the first connection electrode, the second connection electrode, the third connection electrode, and the fourth connection electrode are on the second insulating layer, and wherein the bridge pattern is on the second insulating layer.

According to one or more embodiments of the present disclosure, the display device includes a first electrode, a second electrode, and a third electrode extending in one direction on a substrate and being spaced from one another, a first light-emitting element between the first electrode and the second electrode, and a second light-emitting element between the second electrode and the third electrode, a first connection electrode on the first electrode and in contact with a first end of the first light-emitting element, a second connection electrode on one side of the second electrode and in contact with a first end of the second light-emitting element, a third connection electrode on an opposite side of the second electrode and in contact with a second end of the first light-emitting element, and a fourth connection electrode on the third electrode and in contact with a second end of the second light-emitting element, a first electrode pattern between the first connection electrode and the third connection electrode and overlapping one end of the first connection electrode and one end of the third connection electrode, and a second electrode pattern between the second connection electrode and the fourth connection electrode and overlapping one end of the second connection electrode and one end of the fourth connection electrode, and a bridge pattern connecting the first electrode pattern with the second electrode pattern, wherein one end of the first electrode pattern is connected to the first connection electrode, and an opposite end of the first electrode pattern is connected to the bridge pattern.

In one or more embodiments, the display device further includes one or more insulating layers between the first connection electrode and the first electrode pattern, between the third connection electrode and the first electrode pattern, between the second connection electrode and the second electrode pattern, and between the fourth connection electrode and the second electrode pattern, respectively, wherein the first electrode pattern is cut at a first via hole penetrating through the one or more insulating layers, and wherein the first electrode pattern is connected to the first connection electrode through a second via hole penetrating through the one or more insulating layers, the first electrode pattern, and the first connection electrode.

In one or more embodiments, the first electrode pattern and the first connection electrode come in contact with each other on a side surface of the second via hole.

In one or more embodiments, one end of the second electrode pattern is connected to the fourth connection electrode and an opposite end of the bridge pattern is connected to the second electrode pattern through other contact holes penetrating through the one or more insulating layers.

According to one or more embodiments of the present disclosure, the display device includes a first electrode and a second electrode extending in one direction on a substrate and being spaced from each other, a third electrode between the first electrode and the second electrode, and a fourth electrode on one side of the second electrode, the fourth electrode opposing the second electrode; a first connection electrode on the first electrode, a second connection electrode on the second electrode, a third connection electrode on the third electrode and opposing the first connection electrode, a fourth connection electrode on the first electrode and spaced from the first connection electrode in the one direction, and a fifth connection electrode on the third electrode and spaced from the third connection electrode in the one direction, a first light-emitting element having respective ends in contact with the first connection electrode and the third connection electrode, and a second light-emitting element having respective ends in contact with the fourth connection electrode and the fifth connection electrode, a first electrode pattern between the first connection electrode and the fourth connection electrode and overlapping one end of the first connection electrode and one end of the fourth connection electrode, and a first bridge pattern between the first connection electrode and the fourth connection electrode, the first bridge pattern crossing the first electrode pattern and the third electrode and connecting the first electrode pattern with the third electrode, wherein the one end of the first electrode pattern is connected to the fourth connection electrode.

In one or more embodiments, one or more insulating layers are located between the fourth connection electrode and the first electrode pattern, between the first electrode pattern and the first bridge pattern, and between the first bridge pattern and the third electrode, respectively, and wherein the first electrode pattern is connected to each of the fourth connection electrode and the first bridge pattern through respective contact holes penetrating through the one or more insulating layers, and the first bridge pattern is connected to the third electrode.

In one or more embodiments, the third connection electrode is connected to the third electrode through a contact hole penetrating through the one or more insulating layers, and wherein the third connection electrode is electrically connected to the third electrode, the first bridge pattern, the first electrode pattern and the fourth connection electrode.

In one or more embodiments, the display device further includes a sixth connection electrode on the fourth electrode, a seventh connection electrode on the second electrode and opposing the sixth connection electrode, and an eighth connection electrode on the fourth electrode and spaced from the seventh connection electrode in the one direction; and a third light-emitting element between the sixth connection electrode and the seventh connection electrode, and a fourth light-emitting diode between the second connection electrode and the eighth connection electrode.

In one or more embodiments, the display device further includes a second electrode pattern between the fourth connection electrode and the fifth connection electrode and overlapping one end of the fourth connection electrode and one end of the fifth connection electrode, a third electrode pattern between the sixth connection electrode and the seventh connection electrode and overlapping one end of the sixth connection electrode and one end of the seventh connection electrode, and a second bridge pattern adjacent to the fifth connection electrode and the seventh connection electrode and connected to the second electrode pattern and the third electrode pattern.

In one or more embodiments, the second electrode pattern is connected to the fifth connection electrode and the second bridge pattern and the third electrode pattern is connected to the sixth electrode pattern and the second bridge pattern through other contact holes penetrating through the one or more insulating layers.

In one or more embodiments, the display device further includes a fourth electrode pattern between the seventh connection electrode and the second connection electrode and overlapping one end of the seventh connection electrode and one end of the second connection electrode, and a third bridge pattern between the seventh connection electrode and the second connection electrode, the third bridge pattern crossing the fourth electrode pattern and the fourth electrode, and connecting the fourth electrode pattern with the fourth electrode, wherein the fourth electrode pattern is connected to the seventh connection electrode and the third bridge pattern through respective contact holes penetrating through the one or more insulating layers.

According to one or more embodiments of the present disclosure, the display device includes a first electrode and a second electrode extending in one direction on a substrate and being spaced from each other, a third electrode between the first electrode and the second electrode, and a fourth electrode on one side of the second electrode, the fourth electrode being opposing the second electrode, a first connection electrode on the first electrode, a second connection electrode on the second electrode, a third connection electrode on the third electrode and opposing the first connection electrode, a fourth connection electrode on the first electrode and spaced apart from the first connection electrode in the one direction, and a fifth connection electrode on the third electrode and spaced from the third connection electrode in the one direction, a first light-emitting element having respective ends in contact with the first connection electrode and the third connection electrode, and a second light-emitting element having respective ends in contact with the fourth connection electrode and the fifth connection electrode, a first electrode pattern between the first connection electrode and the fourth connection electrode, the first electrode pattern overlapping one end of the first connection electrode and one end of the third connection electrode, and connected to one end of the third connection electrode, a first bridge pattern between the first connection electrode and the fourth connection electrode, the first bridge pattern crossing the first electrode pattern and the third electrode, and connecting the first electrode pattern with the third electrode, and one or more insulating layers between the first connection electrode and the first electrode pattern, between the fourth connection electrode and the first electrode pattern, and between the first bridge pattern and the third electrode, wherein the first bridge pattern is cut at a first via hole penetrating through the one or more insulating layers and the first bridge pattern, and wherein the first electrode pattern is connected to the first connection electrode through a second via hole penetrating through the one or more insulating layers, the first electrode pattern, and the first connection electrode.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This invention may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings, spirit, and scope of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
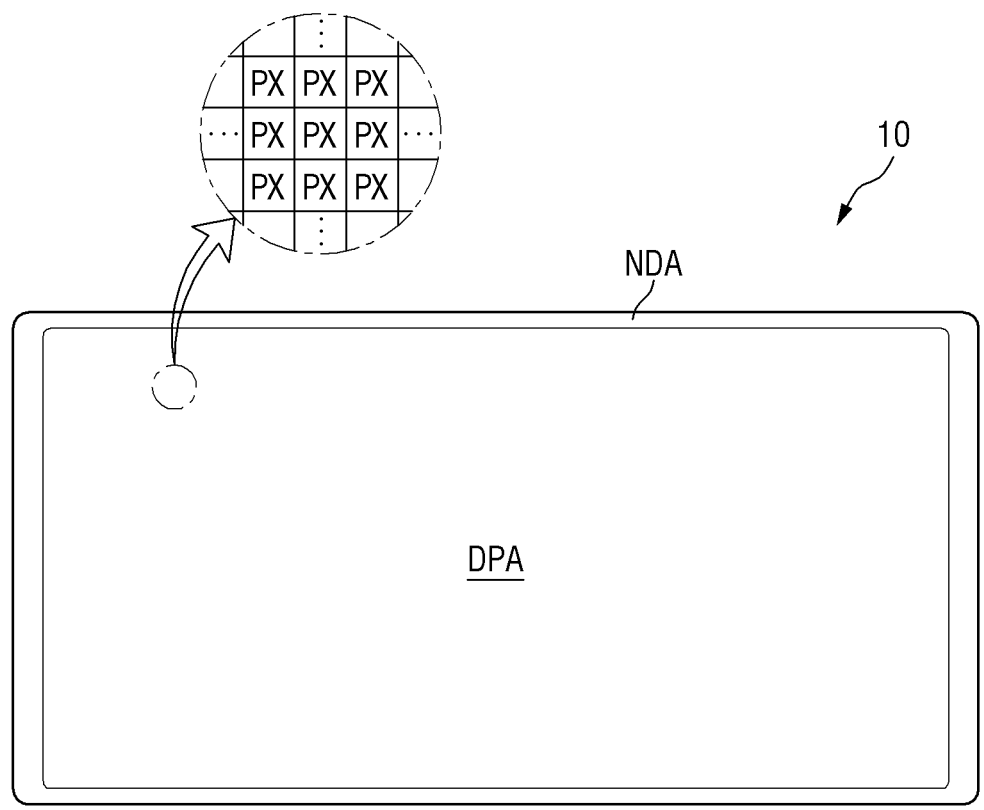
FIG. 1 is a plan view of a display device according to one or more embodiments of the present disclosure.

FIG. 1 is a plan view of a display device according to one or more embodiments of the present disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other display panel may be employed as long as the technical idea of the present disclosure can be equally applied.

A first direction DR1, a second direction DR2, and a third direction DR3 are defined in the drawings. The display device 10 according to one or more embodiments of the present disclosure will be described with reference to the drawings. The first direction DR1 may be perpendicular to the second direction DR2 in a plane. The third direction DR3 may be perpendicular to the plane where the first direction DR1 and the second direction DR2 are located. The third direction DR3 may be perpendicular to each of the first direction DR1 and the second direction DR2. In the following description of the display devices 10 according to one or more embodiments of the present disclosure, the third direction DR3 refers to the thickness direction of the display device 10.

The shape of the display device 10 may be modified in a variety of ways. For example, the display device 10 may have a rectangular shape including longer sides in the first direction DR1 and shorter sides in the second direction DR2 when viewed from the top. For another example, the display device 10 may have a rectangular shape including longer sides in the second direction DR2 and shorter sides in the first direction DR1 when viewed from the top. It should be understood that the present disclosure is not limited thereto. The display device 10 may have a variety of shapes such as a square, a quadrangle with rounded corners (vertices), other polygons, and a circle. The shape of a display area DPA of the display device 10 may also be similar to the overall shape of the display device 10. FIG. 1 shows the display device 10 and the display area DPA in the shape of a rectangle having longer side in the first direction DR1 and shorter sides in the second direction DR2.

The display device 10 may include a display area DPA and a non-display area NDA around an edge or periphery of the display area DPA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be, but is not limited to, a rectangle or a square when viewed from the top. Each pixel may have a diamond shape having sides inclined with respect to a direction. The pixels PX may be arranged in stripes or a PENTILE™ arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include at least one light-emitting element that emits light of a particular wavelength band to represent a color.

The non-display area NDA may be disposed around the display area DPA. In one or more embodiments, the non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in the non-display area NDA, or external devices may be mounted.

Figure 2:
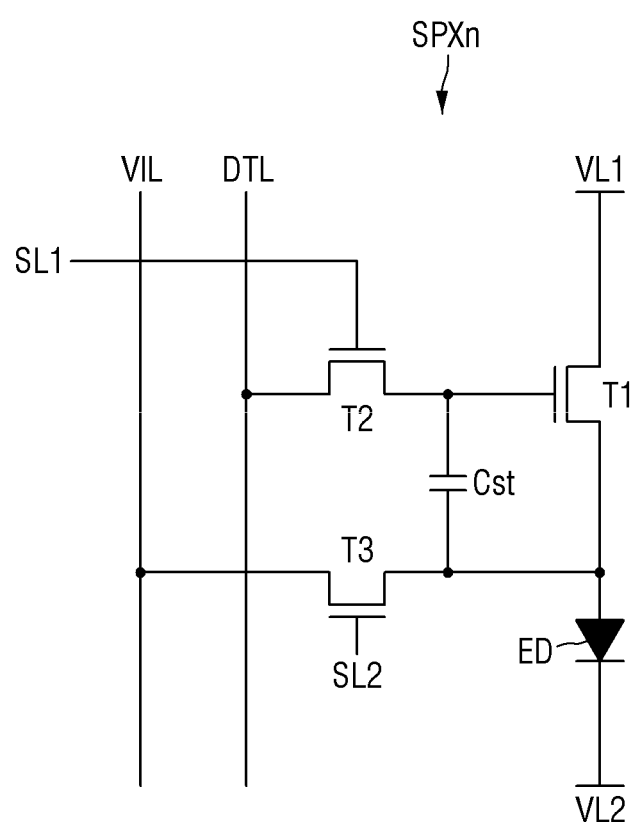
FIG. 2 is an equivalent circuit diagram of a sub-pixel of a display device according to one or more embodiments of the present disclosure.

FIG. 2 is an equivalent circuit diagram of a sub-pixel of a display device according to one or more embodiments of the present disclosure.

Referring to FIG. 2, each of the sub-pixels SPXn of the display device 10 according to one or more embodiments may include three transistors T1, T2, and T3 and one storage capacitor Cst in addition to a light-emitting diode ED.

The light-emitting diode ED emits light that is proportional to the current supplied to the light emitting diode ED through the first transistor T1. The light-emitting diode ED can emit light in a particular wavelength range by an electric signal transmitted from a first electrode and a second electrode connected to respective ends.

A first end of the light-emitting diode ED may be connected to a source electrode of the first transistor T1, and a second end thereof may be connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting diode ED according to the voltage difference between a gate electrode and the source electrode (e.g., gate to source voltage) of the first transistor T1. For example, the first transistor T1 may be a driving transistor for driving the light-emitting diode ED. The gate electrode of the first transistor T1 may be connected to a source electrode of the second transistor T2, the source electrode thereof may be connected to the first end of the light-emitting diode ED, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting diode ED. The gate electrode of the third transistor T3 may be connected to the second scan line SL2, the drain electrode thereof may be connected to the initialization voltage line VIL, and the source electrode thereof may be connected to one end of the light-emitting diode ED or the source electrode of the first transistor T1. Although the first scan line SL1 and the second scan line SL2 are separately depicted in the drawings, the present disclosure is not limited thereto. In one or more embodiments, the first scan line SL1 and the second scan line SL2 may be made up of a single line, and in such case, the second transistor T2 and the third transistor T3 may be turned on concurrently (e.g., turned on simultaneously) by the same scan signal.

The source electrode and the drain electrode of each of the transistors T1, T2, and T3 are not limited to those described above. They may be connected in the opposite way. In addition, each of the transistors T1, T2, and T3 may be formed as a thin-film transistor. Further, although each of the transistors T1, T2, and T3 implemented as an n-type MOSFET (metal oxide semiconductor field effect transistor) in the example shown in FIG. 2, the present disclosure is not limited thereto. That is to say, each of the transistors T1, T2, and T3 may be implemented as a p-type MOSFET, or some of the transistors T1, T2, and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage (e.g., gate to source voltage) of the first transistor T1.

Hereinafter, the structure of one pixel PX of the display device 10 according to one or more embodiments will be described in detail with reference to other drawings.

Figure 3:
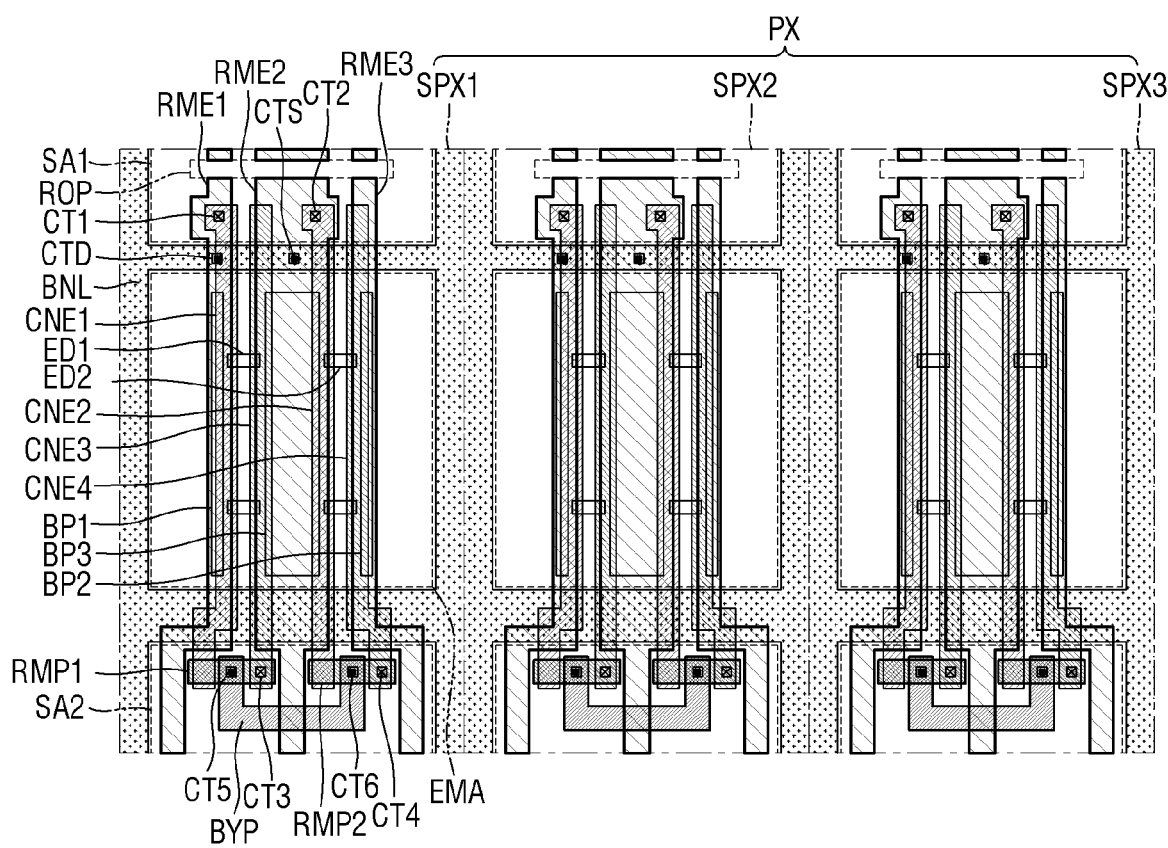
FIG. 3 is a plan view showing a pixel of a display device according to one or more embodiments of the present disclosure.
Figure 3:
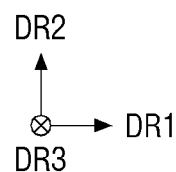

FIG. 3 is a plan view showing a pixel of a display device according to one or more embodiments of the present disclosure.

Referring to FIG. 3, each of the plurality of pixels PX of the display device 10 may include a plurality of sub-pixels SPXn, where n is an integer from one to three. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the present disclosure is not limited thereto. All the sub-pixels SPXn may emit light of the same color. According to one or more embodiments of the present disclosure, the sub-pixels SPXn may emit blue light. Although the single pixel PX includes three sub-pixels SPXn in the example shown in FIG. 3, the present disclosure is not limited thereto. The pixel PX may include more than three sub-pixels SPXn.

Each of the sub-pixels SPXn of the display device 10 may include an emission area EMA and a non-emission area. In the emission area EMA, light-emitting diodes ED may be disposed to emit light of a particular wavelength. In the non-emission area, no light-emitting diode ED is disposed and light emitted from the light-emitting diodes ED do not reach and thud no light exits therefrom. The emission area EMA may include an area in which the light-emitting diodes ED are disposed, and may include an area adjacent to the light-emitting diodes ED where lights emitted from the light-emitting diodes ED exit.

It is, however, to be understood that the present disclosure is not limited thereto. The emission area EMA may also include an area in which light emitted from the light-emitting diodes ED is reflected or refracted by other elements to exit. The plurality of light-emitting diodes ED may be disposed in each of the sub-pixels SPXn, and the emission area EMA may include the area where the light-emitting elements are disposed and adjacent areas.

Although the emission areas EMA of the sub-pixels SPXn have substantially the uniform area in the example shown in the drawings, the present disclosure is not limited thereto. In one or more embodiments, the emission areas EMA of the sub-pixels SPXn may have different areas depending on a color or wavelength band of light emitted from the light-emitting diodes ED disposed in the respective sub-pixels.

In addition, each of the sub-pixels SPXn may further include subsidiary areas SA disposed in the non-emission area. The subsidiary areas SA may include a first subsidiary area SA1 and a second subsidiary area SA2. The first subsidiary area SA1 may be disposed on a side of the emission area EMA in the second direction DR2, and may be disposed between the emission areas EMA of the sub-pixels PXn that are adjacent to each other in the second direction DR2. The second subsidiary area SA2 may be disposed on the opposite side of the emission area EMA in the second direction DR2, and may be disposed between the emission area EMA and the first subsidiary area SA1 of the sub-pixels SPXn that is adjacent to it (e.g., the current sub-pixel SPXn) in the opposite direction to the second direction DR2. For example, the plurality of emission areas EMA and the subsidiary areas SA may be arranged repeatedly along the second direction DR2, and in some embodiments, may be arranged alternately. In one pixel PX shown in FIG. 3, the emission area EMA and the subsidiary areas SA disposed on the upper and lower sides of the emission area EMA, respectively, may form a single sub-pixel SPXn. Such sub-pixels SPXn may be repeatedly arranged along the first direction DR1.

A bank BNL may be disposed between the subsidiary areas SA and the emission areas EMA, and the distance between them may vary depending on the width of the bank BNL. No light-emitting diode ED is disposed in the subsidiary areas SA and thus no light exits therefrom. Some of electrodes RME disposed in the sub-pixels SPXn may be disposed in the subsidiary areas SA. Some of the electrodes RME disposed in different sub-pixels SPXn may be disconnected at a separation region ROP of the first subsidiary area SA1.

The bank BNL may be disposed in a lattice pattern on the front surface of the display area DPA including portions extended in the first direction DR1 and the second direction DR2 when viewed from the top. The bank BNL may be disposed along the border of each of the sub-pixels PXn to distinguish between adjacent sub-pixels PXn. In addition, the bank BNL may be disposed to be around (or surround) the emission area EMA disposed in each of the sub-pixels SPXn to distinguish between them.

Each pixel PX or sub-pixel SPXn of the display device 10 may include a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to one or more embodiments of the present disclosure, a pixel driving circuit of each of the sub-pixels SPXn of the display device 10 may have a 3T1C structure, i.e., it may include three transistors and one capacitor, as shown in FIG. 2. It should be understood that the present disclosure is not limited thereto. The pixel driving circuit may employ a variety of other modified pixel structures PX such as a 2T1C structure, a 7T1C structure, and a 6T1C structure.

Figure 4:
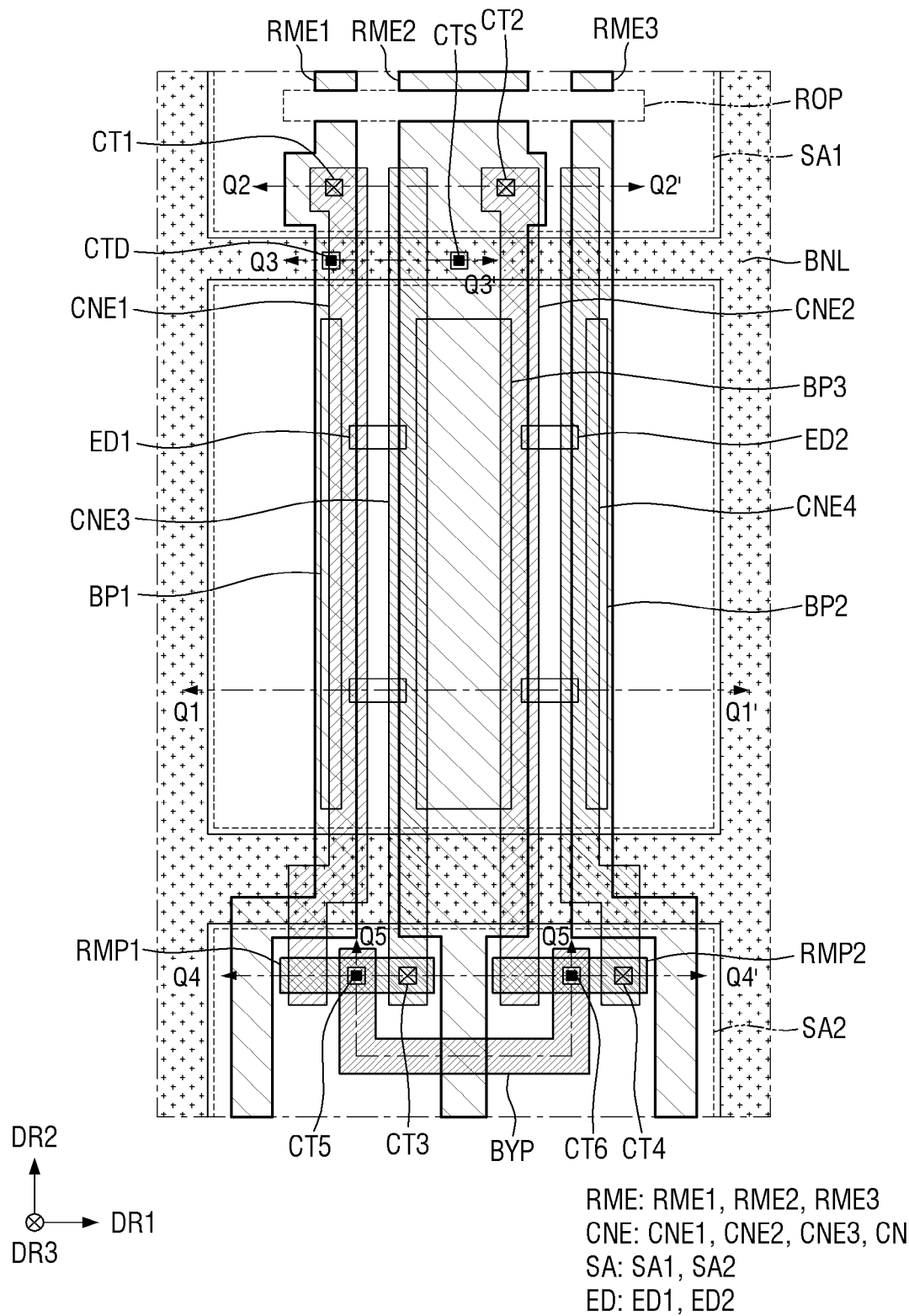
FIG. 4 is a plan view showing the first sub-pixel of FIG. 3.
Figure 5:
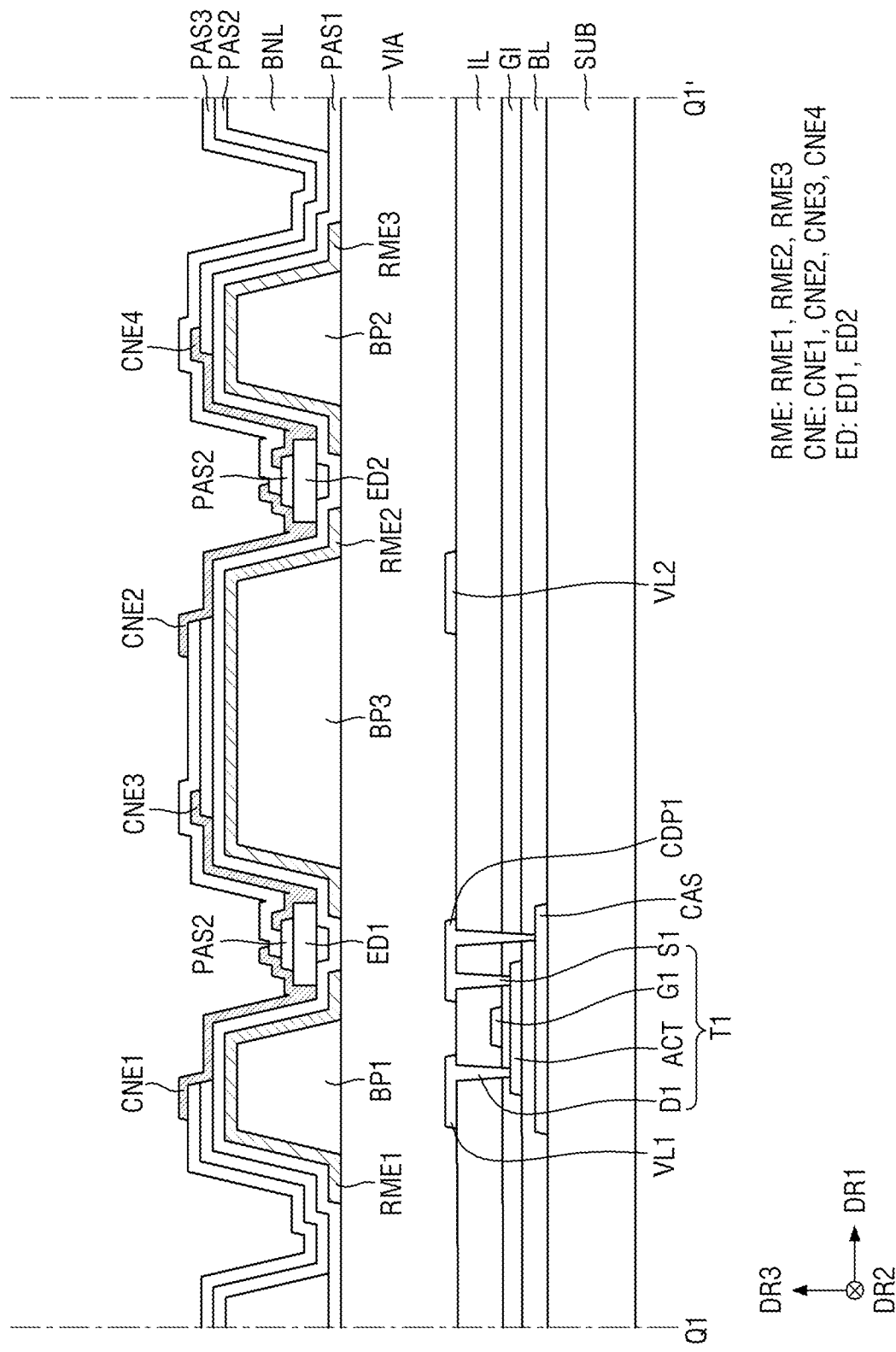
FIG. 5 is a cross-sectional view taken along the line Q1-Q1' of FIG. 4.
Figure 6:
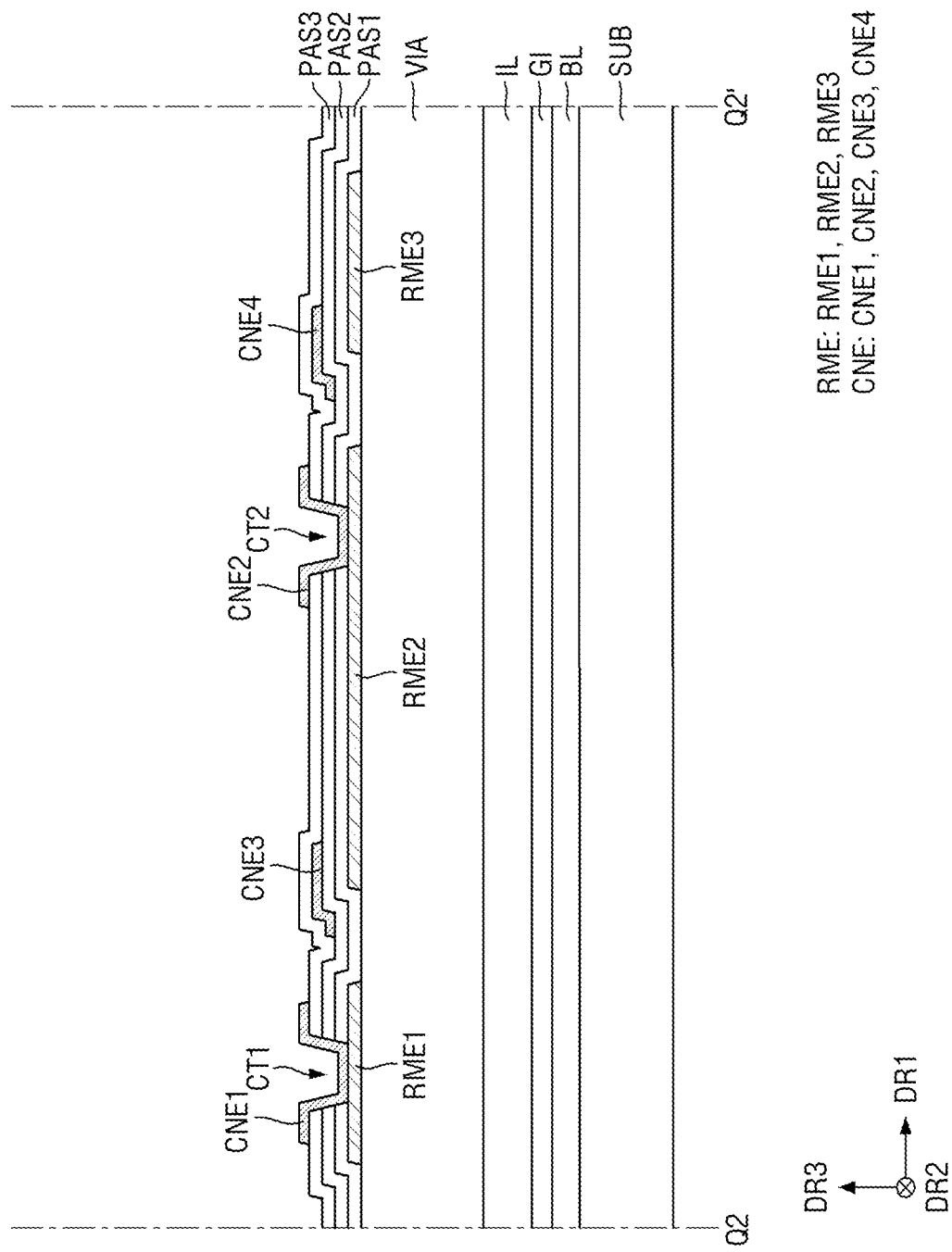
FIG. 6 is a cross-sectional view taken along the line Q2-Q2' of FIG. 4.
Figure 7:
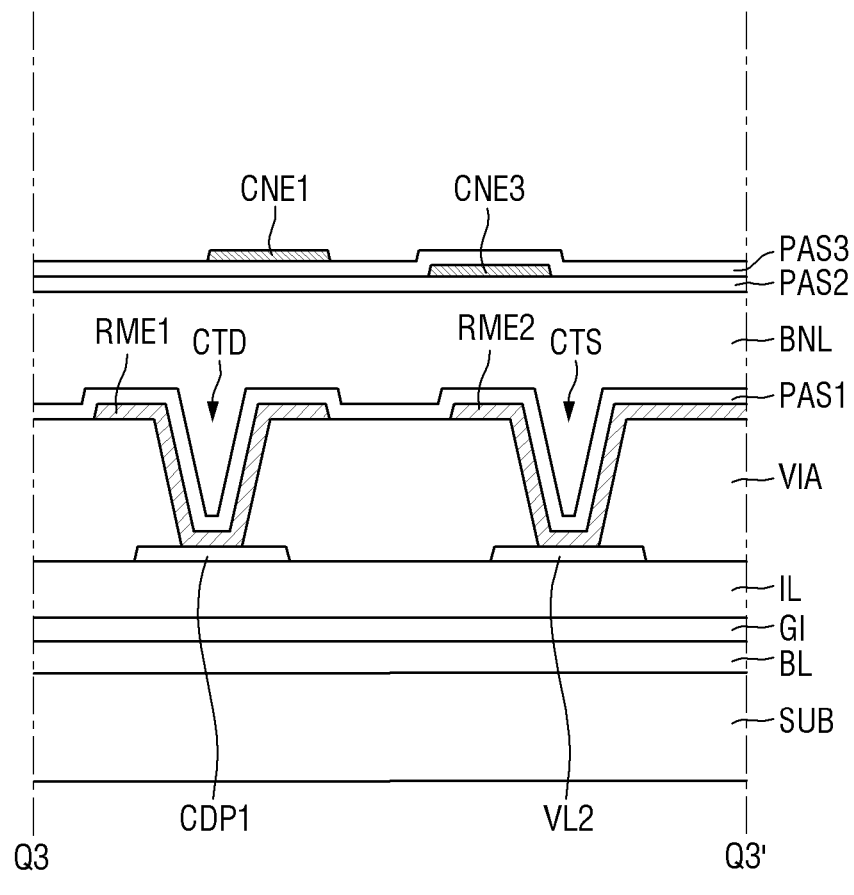
FIG. 7 is a cross-sectional view taken along the line Q3-Q3' of FIG. 4.
Figure 8:
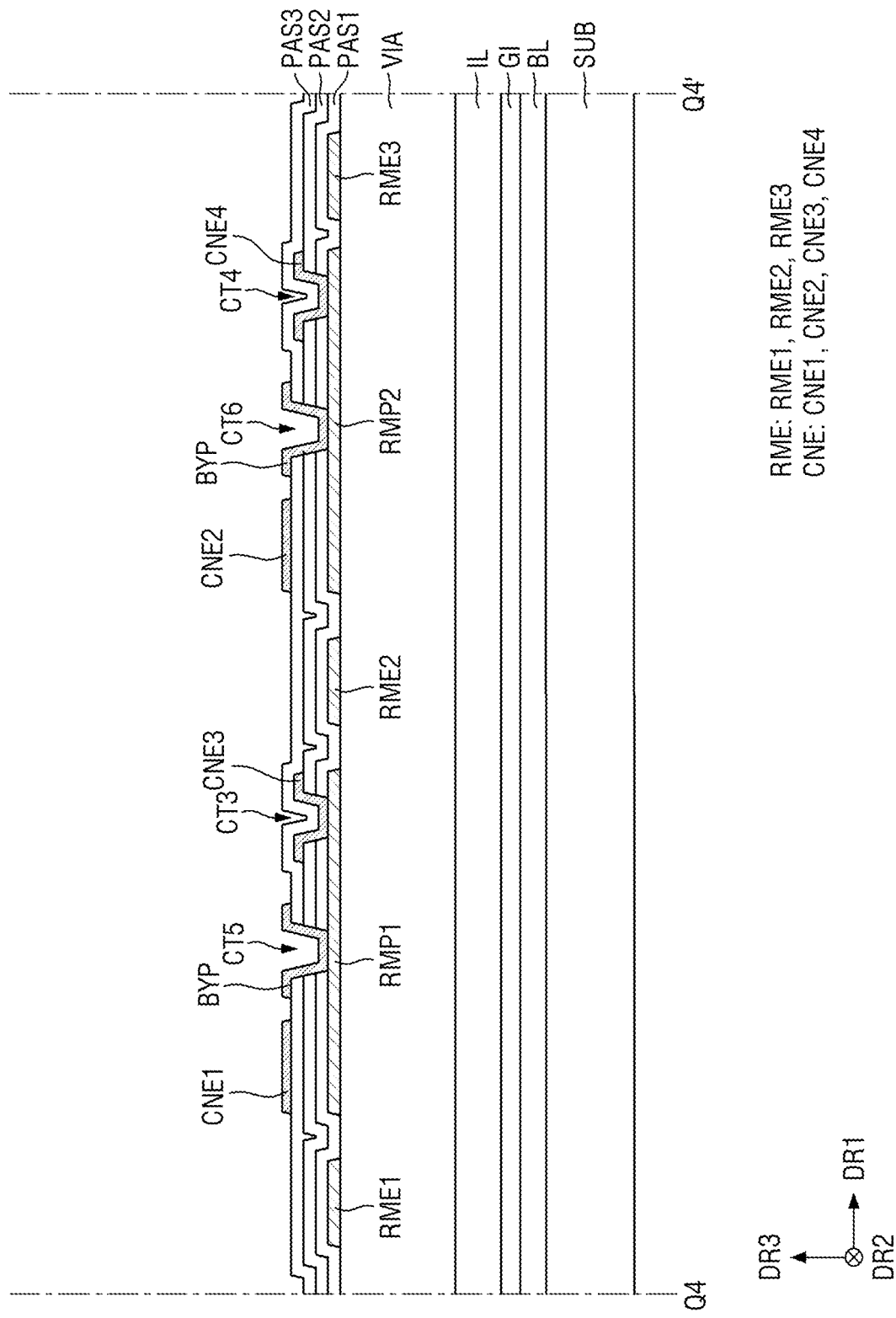
FIG. 8 is a cross-sectional view taken along the line Q4-Q4' of FIG. 4.
Figure 9:
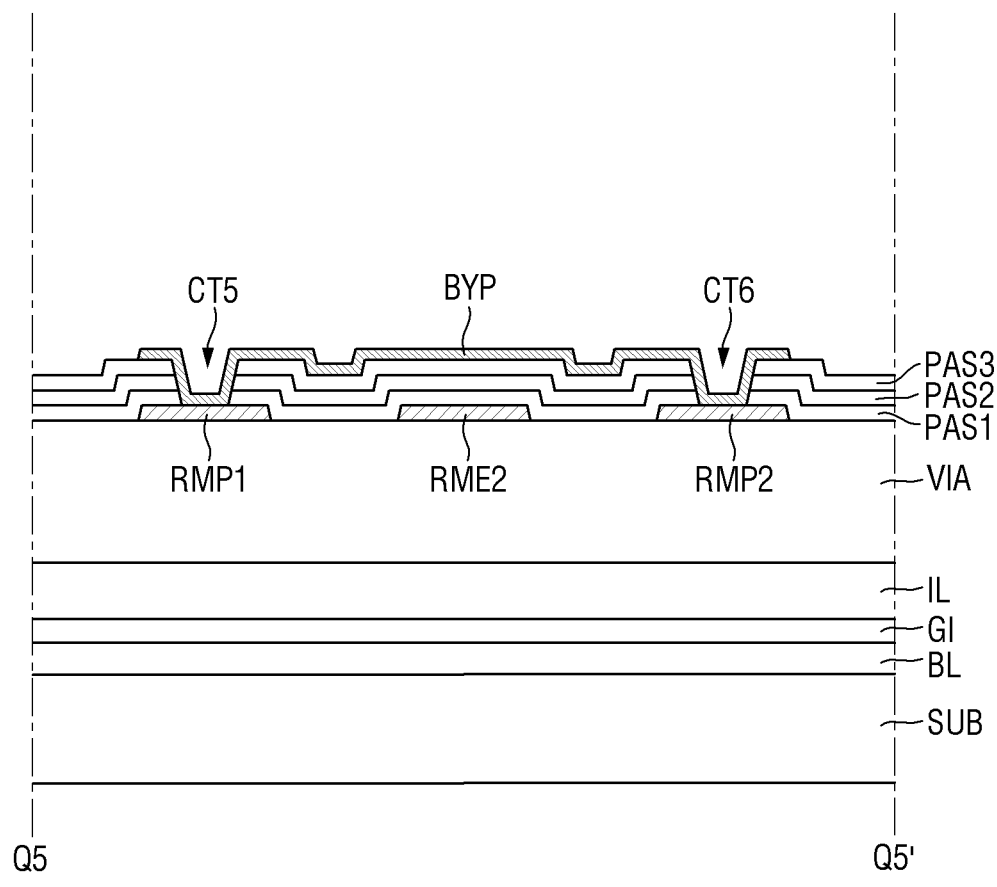
FIG. 9 is a cross-sectional view taken along the line Q5-Q5' of FIG. 4.

FIG. 4 is a plan view showing the first sub-pixel of FIG. 3. FIG. 5 is a cross-sectional view taken along the line Q1-Q1' of FIG. 4. FIG. 6 is a cross-sectional view taken along the line Q2-Q2' of FIG. 4. FIG. 7 is a cross-sectional view taken along the line Q3-Q3' of FIG. 4. FIG. 8 is a cross-sectional view taken along the line Q4-Q4' of FIG. 4. FIG. 9 is a cross-sectional view taken along the line Q5-Q5' of FIG. 4. In the following description, the same or similar elements will be denoted by the same or similar reference numerals, and redundant descriptions will be omitted or briefly described Referring to FIGS. 4-7 in conjunction with FIG. 3, the display device 10 may include a substrate SUB, a semiconductor layer disposed on the substrate SUB, a plurality of conductive layers, and a plurality of insulating layers. The semiconductor layer, the conductive layers, and the insulating layers may form a transistor layer and an emission material layer of the display device 10.

For example, the substrate SUB may be an insulating substrate. The substrate SUB may be made of an insulating material such as glass, quartz, and a polymer resin. The substrate SUB may be either a rigid substrate or a flexible substrate that can be bent, folded, and/or rolled.

A first conductive layer may be disposed on the substrate SUB. The first conductive layer may include a bottom metal layer CAS. The bottom metal layer CAS may be disposed to overlap an active layer ACT of the first transistor T1 in the third direction DR3. The bottom metal layer CAS may include a material that blocks light, and thus can prevent light from entering the active layer ACT of the first transistor T1. It is, however, to be noted that the bottom metal layer CAS may be eliminated.

A buffer layer BL may be disposed on the bottom metal layer CAS and the substrate SUB. The buffer layer BL may be formed on the substrate SUB to protect the transistors from moisture permeating through the substrate SUB that is susceptible to moisture permeation, and may also provide a flat surface.

The semiconductor layer may be disposed on the buffer layer BL. The semiconductor layer may include the active layer ACT of the first transistor T1. The active layer ACT may be disposed to partially overlap with a gate electrode G1 (of the first transistor T1) of a second conductive layer, which will be described later, in the third direction DR3.

The semiconductor layer may include polycrystalline silicon, monocrystalline silicon, an oxide semiconductor, etc. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 is disposed in the sub-pixel SPXn of the display device 10 in the drawing, the present disclosure is not limited thereto. A larger number of transistors may be included in the display device 10.

The gate insulator GI may be disposed on the active layer ACT and the buffer layer BL. The gate insulator GI may work as a gate insulating layer of the first transistor T1.

The second conductive layer may be disposed on the gate insulator GI. The second conductive layer may include a gate electrode G1 of the first transistor T1. The gate electrode G1 may be disposed so that it overlaps a channel region of the active layer ACT in the thickness direction, i.e., the third direction DR3.

An interlayer dielectric layer IL may be disposed on the second conductive layer and the gate insulator GI. The interlayer dielectric layer IL may work as an insulating layer between the second conductive layer and other layers disposed thereon and can protect the second conductive layer.

A third conductive layer may be disposed on the interlayer dielectric layer IL. The third conductive layer may include a first voltage line VL1, a second voltage line VL2, and a conductive pattern CDP1.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A portion of the first voltage line VL1 may be in contact with the active layer ACT of the first transistor T1 through a contact hole penetrating the interlayer dielectric layer IL and the gate insulator GI. The first voltage line VL1 may work as the first drain electrode D1 of the first transistor T1. The second voltage line VL2 may be directly connected to the second electrode RME2 to be described later. In addition, the first voltage line VL1 may be directly connected to a first connection electrode CNE1 to be described later, and the second voltage line VL2 may be directly connected to a second connection electrode CNE2 to be described later.

The first conductive pattern CDP1 may be in contact with the active layer ACT of the first transistor T1 through a contact hole penetrating the interlayer dielectric layer IL and the gate insulator GI. In addition, the first conductive pattern CDP1 may be in contact with the bottom metal layer CAS through another contact hole penetrating the interlayer dielectric layer IL, the gate insulator GI, and the buffer layer BL. The first conductive pattern CDP1 may work as a first source electrode S1 of the first transistor T1.

The buffer layer BL, the gate insulator GI and the interlayer dielectric layer IL may be made up of multiple inorganic layers stacked on one another alternately. For example, the buffer layer BL, the gate insulator GI, and the interlayer dielectric layer IL may be made up of a double layer in which inorganic layers including at least one of silicon oxide (SiOx), silicon nitride (SiNx), and silicon oxynitride (SiON) are stacked on one another or multiple layers in which they are alternately stacked on one another. It is, however, to be understood that the present disclosure is not limited thereto. The buffer layer BL, the gate insulator GI, and the interlayer dielectric layer IL may be made up of a single inorganic layer including the above-described insulating material. In addition, in one or more embodiments, the interlayer dielectric layer IL may be made of an organic insulating material such as polyimide (PI) and polyacrylate.

The second conductive layer and the third conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the present disclosure is not limited thereto.

A via layer VIA may be disposed on the third conductive layer and the interlayer dielectric layer IL. The via layer VIA may include an organic insulating material, for example, an organic insulating material such as polyimide (PI) and polyacrylate, to provide a flat surface.

A plurality of electrodes RME: RME1, RME2, and RME3, a plurality of bank patterns BP: BP1, BP2, and BP3, a plurality of light-emitting diodes ED: ED1 and ED2, and a plurality of connection electrodes CNE: CNE1, CNE2, CNE3, and CNE4 may be disposed on the via layer VIA as a display element layer. In addition, a plurality of insulating layers PAS1, PAS2, and PAS3 may be disposed on the via layer VIA.

The plurality of bank patterns BP may be disposed directly on the via layer VIA. The plurality of bank patterns BP may include a first bank pattern BP1, a second bank pattern BP2, and a third bank pattern BP3 that is disposed between the first bank pattern BP1 and the second bank pattern BP2. The first bank pattern BP1 may be disposed on the left side of the center of the emission area EMA, the second bank pattern BP2 may be disposed on the right side of the center of the emission area EMA, and the third bank pattern BP3 may be disposed at the center of the emission area EMA. The plurality of bank patterns BP may have a shape extended in the second direction DR2 and may be spaced from one another in the first direction DR1.

The first bank pattern BP1 and the second bank pattern BP2 may have substantially the same width, but the present disclosure is not limited thereto. They may have different widths. The length of the first bank pattern BP1 and the second bank pattern BP2 extended in the second direction DR2 may be smaller than the length of the emission area EMA surrounded by the bank BNL in the second direction DR2.

The third bank pattern BP3 may be disposed in the emission area EMA of the sub-pixel SPXn and may have a shape extended in the second direction DR2. The third bank pattern BP3 may form an island-shaped pattern extended in the second direction DR2 having a large width in the emission area EMA of each sub-pixel SPXn on the front surface of the display area DPA. The third bank pattern BP3 may be disposed at the center of the emission area EMA, and the first bank patterns BP1 may be disposed to be spaced from the second bank pattern BP2 with the third bank pattern BP3 disposed therebetween. Light-emitting diodes ED may be disposed between the first bank pattern BP1 and the third bank pattern BP3 that are spaced from each other and between the third bank pattern BP3 and the second bank pattern BP2 that are spaced from each other.

The plurality of bank patterns BP may have the same length in the second direction DR2, but may have different widths measured in the first direction DR1. The width of the first bank pattern BP1 measured in the first direction DR1 may be substantially equal to that of the second bank pattern BP2, and the width of the third bank pattern BP3 measured in the first direction DR1 may be greater than that of the first bank pattern BP1 and the second bank pattern BP2. The distance between the plurality of bank patterns BP in the first direction DR1 may be greater than the distance between the adjacent electrodes RME. Accordingly, at least a portion of each of the electrodes RME may not overlap the bank patterns BP.

The bank patterns BP may have a structure that at least partly protrudes from the upper surface of the via layer VIA. The protruding portions of the bank patterns BP may have inclined or curved side surfaces. Unlike that shown in the drawings, the bank patterns BP may have a shape of a semi-circle or semi-ellipse having curved outer surface in the cross-sectional view. The bank patterns BP may include, but is not limited to, an organic insulating material such as polyimide (PI) and polyacrylate.

The plurality of electrodes RME may have a shape extended in a direction and may be disposed in each of the sub-pixels SPXn. The plurality of electrodes RME may be extended in the second direction DR2 to be disposed across the emission area EMA and the subsidiary areas SA of the sub-pixel SPXn, and they may be spaced from one another in the first direction DR1.

The display device 10 may include a first electrode RME1, a second electrode RME2, and a third electrode RME3 disposed in each sub-pixel SPXn. The second electrode RME2 may be disposed between the first electrode RME1 and the third electrode RME3. The first electrode RME1, the second electrode RME2, and the third electrode RME3 may be arranged in this order from the left side to the right side of the sub-pixel SPXn.

The first electrode RME1 may be disposed on the left side of the emission area EMA on the first bank pattern BP1. The second electrode RME2 may be disposed on the third bank pattern BP3 to be adjacent to and face (or be opposite) the first electrode RME1. The third electrode RME3 may be disposed on the second bank pattern BP2 to be adjacent to and face (or be opposite) the second electrode RME2. The first electrode RME1 and the second electrode RME2 may face (or be opposite) each other, and the light-emitting diodes ED may be disposed therebetween. The second electrode RME2 and the third electrode RME3 may face (or be opposite) each other, and the light-emitting diodes ED may be disposed therebetween.

The plurality of electrodes RME may be disposed at least on the inclined side surfaces of the bank patterns BP. The electrodes RME may be disposed to cover at least side surfaces of the bank patterns BP to reflect light emitted from the light-emitting diodes ED. The distance between the electrodes RME that are spaced from one another in the first direction DR1 may be smaller than the distance between the bank patterns BP. At least a portion of each of the electrodes RME may be disposed directly on the via layer VIA so that they may be disposed at the same plane.

In addition, the first electrode RME1 and the second electrode RME2 may be connected to the third conductive layer through a first electrode contact hole CTD and a second electrode contact hole CTS, respectively, which are formed at such locations that they overlap with the bank BNL in the third direction DR3. The first electrode RME1 may be in contact with the first conductive pattern CDP1 through the first electrode contact hole CTD penetrating through the via layer VIA thereunder. The second electrode RME2 may be in contact with the second voltage line VL2 through the second contact hole CTS penetrating through the via layer VIA thereunder. The first electrode RME1 may be electrically connected to the first transistor T1 through the first conductive pattern CDP1 to receive the first supply voltage. The second electrode RME2 may be electrically connected to the second voltage line VL2 to receive the second supply voltage. Although the first electrode contact hole CTD and the second electrode contact hole CTS are formed under the bank BNL in the drawings, the present disclosure is not limited thereto. The electrode contact holes CTD and CTS may be disposed either in the emission area EMA or in the subsidiary area SA.

It should be noted that the third electrode RME3 is not directly connected to the third conductive layer thereunder but may be electrically connected to the first electrode RME1 and the second electrode RME2 through the light-emitting diodes ED and the connection electrodes CNE. The first electrode RME1 and the second electrode RME2 may be first-type electrodes connected directly to the third conductive layer through the electrode contact holes CTD and CTS, respectively, while the third electrode RME3 may be second-type electrodes that are not directly connected to the third conductive layer. The second-type electrodes may provide an electrical connection path between the light-emitting diodes ED together with the connection electrodes CNE.

The electrodes RME disposed in different sub-pixels SPXn adjacent to each other in the second direction DR2 or the opposite direction may be spaced from each other at the separation region ROP in the subsidiary area SA. Such arrangement of the electrodes RME may be formed by forming single electrode lines extended in the second direction DR2 and disposing and aligning the light-emitting diodes ED thereon, and then separating the electrode lines into parts during a subsequent process. The electrode lines may be used to generate an electric field in the sub-pixel SPXn to align the light-emitting diodes ED during the process of fabricating the display device 10.

After aligning the light-emitting diodes ED, the electrode lines are separated at the separation region ROP, such that the plurality of electrodes RME that are spaced from each other in the second direction DR2 may be formed. The process of separating the electrode lines may be carried out after the process of forming the second passivation layer PAS2, and the second passivation layer PAS2 may not be disposed at the separation region ROP. The second passivation layer PAS2 may be utilized as a mask pattern in a process of separating the electrode lines.

The plurality of electrodes RME may be electrically connected to the light-emitting diodes ED. The electrodes RME may be connected to the light-emitting diodes ED through the connection electrodes CNE to be described below, and may transmit electric signals applied from a conductive layer thereunder to the light-emitting diodes ED.

Each of the electrodes REM may include a conductive material having a high reflectance. For example, the electrodes RME may include a metal such as silver (Ag), copper (Cu) and aluminum (Al) as the material having a high reflectance, and may be an alloy including aluminum (Al), nickel (Ni), lanthanum (La), etc. The electrodes RME may reflect light that is emitted from the light-emitting diodes ED and travels toward the side surfaces of the bank patterns BP toward the upper side of each of the sub-pixels SPXn.

It is, however, to be understood that the present disclosure is not limited thereto. The electrodes RME may further include a transparent conductive material. For example, each of the electrodes RME may include a material such as ITO, IZO, and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO.

The first insulating layer PAS1 may be disposed on the via layer VIA, the bank patterns BP, and the plurality of electrodes RME. The first insulating layer PAS1 may be disposed on the via layer VIA to cover the plurality of electrodes RME and the bank patterns BP. In addition, the first insulating layer PAS1 may not be disposed in the subsidiary areas SA. For example, the first insulating layer PAS1 may not be disposed at the separation region ROP where the electrodes RME that are adjacent to each other in the second direction DR2 are spaced from each other in the first sub-region SA1. The first passivation layer PAS1 can protect the plurality of electrodes RME and can insulate different electrodes RME from each other. In addition, the first insulating layer PAS1 can also prevent that the light-emitting diodes ED disposed thereon are brought into contact with other elements and damaged.

In one or more embodiments, the first insulating layer PAS1 may have steps so that a portion of the upper surface is recessed between the electrodes RME that are spaced from each other along the first direction DR1. The light-emitting diodes ED may be disposed at the steps of the upper surface of the first insulating layer PAS1, and space may be formed between the light-emitting diodes ED and the first insulating layer PAS1.

The first insulating layer PAS1 may include a plurality of contact holes CT exposing a portion of the upper surface of each of the electrodes RME. The plurality of contact holes CT may penetrate through the first insulating layer PAS1, and the connection electrodes CNE to be described later may be in contact with the electrodes RME that are exposed through the contact holes CT. The plurality of contact holes CT may include a first contact hole CT1 overlapping the first electrode RME1 and a second contact hole CT2 overlapping the second electrode RME2. The first contact hole CT1 may connect the first electrode RME1 with the first connection electrode CNE1 to be described later, and the second contact hole CT2 may connect the second electrode RME2 with the second connection element CNE2 to be described later.

The bank BNL may be disposed on the first insulating layer PAS1. The bank BNL may be disposed in a lattice pattern including parts extended in the first direction DR1 and the second direction DR2 when viewed from the top, and may be disposed at the boundaries of the sub-pixels SPXn to distinguish the adjacent sub-pixels SPXn from each other. In addition, the bank BNL may be disposed to surround the emission area EMA and the subsidiary areas SA, and the areas defined and opened by the bank BNL may be the emission area EMA and the subsidiary areas SA, respectively.

The bank BNL may have a desired height (e.g., a predetermined height), and in on or more embodiments, the height of the upper surface of the bank BNL may be higher than the bank patterns BP, and its thickness may be equal to or greater than the bank patterns BP. It should be understood that the present disclosure is not limited thereto. The height of the upper surface of the bank BNL may be equal to or less than that of the bank patterns BP, and its thickness may be smaller than that of the bank patterns BP. The bank BNL can prevent an ink from overflowing into adjacent sub-pixels SPXn during an inkjet printing process of the process of fabricating the display device 10. The bank BNL can separate the different sub-pixels SPXn from one another so that the ink in which different light-emitting diodes ED are dispersed are not mixed. The bank BNL may include, but is not limited to, polyimide or polyacrylate, like the bank patterns BP.

The light-emitting diodes ED may be disposed on the first passivation layer PAS1. The light-emitting diodes ED may include multiple layers disposed on the upper surface of the substrate SUB in the direction parallel to it. The light-emitting diodes ED of the display device 10 may be arranged such that they are extended parallel to the substrate SUB. The multiple semiconductor layers included in the light-emitting diodes ED may be disposed sequentially in the direction parallel to the upper surface of the substrate SUB. It is, however, to be understood that the present disclosure is not limited thereto. In some implementations, when the light-emitting diodes ED have a different structure, a plurality of layers may be disposed in a direction perpendicular to the substrate SUB.

The plurality of light-emitting diodes ED may be disposed between the bank patterns BP or on different electrodes RME. Some of the light-emitting diodes ED may be disposed between the first bank pattern BP1 and the third bank pattern BP3, and some others may be disposed between the third bank pattern BP3 and the second bank pattern BP2. According to one or more embodiments of the present disclosure, the light-emitting diodes ED may include first light-emitting diodes ED1 disposed between the first bank pattern BP1 and the third bank pattern BP3, and second light-emitting diodes ED2 disposed between the third bank pattern BP3 and the second bank pattern BP2. The first light-emitting diodes ED1 may be disposed on the first electrode RME1 and the second electrode RME2, and the second light-emitting diodes ED2 may be disposed on the second electrode RME2 and the third electrode RME3. The first light-emitting diodes ED1 may be disposed adjacent to the left side of the emission area EMA of the respective sub-pixel SPXn, and the second light-emitting diodes ED2 may be disposed adjacent to the right side of the emission area EMA of the respective sub-pixel SPXn. It is to be noted that the light-emitting diodes ED may not be sorted by their positions in the emission area EMA but may be sorted by connection relationships with the connection electrodes CNE, which will be described later. The respective ends of the light-emitting diodes ED may be in contact with different connection electrodes CNE depending on the arrangement structure of the connection electrodes CNE, and may be sorted into different light-emitting diodes ED depending on the types of the connection electrodes CNE which they are in contact with.

The light-emitting diodes ED may be in contact with the connection electrodes CNE so that they may be electrically connected thereto. As a portion of the semiconductor layer of each of the light-emitting diodes ED is exposed at the end surface on one side of the direction in which they are extended, the exposed portion of the semiconductor layer may be in contact with the connection electrodes CNE. The first ends of the first light-emitting diodes ED1 may be in contact with the first connection electrode CNE1 while the second ends thereof may be in contact with a portion of the third connection electrode CNE3. The first ends of the second light-emitting diodes ED1 may be in contact with the second connection electrode CNE2 while the second ends thereof may be in contact with a portion of the fourth connection electrode CNE4. Each of the light-emitting diodes ED may be electrically connected to the electrodes RME and the conductive layers under the via layer VIA through the connection electrodes CNE, and an electric signal may be applied to it so that light of a particular wavelength range can be emitted.

The second insulating layer PAS2 may be disposed on the light-emitting diodes ED and the first insulating layer PAS1. The second insulating layer PAS2 may be extended in the second direction DR2 between the bank patterns BP and may be disposed on the plurality of light-emitting diodes ED. The second insulating layer PAS2 may be disposed to partially cover the outer surface of the light-emitting diodes ED, and may not cover both sides or both ends of the light-emitting diodes ED. The second passivation layer PAS2 may form a linear or island pattern in each sub-pixel SPXn when viewed from the top. The second passivation layer PAS2 can protect the light-emitting diodes ED and fix the light-emitting diodes ED during the process of fabricating the display device 10. In addition, the second insulating layer PAS2 may be disposed to fill the space between light-emitting diodes ED and the first passivation layer PAS1 thereunder. A portion of the second insulating layer PAS2 may be disposed on the bank BNL, but the present disclosure is not limited thereto. A portion of the second insulating layer PAS2 that is disposed in the subsidiary areas SA may not be disposed in the first contact hole CT1, the second contact hole CT2, and the separation region ROP.

The plurality of connection electrodes CNE may be disposed on the light-emitting diodes ED, the electrodes RME and the bank patterns BP. The plurality of connection electrodes CNE may be in contact with the light-emitting diodes ED and the electrodes RME. The connection electrodes CNE may be in direct contact with the semiconductor layer exposed at the both end surfaces of the light-emitting diodes ED, and may be in contact with at least one of the electrodes RME through contact holes CT penetrating through the first insulating layer PAS1 and the second insulating layer PAS2, and in one or more embodiments, through a third insulating layer PAS3. The ends of the light-emitting diodes ED may be electrically connected to the respective electrodes RME through the plurality of connection electrodes CNE.

The first connection electrode CNE1 may have a shape extended in the second direction DR2 and may be disposed on the first electrode RME1 and the first bank pattern BP1. A portion of the first connection electrode CNE1 may overlap the first electrode RME1 and the first bank pattern BP1 in the third direction DR3 and may be extended in the second direction DR2 therefrom. The first connection electrode CNE1 may be disposed from the emission area EMA to the sub-areas SA over the bank BNL. The first connection electrode CNE1 may be in contact with the first electrode RME1 through the first contact hole CT1 exposing the first electrode RME1 in the first sub-area SA1. The first connection electrode CNE1 may be in contact with the light-emitting diodes ED and the first electrode RME1 to transmit an electric signal applied from the first transistor T1 to the light-emitting diodes ED.

The second connection electrode CNE2 may have a shape extended in the second direction DR2 and may be disposed on one side of the second electrode RME2. A portion of the second connection electrode CNE2 may overlap the second electrode RME2 and the second bank pattern BP2 and may be extended in the second direction DR2 therefrom. The second connection electrode CNE2 may be disposed from the emission area EMA to the sub-areas SA over the bank BNL. The second connection electrode CNE2 may be in contact with the second electrode RME2 through the second contact hole CT2 exposing the second electrode RME2 in the first sub-area SA1. The second connection electrode CNE2 may be in contact with the light-emitting diodes ED and the second electrode RME2 to transmit an electric signal applied from the second voltage line VL2 to the light-emitting diodes ED.

The third connection electrode CNE3 may have a shape extended in the second direction DR2 and may be disposed on the other side of the second electrode RME2. A portion of the third connection electrode CNE3 may overlap the second electrode RME2 and the third bank pattern BP3 in the third direction DR3 and may be extended in the second direction DR2 therefrom. The third connection electrode CNE3 may be disposed from the emission area EMA to the sub-areas SA over the bank BNL. The third connection electrode CNE3 may be in contact with the first electrode pattern RMP1 in the second subsidiary area SA2 through a third contact hole CT3 exposing a first electrode pattern RMP1 to be described later. The third connection electrode CNE3 may be in contact with the light-emitting diodes ED to transmit an electric signal applied through the light-emitting diodes ED to the first electrode pattern RMP1.

The fourth connection electrode CNE4 may have a shape extended in the second direction DR2 and may be disposed on the third electrode RME3. A portion of the fourth connection electrode CNE4 may overlap the third electrode RME3 and the second bank pattern BP2 in the third direction DR3 and may be extended in the second direction DR2 therefrom. The fourth connection electrode CNE4 may be disposed from the emission area EMA to the sub-areas SA over the bank BNL. The fourth connection electrode CNE4 may be in contact with the second electrode pattern RMP2 in the second subsidiary area SA2 through a fourth contact hole CT4 exposing a second electrode pattern RMP2 to be described later. The fourth connection electrode CNE4 may be in contact with the light-emitting diodes ED to transmit an electric signal applied through the second electrode pattern RMP2 to the light-emitting diodes ED.

The first connection electrode CNE1 and the second connection electrode CNE2 may be first-type connection electrodes in contact with the first electrode RME1 and the second electrode RME2, respectively, that are directly connected to the third conductive layer. The third connection electrode CNE3 and the fourth connection electrode CNE4 may be second-type connection electrodes in contact with the third electrode RME3 and the fourth electrode RME4, respectively, that are not directly connected to the third conductive layer.

As described above, the plurality of light-emitting diodes ED may be sorted into different light-emitting diodes ED by the connection electrodes CNE with which their both ends are in contact, in accordance with the arrangement structure of the connection electrodes CNE.

The first ends of the first light-emitting diodes ED1 may be in contact with the first-type connection electrode, and the second ends thereof may be in contact with the second-type connection electrodes. The first light-emitting diodes ED1 may be in contact with the first connection electrode CNE1 and the third connection electrode CNE3, and the second light-emitting diodes ED2 may be in contact with the second connection electrode CNE2 and the fourth connection electrode CNE4. The plurality of light-emitting diodes ED may be connected in series to each other through the plurality of connection electrodes CNE. According to one or more embodiments, the display device 10 includes a greater number of light-emitting diodes ED for each of the sub-pixels SPXn to form the serial connection, thereby further increasing the amount of emitted light per unit area.

The display device 10 according to an embodiment may include the first electrode pattern RMP1, the second electrode pattern RMP2, and a bridge pattern BYP in the second subsidiary area SA2.

Referring to FIGS. 8 and 9 in conjunction with FIG. 4, the electrodes RME may be extended from the emission area EMA in the opposite direction to the second direction DR2 to be disposed in the second subsidiary area SA2. The first electrode RME1 may be extended from the emission area EMA, may be bent in the opposite direction to the first direction DR1, and may be bent again in the opposite direction to the second direction DR2 to be extended to the second subsidiary area SA2. The second electrode RME2 may be extended from the emission area EMA and may have a narrow width in the second subsidiary area SA2 that is measured in the first direction DR1. The second electrode RME2 may become larger again in another sub-pixel SPXn disposed on the lower side in the direction opposite to the second direction DR2. The third electrode RME3 may be extended from the emission area EMA, may be bent in the first direction DR1, and may be bent again in the opposite direction to the second direction DR2 to be extended to the second subsidiary area SA2.

In the second subsidiary area SA2, the first electrode pattern RMP1 may be disposed between the first electrode RME1 and the second electrode RME2, and the second electrode pattern RMP2 may be disposed between the second electrode RME2 and the third electrode RME3. Each of the first electrode pattern RMP1 and the second electrode pattern RMP2 may be extended in the first direction DR1 and may be an island-shaped pattern. The first electrode pattern RMP1 may be spaced from the first electrode RME1 and the second electrode RME2 in the first direction DR1, and the second electrode pattern RMP2 may be spaced from the second electrode RME2 and the third electrode RME3 in the first direction DR1. The first electrode pattern RMP1 and the second electrode pattern RMP2 may be disposed directly on the via layer VIA and may be made of the same material as the above-described electrodes RME.

One side of the first electrode pattern RMP1 may overlap the first connection electrode CNE1 and the other side thereof may overlap the third connection electrode CNE3. For example, the first electrode pattern RMP1 may be connected to the third connection electrode CNE3 through a third contact hole CT3 penetrating the first insulating layer PAS1 and the second insulating layer PAS2. One side of the second electrode pattern RMP2 may overlap the second connection electrode CNE2 and the other side thereof may overlap the fourth connection electrode CNE4. For example, the second electrode pattern RMP2 may be connected to the fourth connection electrode CNE4 through the fourth contact hole CT4 penetrating the first insulating layer PAS1 and the second insulating layer PAS2.

The bridge pattern BYP connecting the first electrode pattern RMP1 with the second electrode pattern RMP2 may be disposed in the second subsidiary area SA2. One side of the bridge pattern BYP may be disposed between the first electrode RME1 and the second electrode RME2, and it may be extended in the opposite direction to the second direction DR2, bent in the first direction DR1, and then bent gain in the second direction DR2, such that the other side thereof may be disposed between the second electrode RME2 and the third electrode RME3. One side of the bridge pattern BYP may overlap the first electrode pattern RMP1, and may be connected to the first electrode pattern RMP1 through a fifth contact hole CT5 penetrating the first insulating layer PAS1, the second insulating layer PAS2, and the third insulating layer PAS3. The other side of the bridge pattern BYP may overlap the second electrode pattern RMP2, and may be connected to the second electrode pattern RMP2 through a sixth contact hole CT6 penetrating the first insulating layer PAS1, the second insulating layer PAS2, and the third insulating layer PAS3. The portion of the bridge pattern BYP extended in the first direction DR1 may partially overlap and cross the second electrode RME2 in the third direction DR3. The bridge pattern BYP may be disposed directly on the third insulating layer PAS3, and may be made of the same material as the above-described first connection electrode CNE1.

According to one or more embodiments of the present disclosure, electric current can flow through the light-emitting diodes ED disposed between the first connection electrode CNE1 and the third connection electrode CNE3 and between the second connection electrode CNE2 and the fourth connection electrode CNE4, so that light can be emitted. If no light-emitting diode ED is aligned between the first connection electrode CNE1 and the third connection electrode CNE3 or between the second connection electrode CNE2 and the fourth connection electrode CNE4, the flow of electric current may be interrupted, resulting in a dark spot defect. Hereinafter, a structure and a method for repairing a dark spot defect of a sub-pixel will be described with reference to the other drawings.

Figure 10:
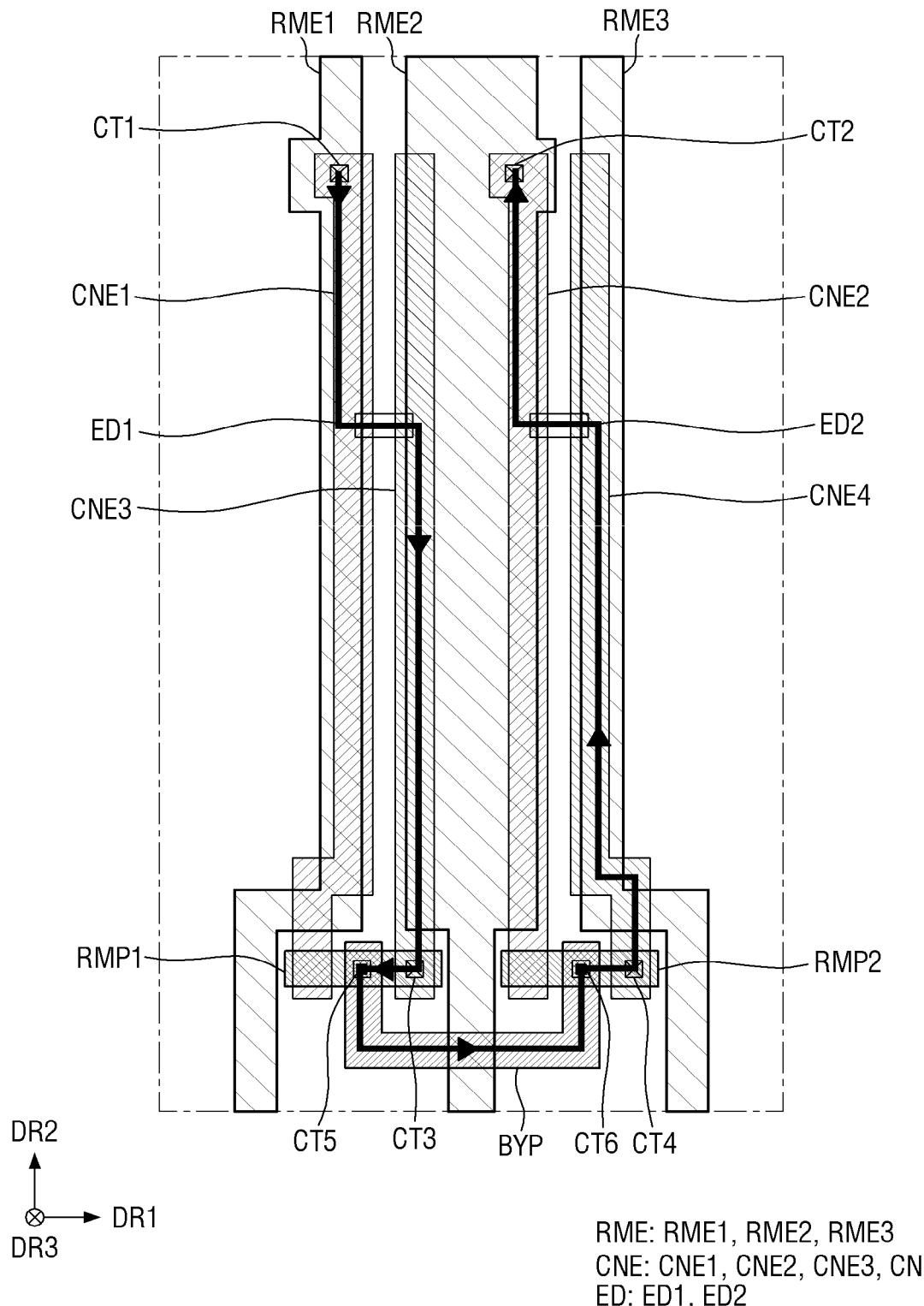
FIG. 10 is a plan view schematically showing an electric current flow in a sub-pixel according to one or more embodiments.
Figure 11:
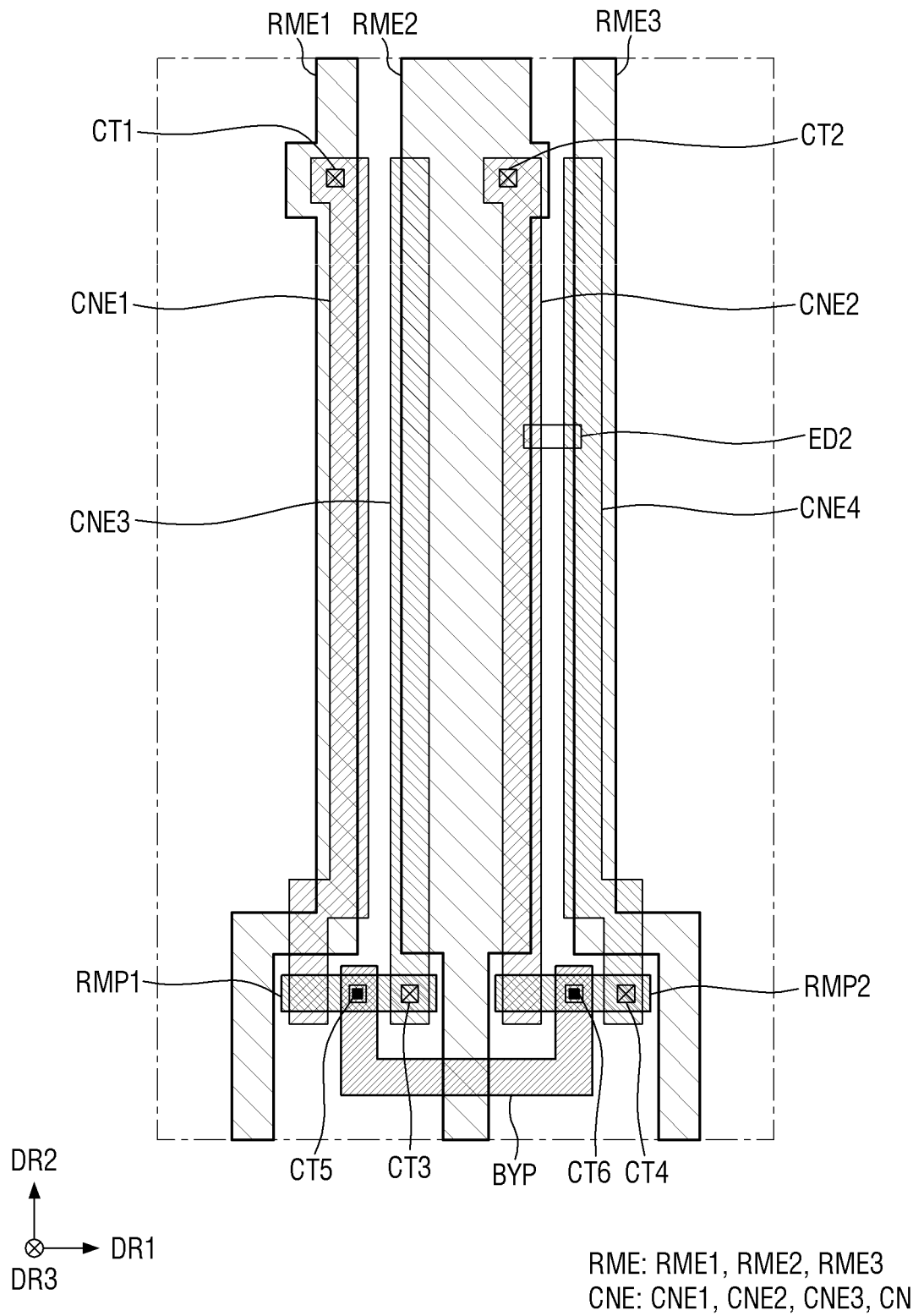
FIG. 11 is a plan view schematically showing an example where a defect occurred in the sub-pixel of FIG. 10.
Figure 12:
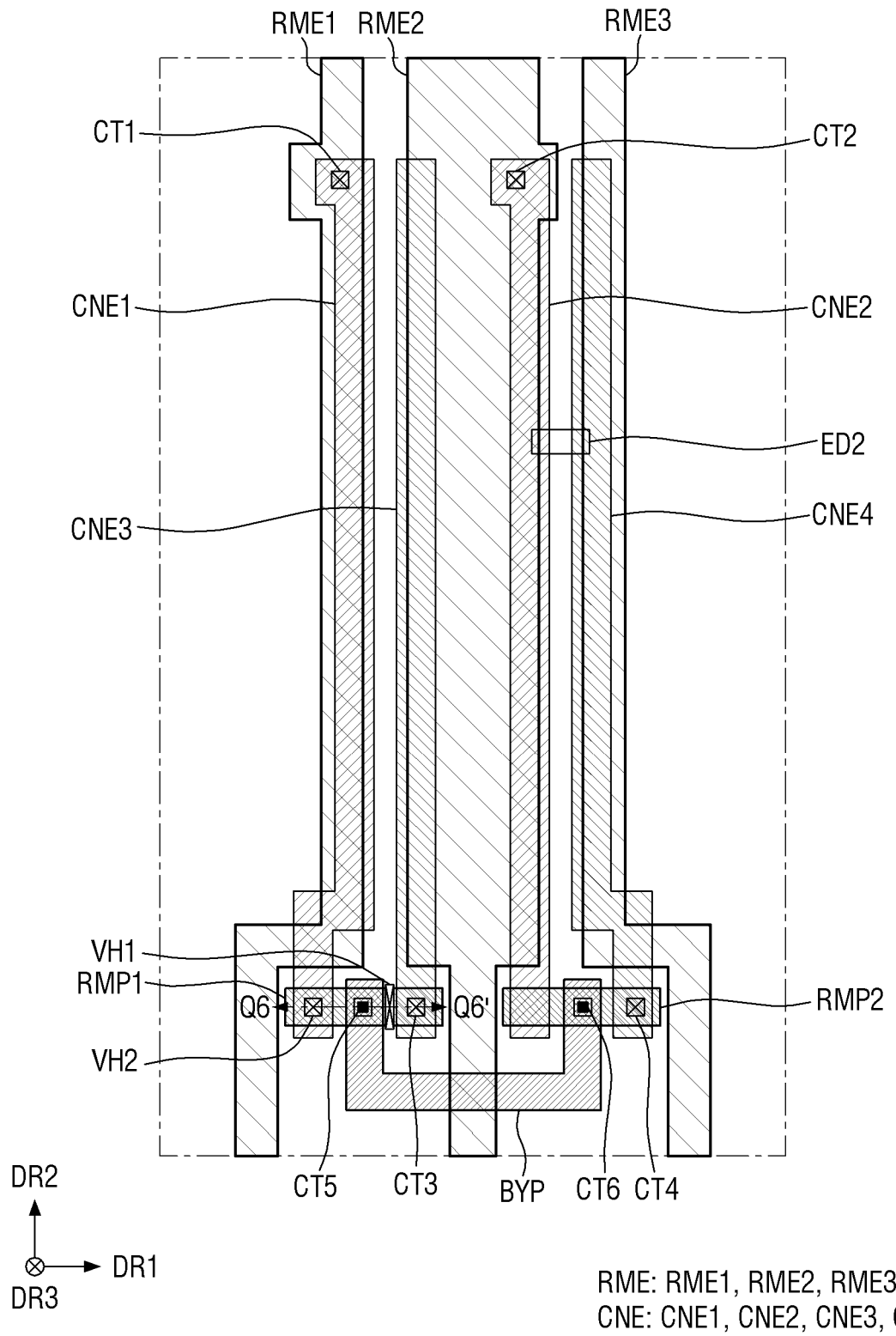
FIG. 12 a plan view schematically showing an example where a sub-pixel has been repaired according to one or more embodiments.
Figure 13:
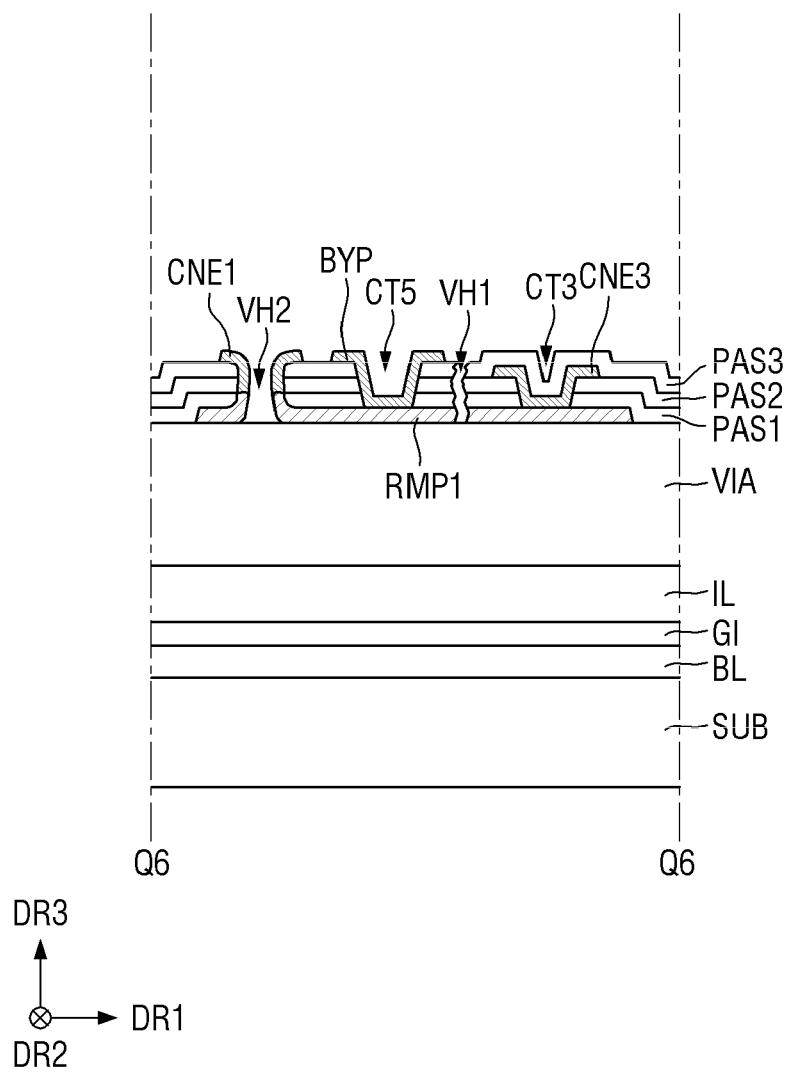
FIG. 13 is a cross-sectional view taken along the line Q6-Q6' of FIG. 12.
Figure 14:
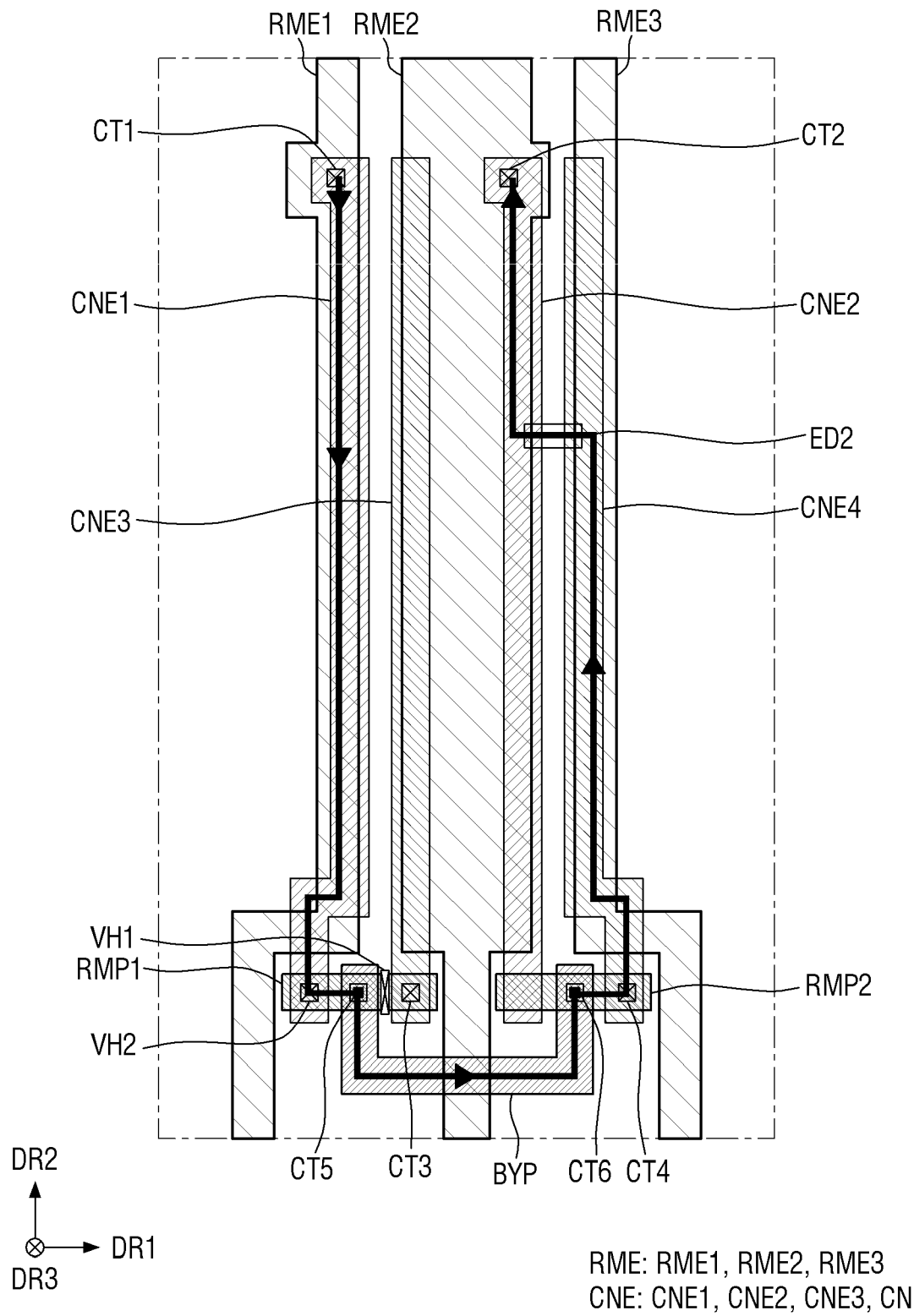
FIG. 14 is a plan view schematically showing flow of electric current in the repaired sub-pixel according to one or more embodiments.
Figure 15:
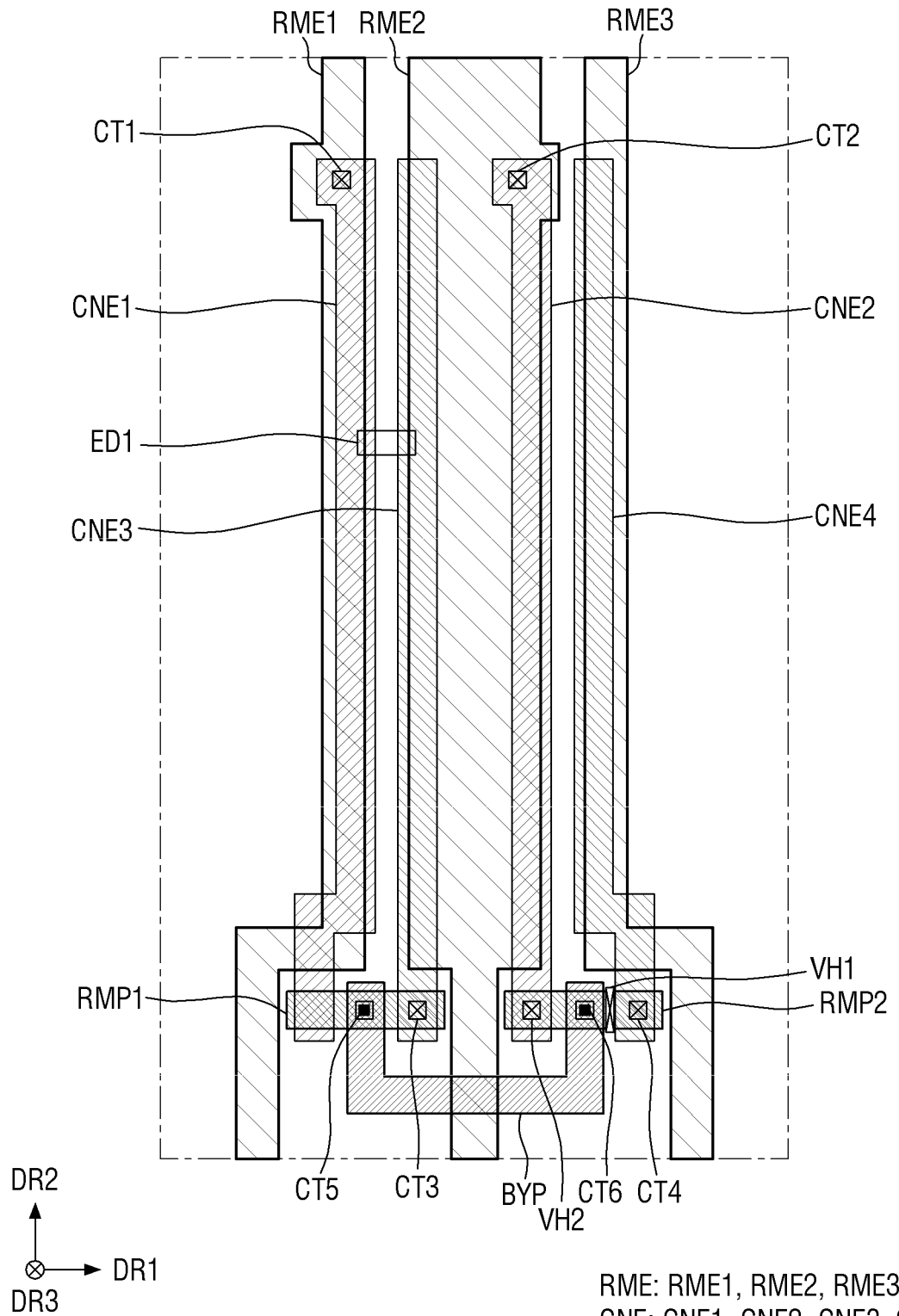
FIG. 15 a plan view schematically showing an example where a sub-pixel has been repaired according to one or more embodiments.

FIG. 10 is a plan view schematically showing flow of electric current in a sub-pixel according to one or more embodiments. FIG. 11 is a plan view schematically showing an example where a defect occurred in the sub-pixel of FIG. 10. FIG. 12 a plan view schematically showing an example where a sub-pixel has been repaired according to one or more embodiments. FIG. 13 is a cross-sectional view taken along the line Q6-Q6' of FIG. 12. FIG. 14 is a plan view schematically showing flow of electric current in the repaired sub-pixel according to one or more embodiments. FIG. 15 a plan view schematically showing an example where a sub-pixel has been repaired according to one or more embodiments.

Referring to FIG. 10, in the sub-pixel SPXn of the display device 10 according to an embodiment, electric current may flow through the electrodes RME, the connection electrodes CNE and the light-emitting diodes ED so that the light-emitting diodes ED can emit light.

For example, the electric current transmitted to the first electrode RME1 through the transistor is transmitted to the first connection electrode CNE1 through the first contact hole CT1. The first light-emitting diode ED1 can emit light as electric current flows in the first connection electrode CNE1 connected to the first end and the third connection electrode CNE3 connected to the second end. One end of the third connection electrode CNE3 is connected to the first electrode pattern RMP1 through the third contact hole CT3 to transmit electric current to the first electrode pattern RMP1. The current transmitted to the first electrode pattern RMP1 is transferred to the bridge pattern BYP through the fifth contact hole CT5 and is transferred to the second electrode pattern RMP2 through the sixth contact hole CT6. One end of the second electrode pattern RMP2 is connected to the fourth connection electrode CNE4 through the fourth contact hole CT4, and current is transferred to the fourth connection electrode CNE4. One end of the second light-emitting diode ED2 is connected to the fourth connection electrode CNE4 and the other end thereof is connected to the second connection electrode CNE2, so that current flows in the fourth connection electrode CNE4, the second light-emitting diode ED2, and the second connection electrode CNE2 to emit light. The second connection electrode CNE2 is connected to the second electrode RME2 through the second contact hole CT2 so that the current of the second connection electrode CNE2 flows to the second electrode RME2, and in turn flows through the second voltage line VL2 connected to the second electrode RME2. Accordingly, all of the first and second light-emitting diodes ED1 and ED2 of the sub-pixel SPXn can emit light normally.

Referring to FIG. 11, no first light-emitting diode ED1 may be disposed between the first connection electrode CNE1 and the third connection electrode CNE3. When there is no first light-emitting diode ED1, there is no path through which electric current can flow between the first connection electrode CNE1 and the third connection electrode CNE3. As a result, the flow of current may be interrupted. Accordingly, a dark spot defect may occur, i.e., the entire sub-pixel SPXn fails to emit light.

According to one or more embodiments of the present disclosure, a repair process for forming a path through which electric current can flow from the first connection electrode CNE1 may be conducted.

Referring to FIGS. 12 and 13, a laser is irradiated to the first electrode pattern RMP1 disposed between the fifth contact hole CT5 and the third contact hole CT3 of the second subsidiary area SA2, such that a portion of the first electrode pattern RMP1 is removed. When the laser is irradiated to the first electrode pattern RMP1, the first insulating layer PAS1, the second insulating layer PAS2 and the third insulating layer PAS3 disposed on the first electrode pattern RMP1 are removed by high heat of the laser. The first electrode pattern RMP1 disposed under the first insulating layer PAS1 may also be removed by the high heat of the laser. Accordingly, a first via hole VH1 is formed where the first insulating layer PAS1, the second insulating layer PAS2, the third insulating layer PAS3, and the first electrode pattern RMP1 have been removed, and the first electrode pattern RMP1 can be cut.

Subsequently, a laser is irradiated to an area where the first connection electrode CNE1 disposed on the left side of the fifth contact hole CT5 and the first electrode pattern RMP1 overlap each other, so that a second via hole VH2 penetrating through the first electrode pattern RMP1, the first insulating layer PAS1, the second insulating layer PAS2, the first connection electrode CNE1 and the third insulating layer PAS3 is formed. In doing so, the first connection electrode CNE1 and the first electrode pattern RMP1 absorb the thermal energy supplied by the laser, such that they may be partially removed and expanded. As a result, they may be in contact with each other on the side surface of the second via hole VH2. Accordingly, the first connection electrode CNE1 and the first electrode pattern RMP1 are brought into contact with each other and electrically connected with each other.

Referring to FIG. 14, after the above-described repair process has been conducted on the sub-pixel SPXn, electric current may flow as follows. For example, the electric current transmitted to the first electrode RME1 through the transistor is transmitted to the first connection electrode CNE1 through the first contact hole CT1. The third connection electrode CNE3 connected to the second end of the first light-emitting diode ED1 is connected to the first electrode pattern RMP1 through the third contact hole CT3, but the first electrode pattern RMP1 is disconnected at the first via hole VH1, and thus the current path is disconnected. Accordingly, the current applied to the first connection electrode CNE1 cannot be transmitted to the third connection electrode CNE3 through the first light-emitting diode ED1 but flows to the first electrode pattern RMP1 through the second via hole VH2. Accordingly, current cannot flow in the first light-emitting diode ED1 (e.g., see FIG. 15) disposed between the first connection electrode CNE1 and the third connection electrode CNE3, and thus no light can be emitted. The current transmitted to the first electrode pattern RMP1 is transferred to the bridge pattern BYP through the fifth contact hole CT5 and is transferred to the second electrode pattern RMP2 through the sixth contact hole CT6. Then, the current flows in the same manner as that of FIG. 10 described above, the second light-emitting diode ED2 disposed between the second connection electrode CNE2 and the fourth connection electrode CNE4 can emit light normally.

According to one or more embodiments of the present disclosure, when no first light-emitting diode ED1 is disposed, the first connection electrode CNE1 and the first electrode pattern RMP1 are connected with each other while the third connection electrode CNE3 and the first electrode pattern RMP1 are disconnected, so that the second light-emitting diodes ED2 can emit light normally. By doing so, it is possible to repair a dark spot defect, i.e., to prevent that all of the light-emitting diodes ED do not emit light.

FIG. 15 shows a repaired sub-pixel according to one or more embodiments, in which no second light-emitting diode ED2 is disposed between the second connection electrode CNE2 and the fourth connection electrode CNE4, resulting in a dark spot defect.

In this instance, like in the example shown in FIG. 12 described above, the second electrode pattern RMP2 between the fourth contact hole CT4 and the fifth contact hole CT6 is cut, and the second connection electrode CNE2 and the second electrode pattern RMP2 are connected with each other by irradiating a laser to them, so that the first light-emitting diode ED1 can emit light normally.

Figure 16:
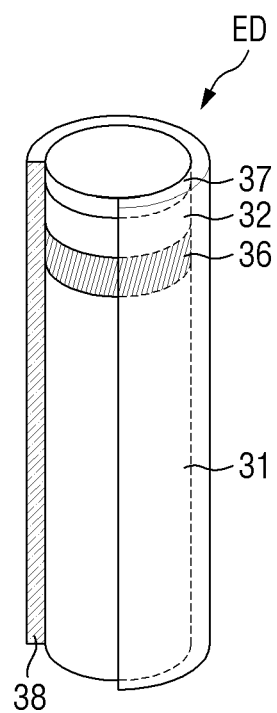
FIG. 16 is a perspective cutaway view showing a light-emitting element according to one or more embodiments of the present disclosure.

FIG. 16 is a perspective cutaway view showing a light-emitting element according to one or more embodiments of the present disclosure.

Referring to FIG. 16, a light-emitting element ED may be a light-emitting diode. For example, the light-emitting element ED may have a size from nanometers to micrometers and may be an inorganic light-emitting diode made of an inorganic material. The light-emitting diode ED may be aligned between two electrodes that are facing (or opposite) each other as polarities are created by forming an electric field in a particular direction between the two electrodes.

The light-emitting diode ED according to one or more embodiments may have a shape extended in one direction. The light-emitting element ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that is extended in a direction with partially inclined outer surfaces.

The light-emitting diode ED may include semiconductor layers doped with impurities of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be one or more of n-type doped AlGaInN, GaN, AlGaN, InGaN, AlN, and InN. The n-type dopant doped into the first semiconductor layer 31 may be Si, Ge, Sn, etc.

The second semiconductor layer 32 may be disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of p-type doped AlGaInN, GaN, AlGaN, InGaN, AlN and InN. The p-type dopant doped into the second semiconductor layer 32 may be Mg, Zn, Ca, Se, Ba, etc.

Although each of the first semiconductor layer 31 and the second semiconductor layer 32 is implemented as a signal layer in the drawings, the present disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN and AlGaInN. In one or more embodiments, when the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be disposed on the second semiconductor layer 32. However, in one or more embodiments, an electrode lay may also be disposed on the first semiconductor layer 31 at one end of the light-emitting diode ED. The electrode layer 37 may be an ohmic connection electrode. It is, however, to be understood that the present disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the present disclosure is not limited thereto. The electrode layer 37 may be eliminated.

The electrode layer 37 can reduce the resistance between the light-emitting element ED and the electrodes or the connection electrodes when the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO, and ITZO.

The insulating film 38 may be disposed to be around (or surround) outer surfaces (e.g., outer peripheral surfaces) of the semiconductor layers 31 and 32 and the electrode layer 36 described above. For example, the insulating film 38 may be disposed to be around (or surround) at least the outer surface (e.g., outer peripheral surface) of the emissive layer 36, with both ends of the light-emitting element ED in the longitudinal direction exposed. In addition, a portion of the upper surface of the insulating film 38 may be rounded in cross section, which is adjacent to at least one of the ends of the light-emitting diode ED.

The insulating film 38 may include materials having insulating properties such as silicon oxide (SiOx), silicon nitride (SiNx), silicon oxynitride (SiOxNy), aluminum nitride (AlNx) and aluminum oxide (AlOx). Although the insulating film 38 is formed as a single layer in the drawings, the present disclosure is not limited thereto. In some embodiments, the insulating film 38 may be made up of a multilayer structure in which multiple layers are stacked on one another.

The insulating film 38 can protect the above-described elements. The insulating film 30 can prevent an electrical short-circuit that may occur in the emissive layer 36 if it comes in direct contact with an electrode through which an electric signal is transmitted to the light-emitting diode ED. In addition, the insulating film 38 can prevent a decrease in luminous efficiency.

In addition, the outer surface (e.g., outer peripheral surface) of the insulating film 38 may be subjected to surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

The connection electrodes CNE and the bridge pattern BYP may be made of the same material at the same layer. In the following description, a sub-pixel has the same plan view as that of FIG. 4. Therefore, the plan view will not be described while cross-sectional views of the sub-pixel, taken along the lines Q1-Q1' and Q4-Q4' of FIG. 4, and line Q6-Q6' of FIG. 12, will be described.

Figure 17:
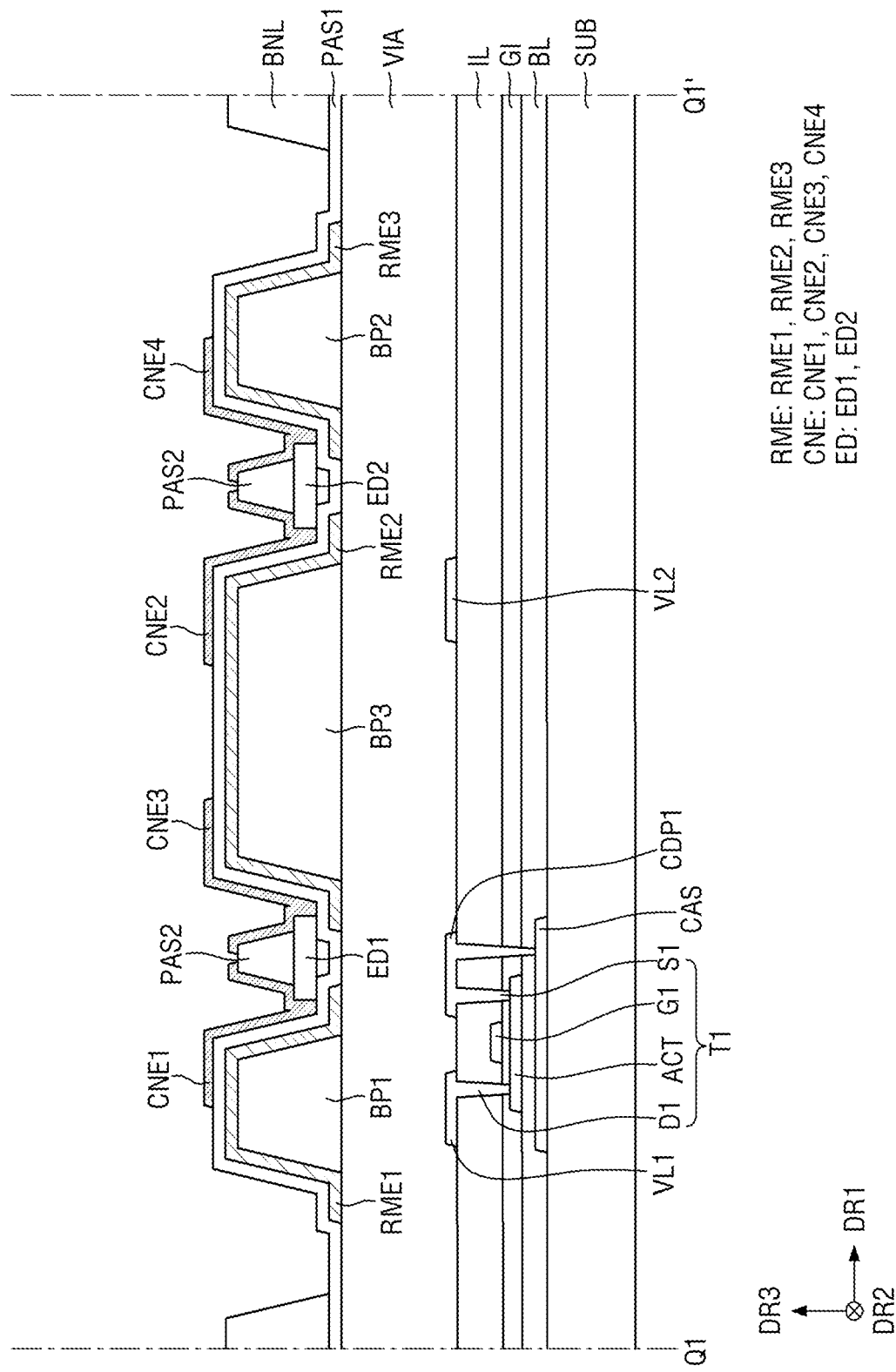
FIG. 17 is a cross-sectional view showing an example, taken along the line Q1-Q1' of FIG. 4.
Figure 18:
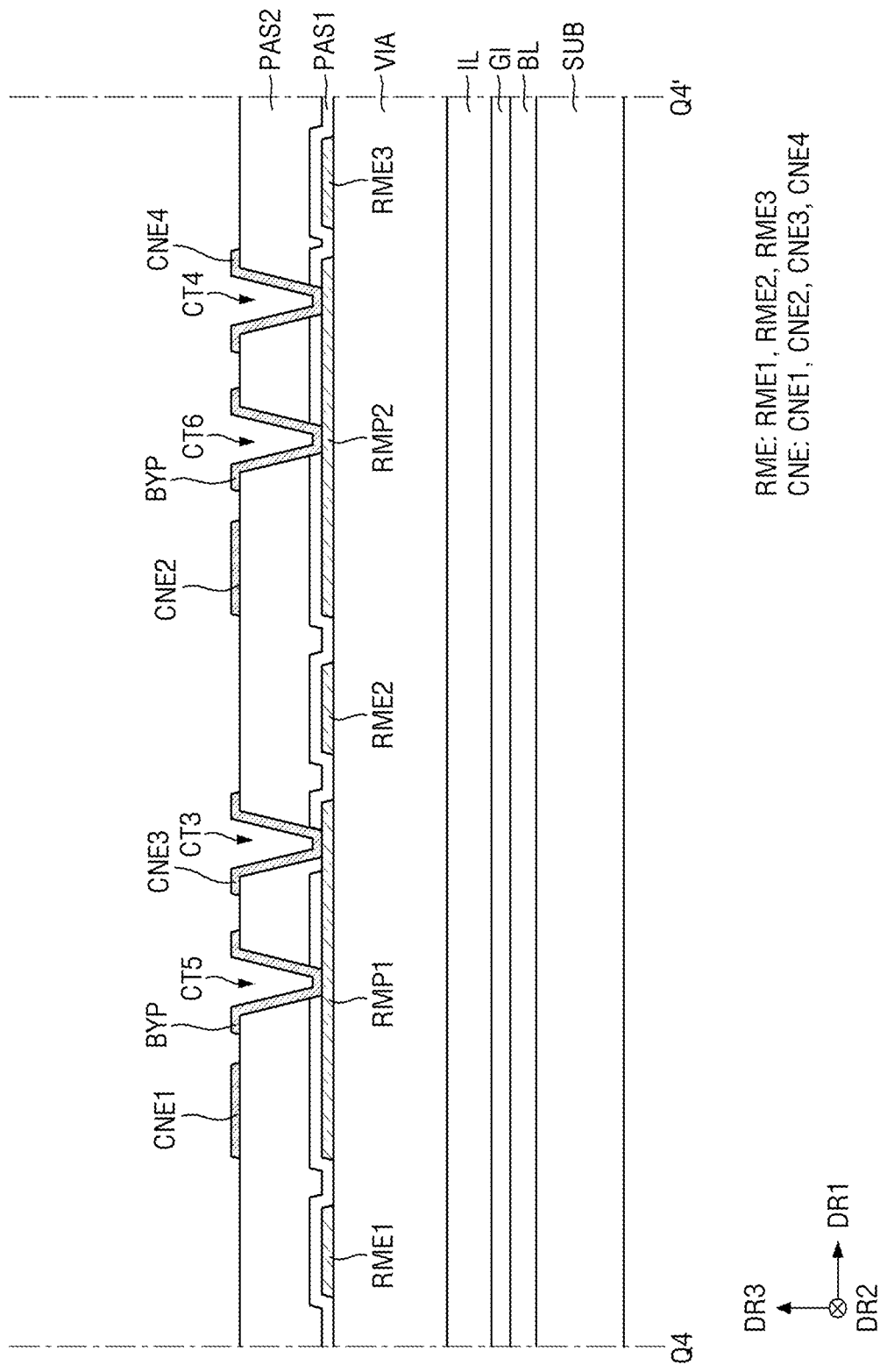
FIG. 18 is a cross-sectional view showing an example, taken along the line Q4-Q4' of FIG. 4.
Figure 19:
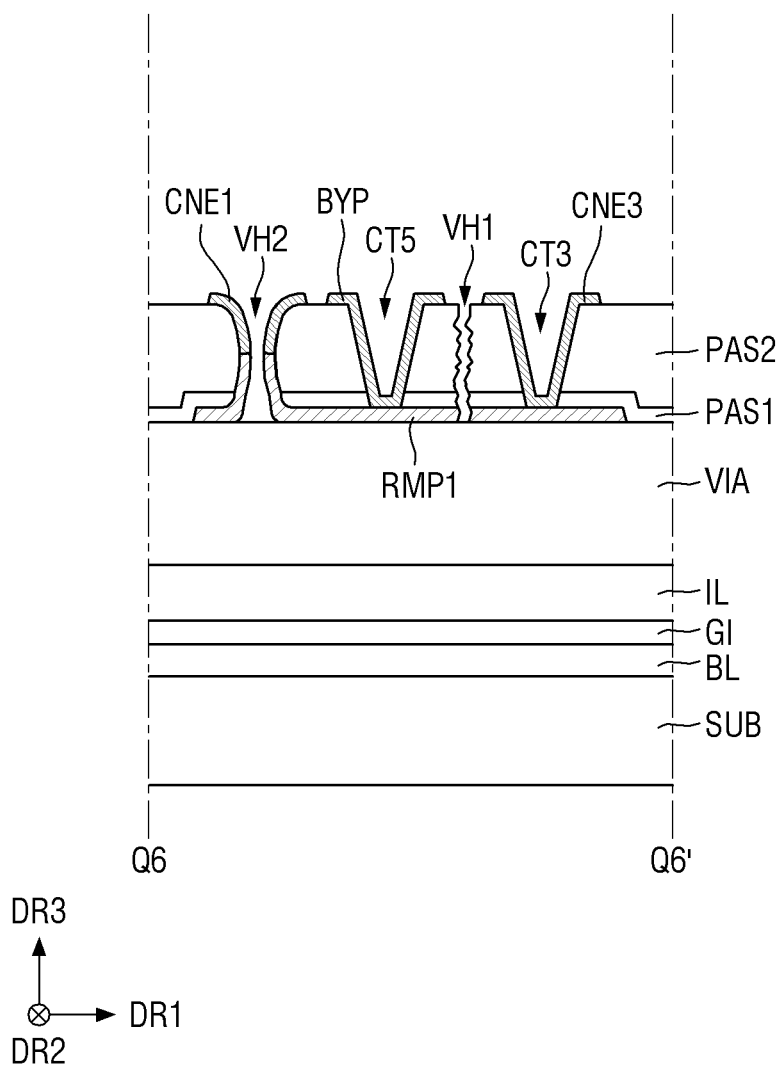
FIG. 19 is a cross-sectional view showing an example, taken along the line Q6-Q6' of FIG. 12.

FIG. 17 is a cross-sectional view showing an example, taken along the line Q1-Q1' of FIG. 4. FIG. 18 is a cross-sectional view showing an example, taken along the line Q4-Q4' of FIG. 4. FIG. 19 is a cross-sectional view showing an example, taken along the line Q6-Q6' of FIG. 12.

Referring to FIGS. 17-19, the sub-pixel SPXn may include connection electrodes CNE, a first electrode pattern RMP1, a second electrode pattern RMP2, and a bridge pattern BYP. This embodiment is different from the embodiments of FIGS. 5-16 described above in that the connection electrodes CNE and the bridge pattern BYP are made of the same material at the same layer. In the following description, the description will focus on the difference and the redundant description will be omitted.

The second insulating layer PAS2 may be disposed on the light-emitting diodes ED. The second insulating layer PAS2 may be made of an organic material, and may be made of a material such as polyimide (PI) and polyacrylate, like the bank BNL.

The connection electrodes CNE may be disposed on the first insulating layer PAS1, the second insulating layer PAS2, and the light-emitting diodes ED. For example, the first connection electrode CNE1 may be in contact with the first end of the first light-emitting diode ED1 and may be disposed on one side of the upper portion of the second insulating layer PAS2. The second connection electrode CNE2 may be in contact with the first end of the second light-emitting diode ED2 and may be disposed on one side of the upper portion of the second insulating layer PAS2. The third connection electrode CNE3 may be in contact with the second end of the first light-emitting diode ED1 and may be disposed on the opposite side of the upper portion of the second insulating layer PAS2. The fourth connection electrode CNE4 may be in contact with the second end of the second light-emitting diode ED2 and may be disposed on the opposite side of the upper portion of the second insulating layer PAS2. The above-described connection electrodes CNE may be disposed directly on the first insulating layer PAS1 and the second insulating layer PAS2 and may be made of the same material at the same layer.

In the second subsidiary area SA2, the second insulating layer PAS2 may be disposed on the first insulating layer PAS1, and the connection electrodes CNE and the bridge pattern BYP may be disposed on the second insulating layer PAS2. The connection electrodes CNE and the bridge pattern BYP may be disposed at the same layer and may be made of the same material.

The first connection electrode CNE1, a portion of the bridge pattern BYP, and the third connection electrode CNE3 may overlap the first electrode pattern RMP1 in the third direction DR3, and the second connection electrode CNE2, a portion of the bridge pattern BYP, and the fourth connection electrode CNE4 may overlap the second electrode pattern RMP2. The third connection electrode CNE3 may be connected to the first electrode pattern RMP1 through the third contact hole CT3 penetrating the first insulating layer PAS1 and the second insulating layer PAS2, and the bridge pattern BYP may be connected to the first electrode pattern RMP1 through the fifth contact hole CT5 penetrating the first insulating layer PAS1 and the second insulating layer PAS2. The fourth connection electrode CNE4 may be connected to the second electrode pattern RMP2 through the fourth contact hole CT4 penetrating the first insulating layer PAS1 and the second insulating layer PAS2, and the bridge pattern BYP may be connected to the second electrode pattern RMP2 through the sixth contact hole CT6 penetrating the first insulating layer PAS1 and the second insulating layer PAS2.

When the sub-pixel is repaired as shown in FIGS. 12 and 13 described above, it may have the structure shown in FIG. 19. For example, a first via hole VH1 may be formed where the first insulating layer PAS1, the second insulating layer PAS2, and the first electrode pattern RMP1 have been removed between the third contact hole CT3 and the fifth contact hole CT5, and the first electrode pattern RMP1 may be cut. A second via hole VH2 penetrating through the first electrode pattern RMP1, the first insulating layer PAS1, the second insulating layer PAS2 and the first connection electrode CNE1 is formed on the left side of the fifth contact hole CT5. In the second via hole VH2, the first connection electrode CNE1 and the first electrode pattern RMP1 may be in contact with each other on the side surface of the second via hole VH2. Accordingly, the first connection electrode CNE1 and the first electrode pattern RMP1 may be brought into contact with each other and electrically connected with each other.

Like the above-described embodiment, when no first light-emitting diode ED1 is disposed in the display device 10, the first connection electrode CNE1 and the first electrode pattern RMP1 are connected with each other while the third connection electrode CNE3 and the first electrode pattern RMP1 are disconnected, so that the second light-emitting diodes ED2 can emit light normally. By doing so, it is possible to repair a dark spot defect, i.e., to prevent that all of the light-emitting diodes ED do not emit light.

In the display devices according to one or more embodiments of the present disclosure, the numbers of the electrodes and the connection electrodes can be further increased, and the numbers of the electrode patterns and the bridge patterns can be increased as well. Hereinafter, a display device according to one or more embodiments of the present disclosure will be described with reference to other drawings.

Figure 20:
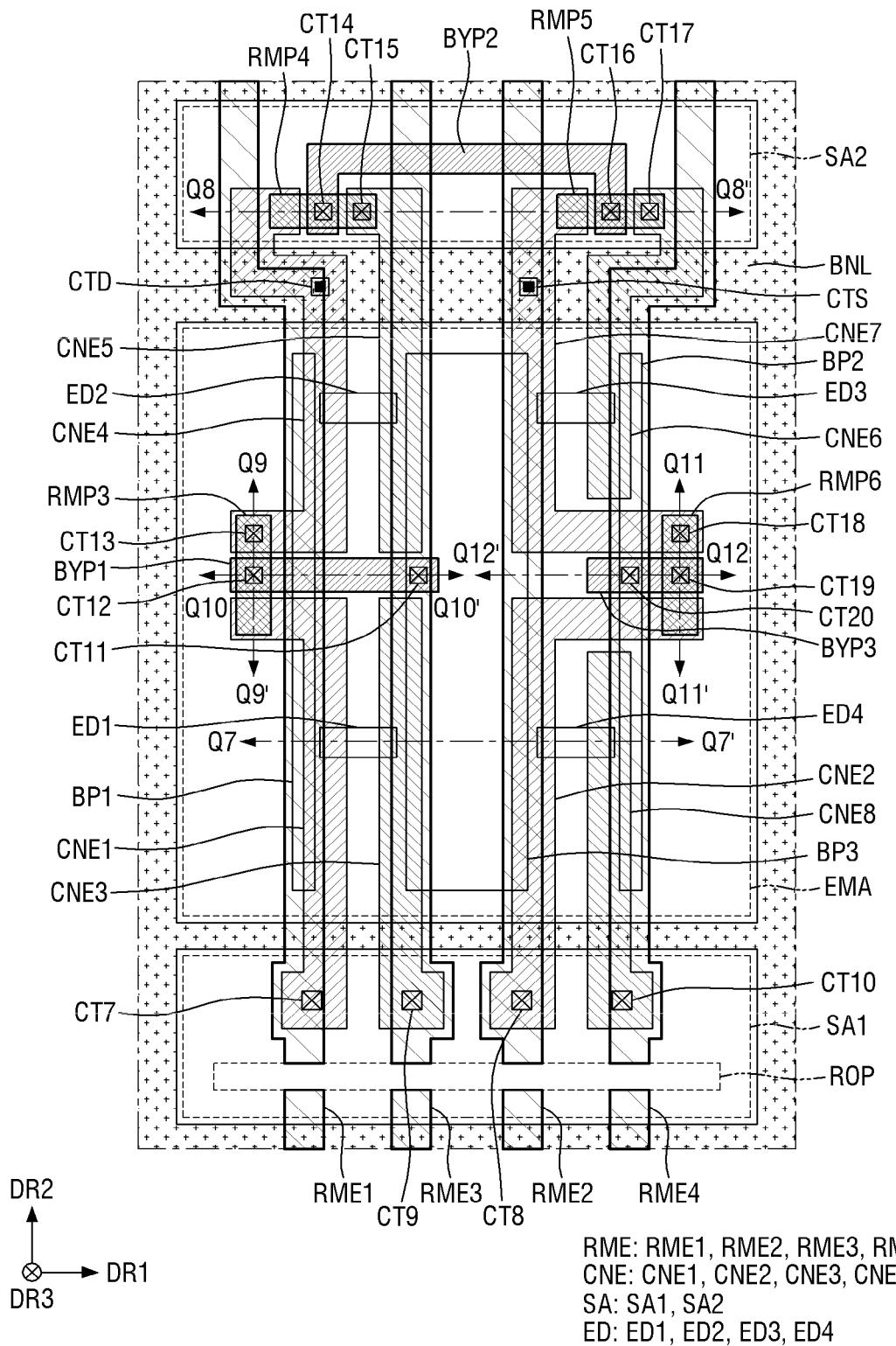
FIG. 20 is a plan view showing a sub-pixel according to one or more embodiments of the present disclosure.
Figure 21:
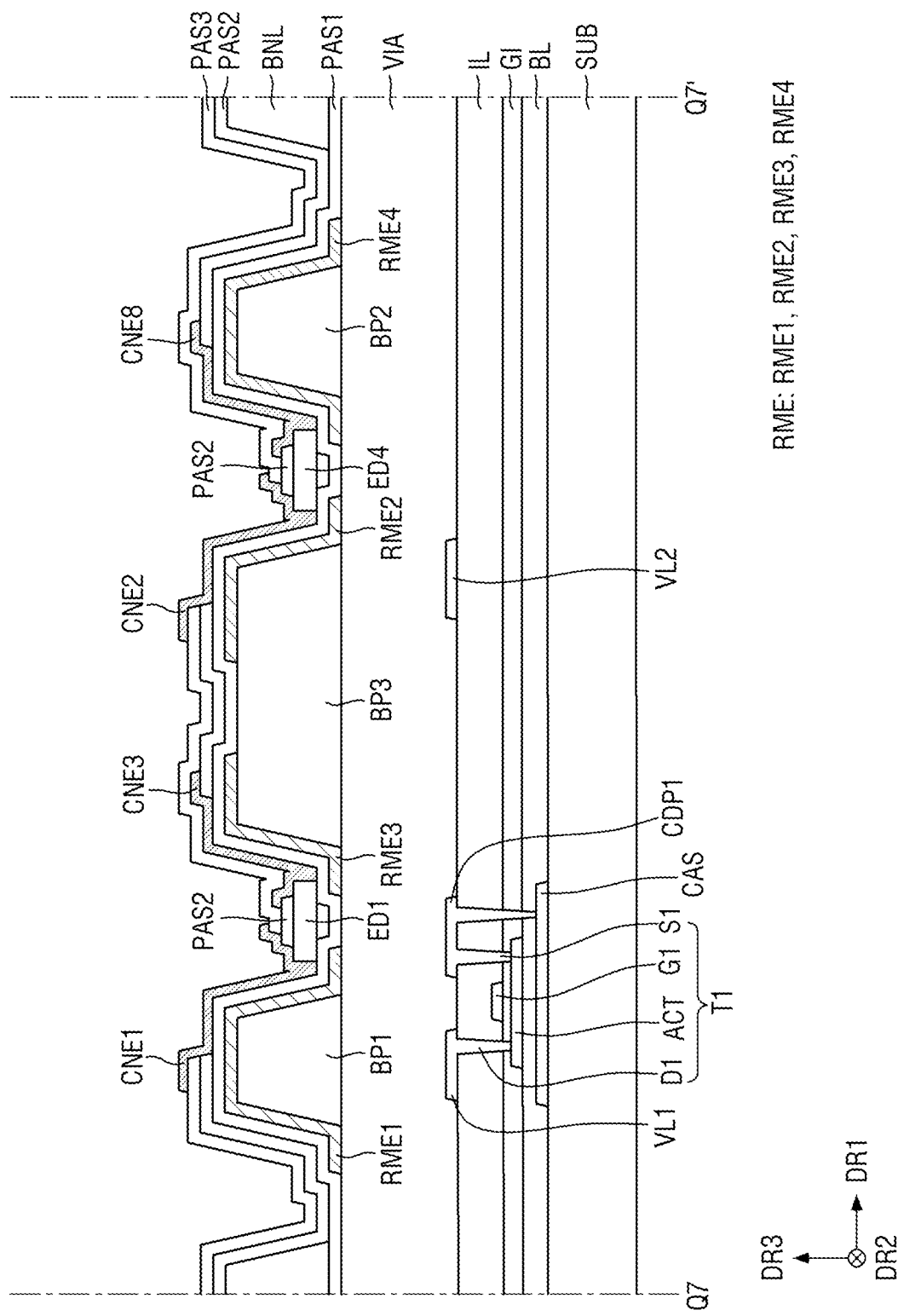
FIG. 21 is a cross-sectional view taken along the line Q7-Q7' of FIG. 20.
Figure 22:
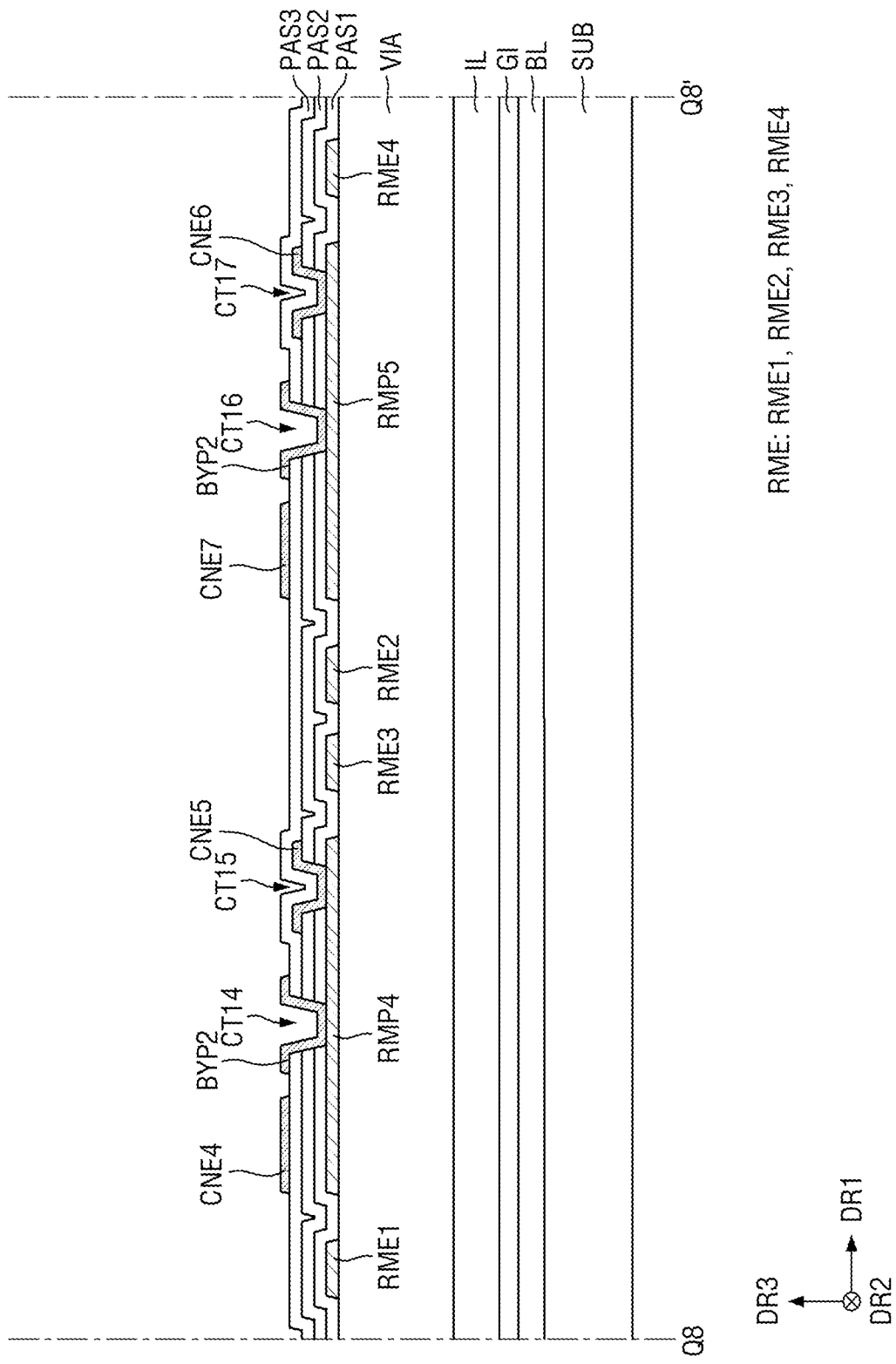
FIG. 22 is a cross-sectional view taken along the line Q8-Q8' of FIG. 20.
Figure 23:
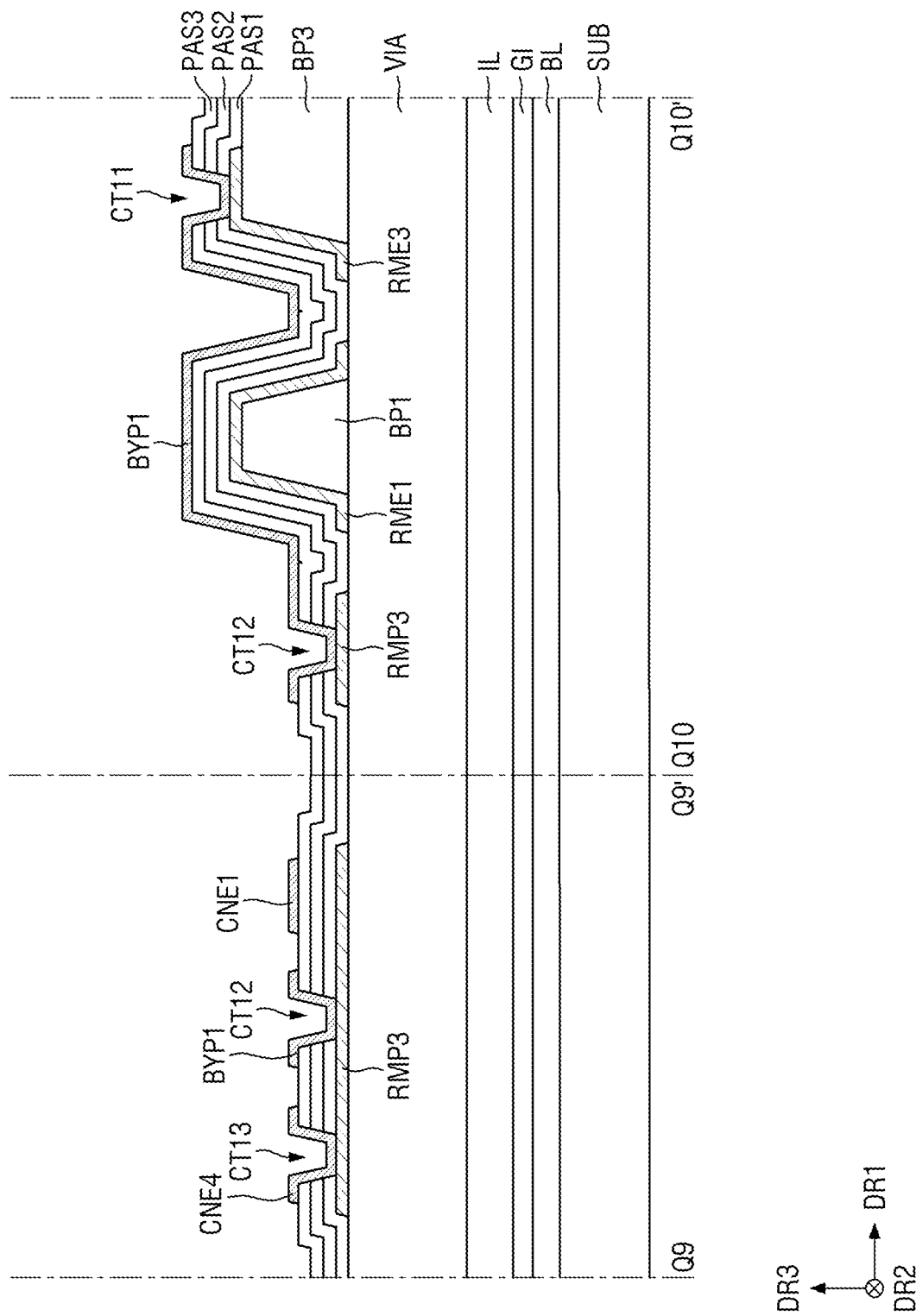
FIG. 23 is a cross-sectional view taken along the lines Q9-Q9' and Q10-Q10' of FIG. 20.
Figure 24:
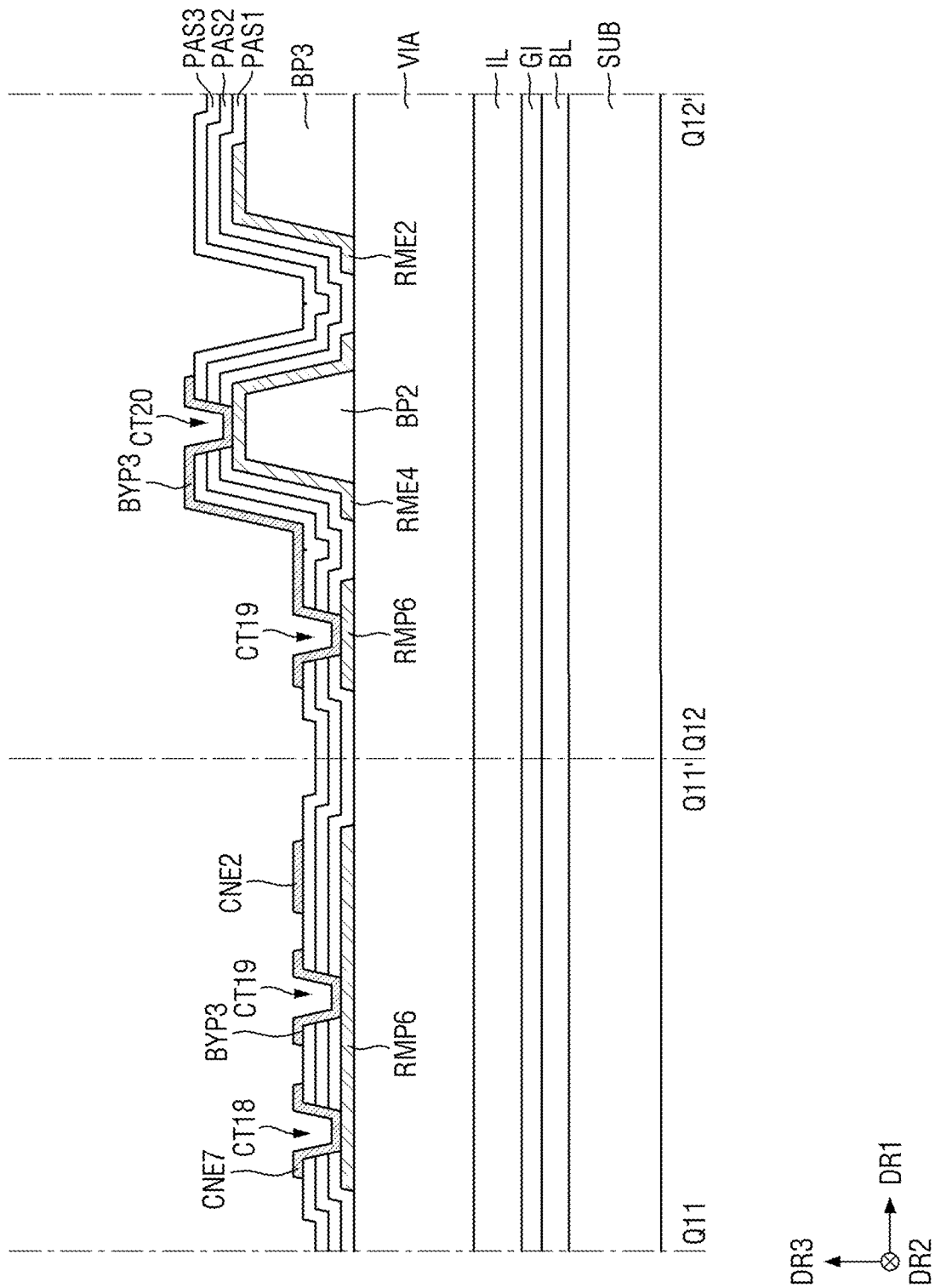
FIG. 24 is a cross-sectional view taken along the lines Q11-Q11' and Q12-Q12' of FIG. 20.

FIG. 20 is a plan view showing a sub-pixel according to one or more embodiments of the present disclosure. FIG. 21 is a cross-sectional view taken along the line Q7-Q7' of FIG. 20. FIG. 22 is a cross-sectional view taken along the line Q8-Q8' of FIG. 20. FIG. 23 is a cross-sectional view taken along the lines Q9-Q9' and Q10-Q10' of FIG. 20. FIG. 24 is a cross-sectional view taken along the lines Q11-Q11' and Q12-Q12' of FIG. 20.

The embodiment of FIGS. 20-24 is different from the embodiment of FIGS. 4-19 in that the former includes four electrodes RME, eight connection electrodes CNE, four electrode patterns RMP, and three bridge patterns BYP. In the following description, the description will focus on the difference and the redundant description will be omitted.

A plurality of electrodes RME may include a first electrode RME1, a second electrode RME2, a third electrode RME3, and a fourth electrode RME4. The first to fourth electrodes RME1, RME2, RME3, and RME4 may be extended in the second direction DR2 and may be spaced from one another in the first direction DR1. The first electrode RME1, the third electrode RME3, the second electrode RME2, and the fourth electrode RME4 may be arranged in this order along the first direction DR1.

The first electrode RME1 may be disposed on the first bank pattern BP1 and on the left side in the emission area EMA. The first electrode RME1 may be connected to the third conductive layer through a first electrode contact hole CTD exposing the third conductive layer. The second electrode RME2 may be disposed on one side of the third bank pattern BP3 and on the right side in the emission area EMA. The second electrode RME2 may be connected to the third conductive layer through a second electrode contact hole CTS exposing the third conductive layer. The third electrode RME3 may be disposed on the opposite side of the third bank pattern BP3 and may be disposed between the first electrode RME1 and the second electrode RME2. The third electrode RME3 may face (or be opposite) the first electrode RME1. The fourth electrode RME4 may be disposed on the second bank pattern BP2, may face (or be opposite) the second electrode RME2, and may be disposed more to the right side than the second electrode RME2.

In addition, according to one or more embodiments, the display device includes a larger number of connection electrodes CNE, so that the number of serial connections of the plurality of light-emitting diodes ED can be increased. A plurality of connection electrodes CNE may include a first connection electrode CNE1, a second connection electrode CNE2, a third connection electrode CNE3, a fourth connection electrode CNE4, a fifth connection electrode CNE5, a sixth connection electrode CNE6, a seventh connection electrode CNE7, and an eighth connection electrode CNE8.

The first connection electrode CNE1 may have a shape extended in the second direction DR2 and may be disposed on the first electrode RME1. The first connection electrode CNE1 may be extended from the emission area EMA to the first subsidiary area SA1, and the first connection electrode CNE1 may be in contact with the first electrode RME1 through a seventh contact hole CT7 in the first subsidiary area SA1 exposing the upper surface of the first electrode RME1. The first connection electrode CNE1 may be in contact with the first ends of the first light-emitting diodes ED1. The second connection electrode CNE2 may have a shape extended in the second direction DR2 and may be disposed on the second electrode RME2. The second connection electrode CNE2 may be extended from the emission area EMA to the first subsidiary area SA1, and may be in contact with the second electrode RME2 through an eighth contact hole CT8 in the first subsidiary area SA1 exposing the upper surface of the second electrode RME2. The second connection electrode CNE2 may be in contact with the first ends of the fourth light-emitting diodes ED4.

The third connection electrode CNE3 may have a shape extended in the second direction DR2 and may be disposed on the third electrode RME3. The third connection electrode CNE3 may be extended from the emission area EMA to the first subsidiary area SA1, and may be in contact with the third electrode RME3 through a ninth contact hole CT9 in the first subsidiary area SA1 exposing the upper surface of the third electrode RME3. The third connection electrode CNE3 may be in contact with the second ends of the first light-emitting diodes ED1. The first ends of the first light-emitting diodes ED1 may be electrically connected to the first electrode RME1 through the first connection electrode CNE1, and the second ends thereof may be electrically connected to the third electrode RME3 through the third connection electrode CNE3.

The fourth connection electrode CNE4 may have a shape extended generally in the second direction DR2 and may be disposed on the first electrode RME1. The fourth connection electrode CNE4 may be spaced from the first connection electrode CNE1 in the second direction DR2. The fourth connection electrode CNE4 may be in contact with the first ends of the second light-emitting diodes ED2. The fifth connection electrode CNE5 may have a shape extended in the second direction DR2 and may be disposed on the third electrode RME3. The fifth connection electrode CNE5 may be spaced from the third connection electrode CNE3 in the second direction DR2. The fifth connection electrode CNE5 may be in contact with the second ends of the second light-emitting diodes ED2. The first ends of the second light-emitting diodes ED2 may be connected to the fourth connection electrode CNE4, and the second ends thereof may be connected to the fifth connection electrode CNE5.

The sixth connection electrode CNE6 may have a shape extended generally in the second direction DR2 and may be disposed on the fourth electrode RME4. The sixth connection electrode CNE6 may be spaced from the fifth connection electrode CNE5 in the first direction DR1. The seventh connection electrode CNE7 may have a shape extended generally in the second direction DR2 and may be disposed on the second electrode RME2. The seventh connection electrode CNE7 may be spaced from the second connection electrode CNE2 in the second direction DR2. The seventh connection electrode CNE7 may be in contact with the first ends of the third light-emitting diodes ED3, and the sixth connection electrode CNE6 may be in contact with the second ends of the third light-emitting diodes ED3. In one or more embodiments, the first ends of the third light-emitting diodes ED3 may be connected to the sixth connection electrode CNE6, and the second ends thereof may be connected to the seventh connection electrode CNE7.

The eighth connection electrode CNE8 may have a shape extended in the second direction DR2 and may be disposed on the fourth electrode RME4. The eighth connection electrode CNE8 may be spaced from the sixth connection electrode CNE6 in the opposite direction to the second direction DR2. The eighth connection electrode CNE8 may be extended from the emission area EMA to the first subsidiary area SA1, and may be in contact with the fourth electrode RME4 through a tenth contact hole CT10 in the first subsidiary area SA1 exposing the upper surface of the fourth electrode RME4. The eighth connection electrode CNE8 may be in contact with the second ends of the fourth light-emitting diodes ED4. The first ends of the fourth light-emitting diodes ED4 may be connected to the second connection electrode CNE2, and the second ends thereof may be connected to the eighth connection electrode CNE8.

The plurality of light-emitting diodes ED may be sorted into different light-emitting diodes ED by the connection electrodes CNE with which their respective ends are in contact. For example, the light-emitting diodes ED may include first light-emitting diodes ED1 and second light-emitting diodes ED2 having ends disposed on the first electrode RME1 and the third electrode RME3, respectively, and third light-emitting diodes ED3 and fourth light-emitting diodes ED4 having ends disposed on the second electrode RME2 and the fourth electrode RME4, respectively.

The first ends of the first light-emitting diodes ED1 may be in contact with the first connection electrode CNE1 while the second ends thereof may be in contact with the third connection electrode CNE3. The first ends of the second light-emitting diodes ED2 may be in contact with the fourth connection electrode CNE4 while the second ends thereof may be in contact with the fifth connection electrode CNE5. The first ends of the third light-emitting diodes ED3 may be in contact with the seventh connection electrode CNE7 while the second ends thereof may be in contact with the sixth connection electrode CNE6. The first ends of the fourth light-emitting diodes ED4 may be in contact with the second connection electrode CNE2 while the second ends thereof may be in contact with the eighth connection electrode CNE8. The plurality of light-emitting diodes ED may be connected in series to each other through the plurality of connection electrodes CNE.

The display device 10 according to one or more embodiments may include a third electrode pattern RMP3, a sixth electrode pattern RMP6, a first bridge pattern BYP1 and a third bridge pattern BYP3 in the emission area EMA, and may include a fourth electrode pattern RMP4, a fifth electrode pattern RMPS, and a second bridge pattern BYP2 in the second subsidiary area SA2.

Referring to FIGS. 22-24 in conjunction with FIG. 20, one end of each of the first connection electrode CNE1 and the fourth connection electrode CNE4 disposed in the emission area EMA may be bent and extended in the opposite direction to the first direction DR1. The first connection electrode CNE1 may be extended in the second direction DR2 and may be bent in the opposite direction to the first direction DR1. The fourth connection electrode CNE4 may be extended in the opposite direction to the second direction DR2 and may be bent and extended in the opposite direction to the first direction DR1.

The third electrode pattern RMP3 may be disposed between the first connection electrode CNE1 and the fourth connection electrode CNE4. The third electrode pattern RMP3 may have an island-shaped pattern extended in the second direction DR2, and one side thereof may overlap the first connection electrode CNE1 and the other side thereof may overlap the fourth connection electrode CNE4 in the third direction DR3. In one or more embodiments, the third electrode pattern RMP3 may be connected to the fourth connection electrode CNE4 through a thirteenth contact hole CT13 penetrating the first insulating layer PAS1, the second insulating layer PAS2, and the third insulating layer PAS3. The third electrode pattern RMP3 may be disposed directly on the via layer VIA and may be made of the same material as the above-described electrodes RME.

A first bridge pattern BYP1 may be disposed between the first connection electrode CNE1 and the fourth connection electrode CNE4. The first bridge pattern BYP1 may be an island-shaped pattern extended in the first direction DR1. One side of the first bridge pattern BYP1 may be disposed between the first connection electrode CNE1 and the fourth connection electrode CNE4 and may overlap the third electrode pattern RMP3 in the third direction DR3. The opposite side of the first bridge pattern BYP1 may be disposed between the third connection electrode CNE3 and the fifth connection electrode CNE5 and may overlap the third electrode RME3 in the third direction DR3. One side of the first bridge pattern BYP1 may overlap the third electrode pattern RMP3, and may be connected to the third electrode pattern RMP3 through a twelfth contact hole CT12 penetrating the first insulating layer PAS1, the second insulating layer PAS2, and the third insulating layer PAS3. The opposite side of the first bridge pattern BYP1 may overlap the third electrode RME3 in the third direction DR3, and may be connected to the third electrode RME3 through an eleventh contact hole CT11 penetrating the first insulating layer PAS1, the second insulating layer PAS2, and the third insulating layer PAS3. The portion of the first bridge pattern BYP1 extended in the first direction DR1 may overlap and cross the first electrode RME1. The first bridge pattern BYP1 may be disposed directly on the third insulating layer PAS3, may be disposed at the same layer as the above-described first connection electrode CNE1, and may be made of the same material.

The electrodes RME may be extended from the emission area EMA in the second direction DR2 to be disposed in the second subsidiary area SA2. The first electrode RME1 may be extended from the emission area EMA in the second direction DR2, may be bent in the opposite direction to the first direction DR1, and may be bent again in the second direction DR2 to be extended to the second subsidiary area SA2. Each of the second electrode RME2 and the third electrode RME3 may be extended from the emission area EMA in the second direction DR2 to be extended to the second subsidiary area SA2. The fourth electrode RME4 may be extended from the emission area EMA in the second direction DR2, may be bent in the first direction DR1, and may be bent again in the second direction DR2 to be extended to the second subsidiary area SA2.

In the second subsidiary area SA2, the fourth electrode pattern RMP4 may be disposed between the first electrode RME1 and the third electrode RME3, and the fifth electrode pattern RMP5 may be disposed between the second electrode RME2 and the fourth electrode RME4. Each of the fourth electrode pattern RMP4 and the fifth electrode pattern RMP5 may be extended in the first direction DR1 and may be an island-shaped pattern. The fourth electrode pattern RMP4 may be spaced from the first electrode RME1 and the third electrode RME3, and the fifth electrode pattern RMP5 may be spaced from the second electrode RME2 and the fourth electrode RME4. The fourth electrode pattern RMP4 and the fifth electrode pattern RMP5 may be disposed directly on the via layer VIA and may be made of the same material as the above-described electrodes RME.

One side of the fourth electrode pattern RMP4 may overlap the fourth connection electrode CNE4 and the other side thereof may overlap the fifth connection electrode CNE5 in the third direction DR3. For example, the fourth electrode pattern RMP4 may be connected to the fifth connection electrode CNE5 through a fifteenth contact hole CT15 penetrating the first insulating layer PAS1 and the second insulating layer PAS2. One side of the fifth electrode pattern RMP5 may overlap the seventh connection electrode CNE7 and the other side thereof may overlap the sixth connection electrode CNE6 in the third direction DR3. For example, the fifth electrode pattern RMP5 may be connected to the sixth connection electrode CNE6 through a seventeenth contact hole CT17 penetrating the first insulating layer PAS1 and the second insulating layer PAS2.

A second bridge pattern BYP2 connecting the fourth electrode pattern RMP4 with the fifth electrode pattern RMP5 may be disposed in the second subsidiary area SA2. One side of the second bridge pattern BYP2 may be disposed between the first electrode RME1 and the third electrode RME3, and it may be extended in the second direction DR2, bent in the first direction DR1, and then bent gain in the opposite direction to the second direction DR2, such that the other side thereof may be disposed between the second electrode RME2 and the fourth electrode RME4. One side of the second bridge pattern BYP2 may overlap the fourth electrode pattern RMP4 in the third direction DR3, and may be connected to the fourth electrode pattern RMP4 through a fourteenth contact hole CT14 penetrating the first insulating layer PAS1, the second insulating layer PAS2, and the third insulating layer PAS3. The other side of the second bridge pattern BYP2 may overlap the fifth electrode pattern RMP5, and may be connected to the fifth electrode pattern RMP5 through a sixteenth contact hole CT16 penetrating the first insulating layer PAS1, the second insulating layer PAS2, and the third insulating layer PAS3. The portion of the second bridge pattern BYP2 extended in the first direction DR1 may overlap and cross the third electrode RME3 and the second electrode RME2. The second bridge pattern BYP2 may be disposed directly on the third insulating layer PAS3 and may be made of the same material as the above-described first bridge pattern BYP1 and the first connection electrode CNE1 at the same layer.

One end of each of the second connection electrode CNE2 and the seventh connection electrode CNE7 that is disposed in the emission area EMA may be bent and extended in the first direction DR1. The second connection electrode CNE2 may be extended in the second direction DR2 and may be bent and extended in the first direction DR1. The seventh connection electrode CNE7 may be extended in the opposite direction to the second direction DR2 and may be bent and extended in the first direction DR1.

The sixth electrode pattern RMP6 may be disposed between the second connection electrode CNE2 and the seventh connection electrode CNE7. The sixth electrode pattern RMP6 may have an island-shaped pattern extended in the second direction DR2, and one side thereof may overlap the second connection electrode CNE2 and the other side thereof may overlap the seventh connection electrode CNE7 in the third direction DR3. For example, the sixth electrode pattern RMP6 may be connected to the seventh connection electrode CNE7 through an eighteenth contact hole CT18 penetrating the first insulating layer PAS1, the second insulating layer PAS2, and the third insulating layer PAS3. The sixth electrode pattern RMP6 may be disposed directly on the via layer VIA and may be made of the same material as the above-described electrodes RME.

The third bridge pattern BYP3 may be disposed between the second connection electrode CNE2 and the seventh connection electrode CNE7. The third bridge pattern BYP3 may be an island-shaped pattern extended in the first direction DR1. One side of the third bridge pattern BYP3 may be disposed between the second connection electrode CNE2 and the seventh connection electrode CNE7 and may overlap the sixth electrode pattern RMP6 in the third direction DR3. The other side of the third bridge pattern BYP3 may overlap the fourth electrode RME4. One side of the third bridge pattern BYP3 may overlap the sixth electrode pattern RMP6, and may be connected to the sixth electrode pattern RMP6 through a nineteenth contact hole CT19 penetrating the first insulating layer PAS1, the second insulating layer PAS2, and the third insulating layer PAS3. The opposite side of the third bridge pattern BYP3 may overlap the fourth electrode RME4, and may be connected to the fourth electrode RME4 through a twentieth contact hole CT20 penetrating the first insulating layer PAS1, the second insulating layer PAS2, and the third insulating layer PAS3. The third bridge pattern BYP3 may be disposed directly on the third insulating layer PAS3 and may be made of the same material as the above-described first bridge pattern BYP1 and the first connection electrode CNE1 at the same layer.

According to one or more embodiments of the present disclosure, electric current can flow through the light-emitting diodes ED disposed between the first connection electrode CNE1 and the third connection electrode CNE3, between the fourth connection electrode CNE4 and the fifth connection electrode CNE5, between the sixth connection electrode CNE6 and the seventh connection electrode CNE7, and between the second connection electrode CNE2 and the eighth connection electrode CNE8, so that light can be emitted. If no light-emitting diode ED is aligned between the first connection electrode CNE1 and the third connection electrode CNE3, between the fourth connection electrode CNE4 and the fifth connection electrode CNE5, between the sixth connection electrode CNE6 and the seventh connection electrode CNE7, or between the second connection electrode CNE2 and the eighth connection electrode CNE8, the flow of electric current may be disconnected, and thus a dark spot defect may occur. Hereinafter, a structure and a method for repairing a dark spot defect of a sub-pixel will be described with reference to the other drawings.

Figure 25:
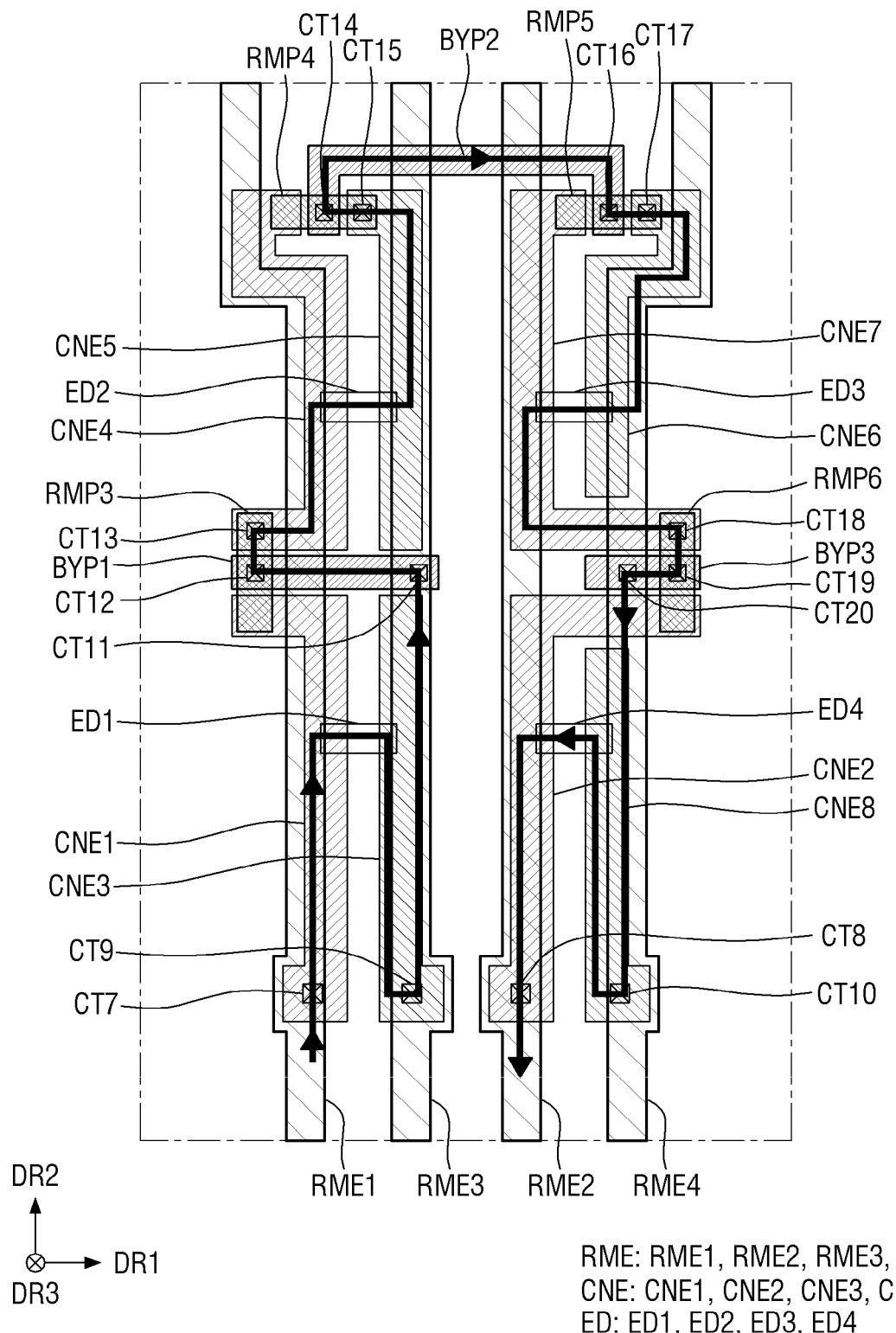
FIG. 25 is a plan view schematically showing an electric current flow in a sub-pixel according to one or more embodiments.
Figure 26:
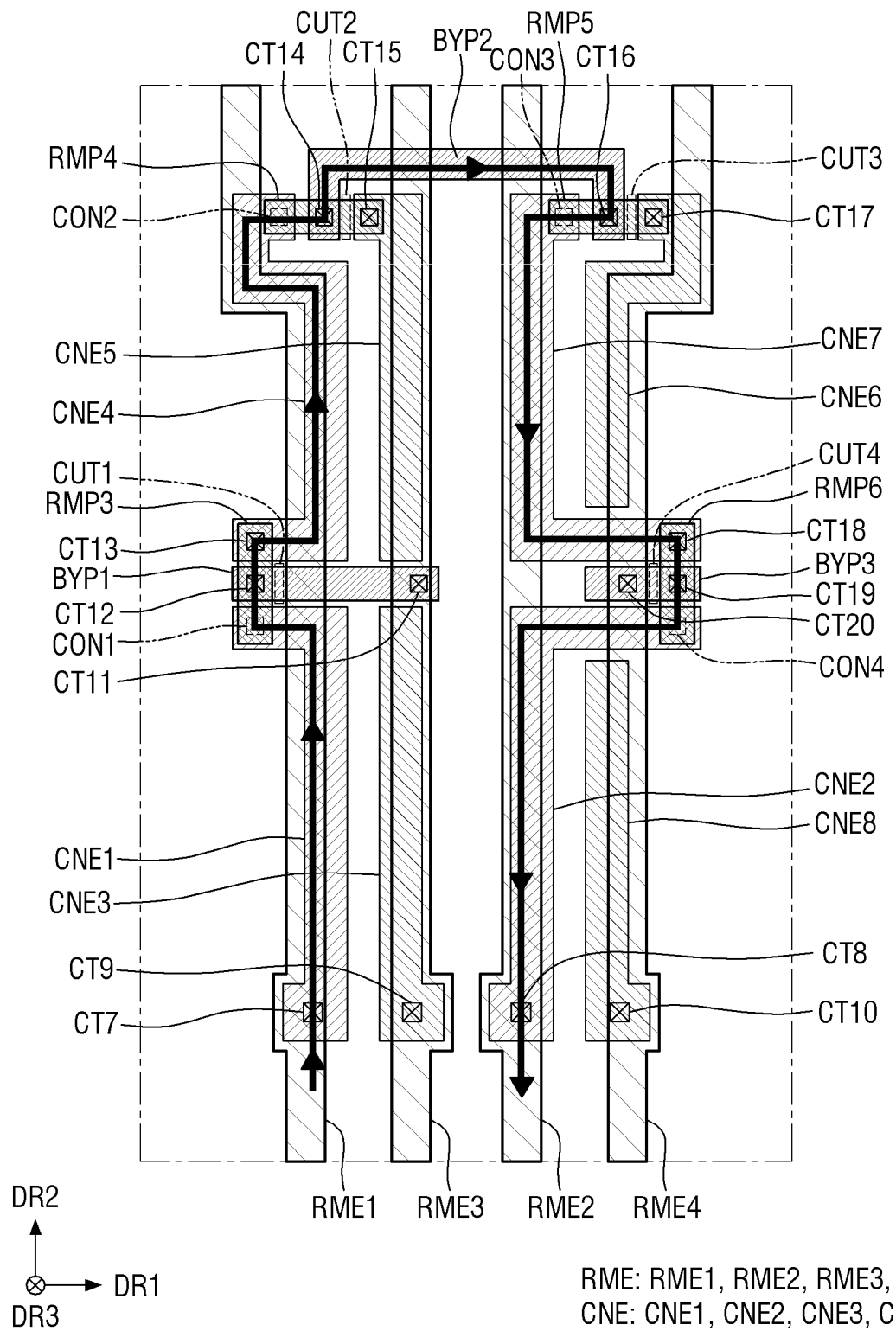
FIG. 26 is a plan view schematically showing regions of via holes in a sub-pixel according to one or more embodiments.
Figure 27:
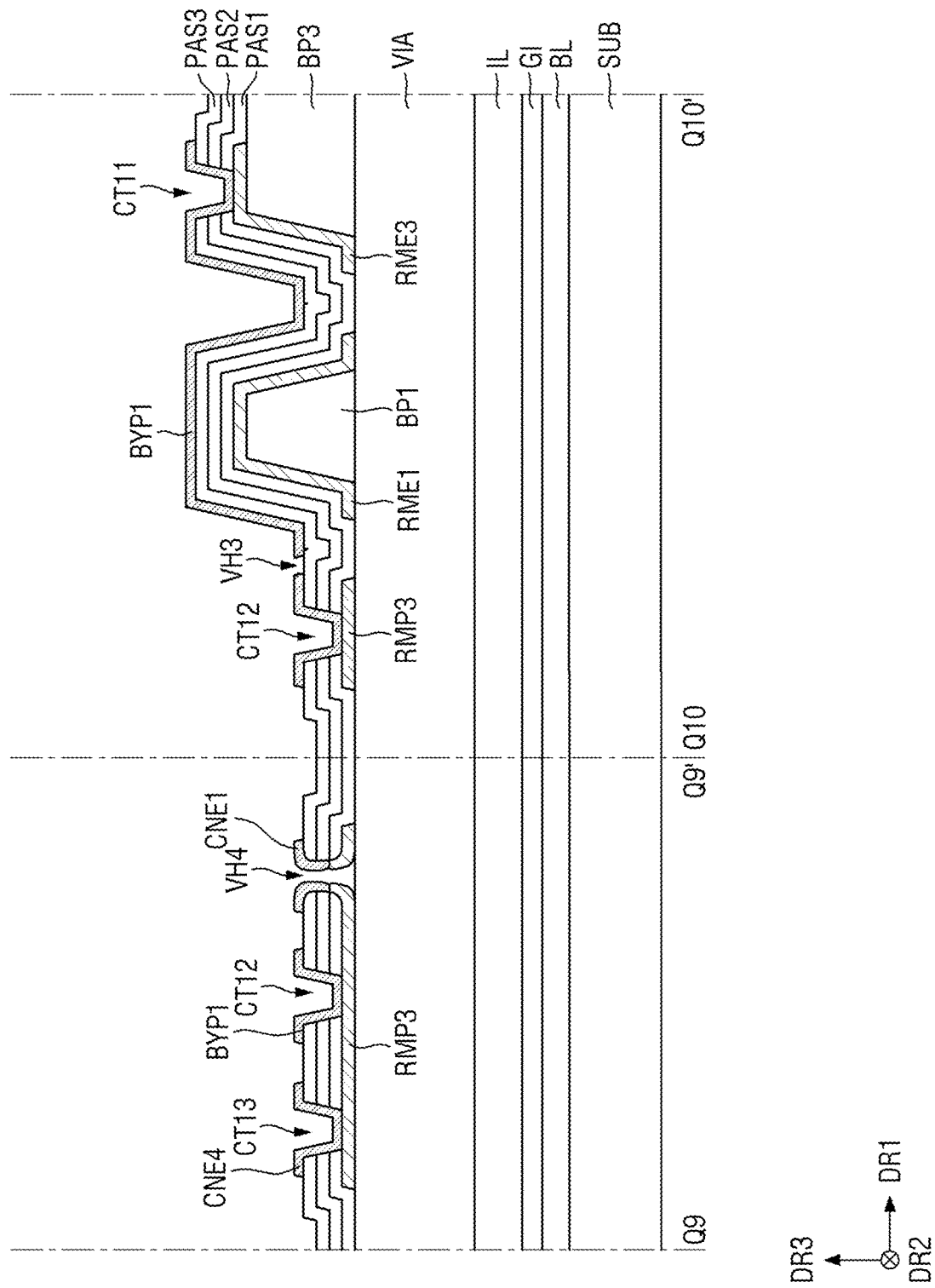
FIG. 27 is a cross-sectional view of the repaired sub-pixel, taken along the lines Q9-Q9' and Q10-Q10' of FIG. 20.
Figure 28:
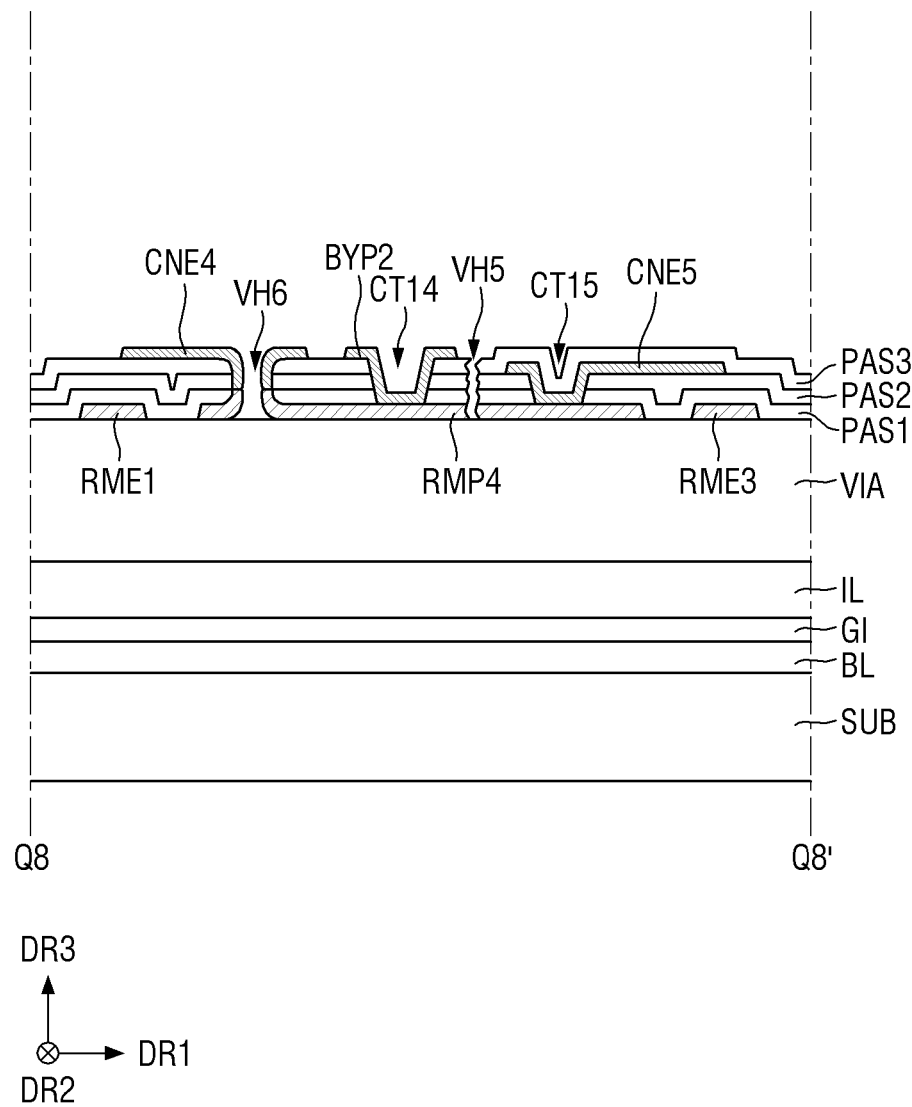
FIG. 28 is a cross-sectional view showing a portion of the cross section of the repaired sub-pixel, taken along the line Q8-Q8' of FIG. 20.
Figure 29:
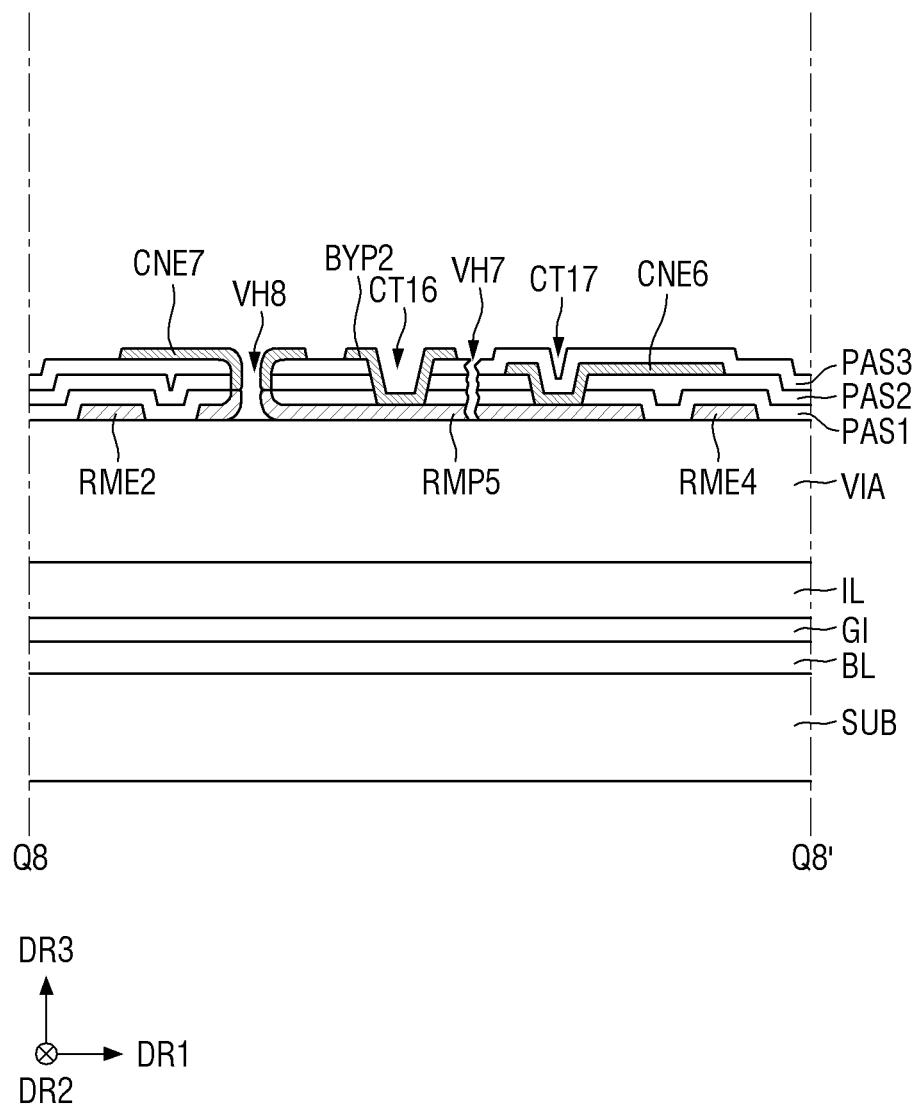
FIG. 29 is a cross-sectional view showing a portion of the cross-sectional view of the repaired sub-pixel, taken along the line Q8-Q8' of FIG. 20.
Figure 30:
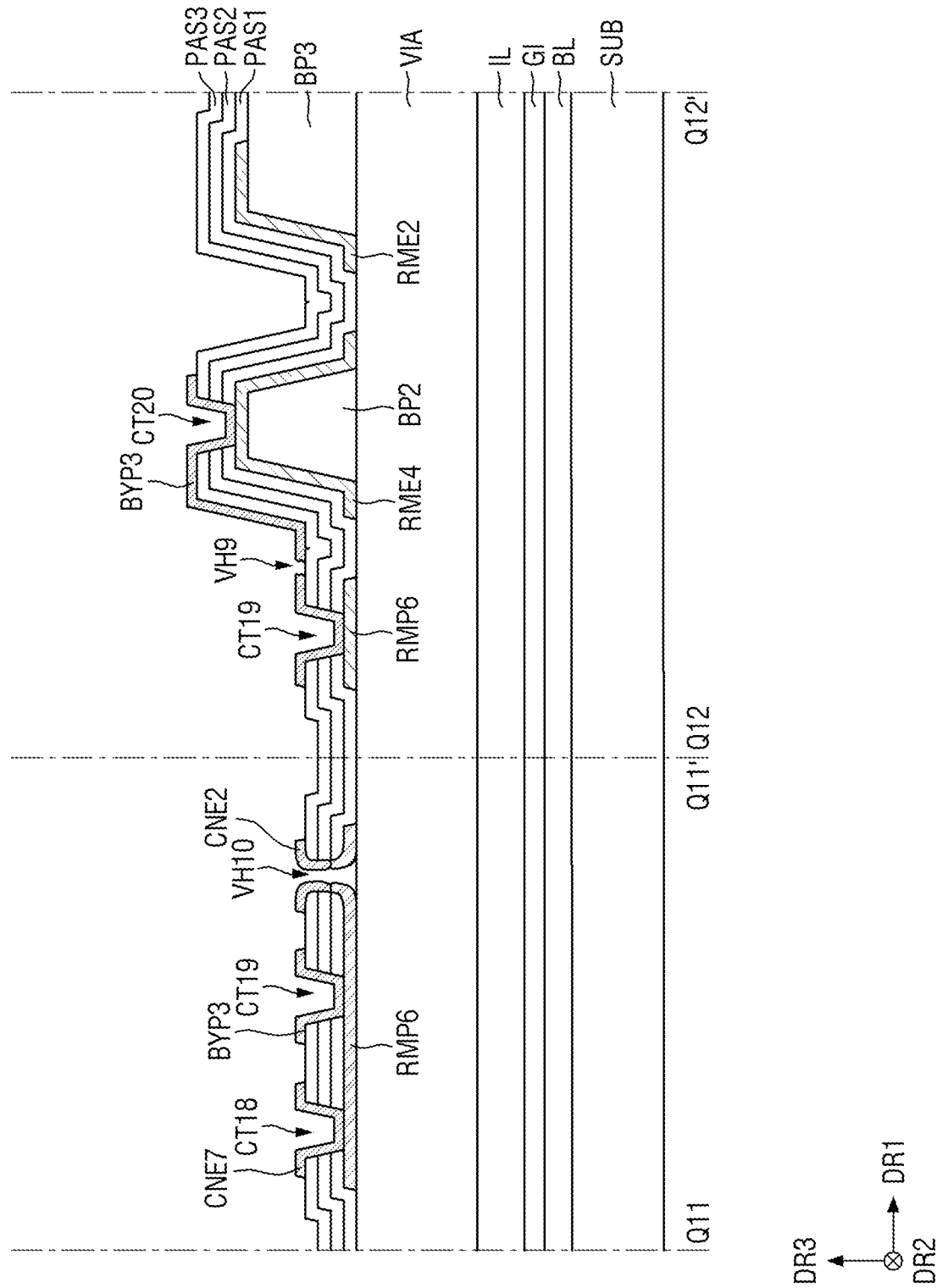
FIG. 30 is a cross-sectional view of the repaired sub-pixel, taken along the lines Q11-Q11' and Q12-Q12' of FIG. 20.

FIG. 25 is a plan view schematically showing flow of electric current in a sub-pixel according to one or more embodiments. FIG. 26 is a plan view schematically showing regions of via holes in a sub-pixel according to one or more embodiments. FIG. 27 is a cross-sectional view of a repaired sub-pixel, taken along the lines Q9-Q9' and Q10-Q10' of FIG. 20. FIG. 28 is a cross-sectional view showing a portion of the cross section of the repaired sub-pixel, taken along the line Q8-Q8' of FIG. 20. FIG. 29 is a cross-sectional view showing another portion of the cross-sectional view of the repaired sub-pixel, taken along the line Q8-Q8' of FIG. 20. FIG. 30 is a cross-sectional view of the repaired sub-pixel, taken along the lines Q11-Q11' and Q12-Q12' of FIG. 20.

Referring to FIG. 25, in the sub-pixel SPXn of the display device 10 according to one or more embodiments, electric current may flow through the electrodes RME, the connection electrodes CNE, and the light-emitting diodes ED so that the light-emitting diodes ED can emit light.

For example, the electric current transmitted to the first electrode RME1 through the transistor is transmitted to the first connection electrode CNE1 through the seventh contact hole CT7. The first light-emitting diode ED1 can emit light as electric current flows through the first connection electrode CNE1 connected to the first end and through the third connection electrode CNE3 connected to the second end. One end of the third connection electrode CNE3 is connected to the third electrode RME3 through the ninth contact hole CT9 to transmit electric current to the third electrode RME3. The current transmitted to the third electrode RME3 is transferred to the first bridge pattern BYP1 through the eleventh contact hole CT11 and is transferred to the third electrode pattern RMP3 through the twelfth contact hole CT12. One end of the third electrode pattern RMP3 is connected to the fourth connection electrode CNE4 through the thirteenth contact hole CT13, and current is transferred to the fourth connection electrode CNE4. One end of the second light-emitting diode ED2 is connected to the fourth connection electrode CNE4 and the other end thereof is connected to the fifth connection electrode CNE5, so that current flows in the fourth connection electrode CNE4, the second light-emitting diode ED2, and the fifth connection electrode CNE5 to emit light. The fifth connection electrode CNE5 transmits current to the fourth electrode pattern RMP4 through the fifteenth contact hole CT15 disposed at one end, and the fourth electrode pattern RMP4 transmits the current to the second bridge pattern BYP2 through the fourteenth contact hole CT14. The second bridge pattern BYP2 transmits current to the fifth electrode pattern RMP5 through the sixteenth contact hole CT16 formed at the other end, and transmits the current to the sixth connection electrode CNE6 through the seventeenth contact hole CT17 formed at one end of the fifth electrode pattern RMP5. One end of the third light-emitting diode ED3 is connected to the sixth connection electrode CNE6 and the other end thereof is connected to the seventh connection electrode CNE7, so that current flows in the sixth connection electrode CNE6, the third light-emitting diode ED3, and the seventh connection electrode CNE7 to emit light. One end of the seventh connection electrode CNE7 is connected to the sixth electrode pattern RMP6 through the eighteenth contact hole CT18 to transmit electric current to the sixth electrode pattern RMP6. The sixth electrode pattern RMP6 transmits current to the third bridge pattern BYP3 through the nineteenth contact hole CT19, and transmits the current to the fourth electrode RME4 through the twentieth contact hole CT20 formed at one end of the third bridge pattern BYP3. The electric current transmitted to the fourth electrode RME4 is transmitted to the eighth connection electrode CNE8 through the tenth contact hole CT10 formed in the fourth electrode RME4. One end of the fourth light-emitting diode ED4 is connected to the eighth connection electrode CNE8 and the other end thereof is connected to the second connection electrode CNE2, so that current flows in the eighth connection electrode CNE8, the fourth light-emitting diode ED4, and the second connection electrode CNE2 to emit light. The current transmitted to the second connection electrode CNE2 flows through the third conductive layer connected to the second electrode RME2 through the eighth contact hole CTB. Accordingly, all of the first to fourth light-emitting diodes ED1, ED2, ED3, and ED4 of the sub-pixel SPXn can emit light normally.

Referring to FIG. 26, the light-emitting diodes ED may not be disposed between the first connection electrode CNE1 and the third connection electrode CNE3, between the fourth connection electrode CNE4 and the fifth connection electrode CNE5, between the sixth connection electrode CNE6 and the seventh connection electrode CNE7, or between the second connection electrode CNE2 and the eighth connection electrode CNE8. When no light-emitting diode ED is disposed, there is no path through which the current can flow, and thus the flow of the current may be interrupted. Accordingly, a dark spot defect may occur, i.e., the entire sub-pixel SPXn fails to emit light.

According to one or more embodiments of the present disclosure, a repair process for forming a path through which electric current can flow may be conducted when no light-emitting diode ED is disposed. The sub-pixel SPXn may include a first repair portion CON1 in which the first connection electrode CNE1 and the third electrode pattern RMP3 overlap each other, a second repair portion CON2 in which the fourth connection electrode CNE4 and the fourth electrode pattern RMP4 overlap each other, a third repair portion CON3 in which the seventh connection electrode CNE7 and the fifth electrode pattern RMP5 overlap each other, and a fourth repair portion CON4 in which the second connection electrode CNE2 and the sixth electrode pattern RMP6 overlap each other. In addition, the sub-pixel SPXn may include a first cutting portion CUT1 located at the first bridge pattern BYP1, a second cutting portion CUT2 located at the fourth electrode pattern RMP4, a third cutting portion CUT3 located at the fifth electrode pattern RMP5, and a fourth cutting portion CUT4 located at the third bridge pattern BYP3.

Hereinafter, different processes of repairing sub-pixels depending on different types of defects when no light-emitting diode ED is disposed will be described.

Referring to FIG. 27, no first light-emitting diode ED1 may be disposed between the first connection electrode CNE1 and the third connection electrode CNE3, resulting in a dark spot defect. In such case, laser is irradiated to a portion of the first bridge pattern BYP1 that is located at the first cutting portion CUT1 to remove the part and cut the first bridge pattern BYP1. When the laser is irradiated to a portion of the first bridge pattern BYP1, the portion of the first bridge pattern BYP1 may be removed by high heat of the laser. Accordingly, a third via hole VH3 may be formed where the portion of the first bridge pattern BYP1 is removed, and accordingly the first bridge pattern BYP1 can be cut.

Subsequently, a laser is irradiated to portions of the first connection electrode CNE1 and the third electrode pattern RMP3 disposed at the first repair portion CON1, so that a fourth via hole VH4 penetrating through the first electrode pattern RMP1, the first insulating layer PAS1, the second insulating layer PAS2, the third insulating layer PAS3 and the third electrode pattern RMP3 is formed. In doing so, the first connection electrode CNE1 and the third electrode pattern RMP3 absorb the thermal energy supplied by the laser, such that they may be partially removed and expanded. As a result, they may be in contact with each other on the side surface of the fourth via hole VH4. Accordingly, the first connection electrode CNE1 and the third electrode pattern RMP3 are brought into contact with each other and electrically connected with each other.

In the sub-pixel SPXn thus repaired, the current transmitted to the first connection electrode CNE1 is transmitted to the third electrode pattern RMP3 through the fourth via hole VH4, and is transmitted to the fourth connection electrode CNE4 through the thirteenth contact hole CT13 formed at one end of the third electrode pattern RMP3. That is to say, when no first light-emitting diode ED1 is disposed, the current cannot be transmitted to the third connection electrode CNE3 but is transmitted to the third electrode pattern RMP3. However, the first bridge pattern BYP1 connected to the third electrode pattern RMP3 is cut, and thus the current can flow through the fourth connection electrode CNE4. In this manner, no light is emitted between the first connection electrode CNE1 and the third connection electrode CNE3, while electric current flows between the fourth connection electrode CNE4 and the fifth connection electrode CNE5, between the sixth connection electrode CNE6 and the seventh connection electrode CNE7, and between the second connection electrode CNE2 and the eighth connection electrode CNE8 so that light can be emitted by the light emitting diodes ED (for example, see FIG. 25).

According to one or more embodiments of the present disclosure, when no first light-emitting diode ED1 is disposed, the first connection electrode CNE1 and the third electrode pattern RMP3 are connected with each other while the first bridge pattern BYP1 is cut, so that the second, third, and fourth light-emitting diodes ED2, ED3, and ED4 can emit light normally. By doing so, it is possible to repair a dark spot defect, i.e., to prevent that all of the light-emitting diodes ED do not emit light.

Referring to FIG. 28, no second light-emitting diode ED2 may be disposed between the fourth connection electrode CNE4 and the fifth connection electrode CNE5, resulting in a dark spot defect. In such case, laser is irradiated to a portion of the fourth electrode pattern RMP4 that is located at the second cutting portion CUT2 to remove the part and cut the fourth electrode pattern RMP4. In this manner, a fifth via hole VH5 may be formed where the portion of the fourth electrode pattern RMP4 is removed, and accordingly the fourth electrode pattern RMP4 can be cut.

Subsequently, a laser is irradiated to portions of the fourth connection electrode CNE4 and the fourth electrode pattern RMP4 disposed at the second repair portion CON2, so that a sixth via hole VH6 penetrating through the fourth connection electrode CNE4, the first insulating layer PAS1, the second insulating layer PAS2, the third insulating layer PAS3, and the fourth electrode pattern RMP4 is formed. Accordingly, the fourth connection electrode CNE4 and the fourth electrode pattern RMP4 are brought into contact with each other on the side surface of the sixth via hole VH6. Accordingly, the fourth connection electrode CNE4 and the fourth electrode pattern RMP4 are brought into contact with each other and electrically connected with each other.

In the sub-pixel SPXn thus repaired, the current transmitted to the fourth connection electrode CNE4 is transmitted to the fourth electrode pattern RMP4 through the sixth via hole VH6, and is transmitted to the second bridge pattern BYP2 through the fourteenth contact hole CT14 formed in the fourth electrode pattern RMP4. That is to say, when no second light-emitting diode ED2 is disposed, the current cannot be transmitted to the fifth connection electrode CNE5 but is transmitted to the fourth electrode pattern RMP4. However, the fourth electrode pattern RMP4 connected to the fifth connection electrode CNE5 is cut, and thus the current can flow to the second bridge pattern BYP2. In this manner, no light is emitted between the fourth connection electrode CNE4 and the fifth connection electrode CNE5, while electric current flows between the first connection electrode CNE1 and the third connection electrode CNE3, between the sixth connection electrode CNE6 and the seventh connection electrode CNE7, and between the second connection electrode CNE2 and the eighth connection electrode CNE8 so that light can be emitted normally.

According to one or more embodiments of the present disclosure, when no second light-emitting diode ED2 is disposed, the fourth connection electrode CNE4 and the fourth electrode pattern RMP4 are connected with each other while the fourth electrode pattern RMP4 adjacent to the fifteenth contact hole CT15 is cut, so that the first, third, and fourth light-emitting diodes ED1, ED3, and ED4 can emit light normally. By doing so, it is possible to repair a dark spot defect, i.e., to prevent that all of the light-emitting diodes ED do not emit light.

Referring to FIG. 29, no third light-emitting diode ED3 may be disposed between the sixth connection electrode CNE6 and the seventh connection electrode CNE7, resulting in a dark spot defect. In such case, laser is irradiated to a portion of the fifth electrode pattern RMPS that is located at the third cutting portion CUT3 to remove the part and cut the fifth electrode pattern RMPS. In this manner, a seventh via hole VH7 may be formed where the portion of the fifth electrode pattern RMPS is removed, and accordingly the fifth electrode pattern RMPS can be cut.

Subsequently, a laser is irradiated to portions of the seventh connection electrode CNE7 and the fifth electrode pattern RMPS disposed at the third repair portion CON3, so that an eighth via hole VH8 penetrating through the seventh connection electrode CNE7, the first insulating layer PAS1, the second insulating layer PAS2, the third insulating layer PAS3, and the fifth electrode pattern RMPS is formed. Accordingly, the seventh connection electrode CNE7 and the fifth electrode pattern RMPS are brought into contact with each other on the side surface of the eighth via hole VH8. Accordingly, the seventh connection electrode CNE7 and the fifth electrode pattern RMPS are brought into contact with each other and electrically connected with each other.

In the sub-pixel SPXn thus repaired, the current transmitted to the fifth electrode pattern RMPS is transmitted to the seventh connection electrode CNE7 through the eighth via hole VH8. That is to say, if the third light-emitting diode ED3 is not disposed, current cannot be transmitted to the seventh connection electrode CNE7 through the sixth connection electrode CNE6. After the repair process, because the fifth electrode pattern RMP5 connected to the sixth connection electrode CNE6 is cut, the current flows to the seventh connection electrode CNE7 through the fifth electrode pattern RMP5. In this manner, no light is emitted between the sixth connection electrode CNE6 and the seventh connection electrode CNE7, while electric current flows between the first connection electrode CNE1 and the third connection electrode CNE3, between the fourth connection electrode CNE4 and the fifth connection electrode CNE5, and between the second connection electrode CNE2 and the eighth connection electrode CNE8 so that light can be emitted normally.

According to one or more embodiments of the present disclosure, when no third light-emitting diode ED3 is disposed, the seventh connection electrode CNE7 and the fifth electrode pattern RMP5 are connected with each other while the fifth electrode pattern RMP5 between the seventeenth contact hole CT17 and the sixteenth contact hole CT16 is cut, so that the first, second, and fourth light-emitting diodes ED1, ED2, and ED4 can emit light normally. By doing so, it is possible to repair a dark spot defect, i.e., to prevent that all of the light-emitting diodes ED do not emit light.

Referring to FIG. 30, no fourth light-emitting diode ED4 may be disposed between the second connection electrode CNE2 and the eighth connection electrode CNE8, resulting in a dark spot defect. In such case, laser is irradiated to a portion of the third bridge pattern BYP3 that is located at the fourth cutting portion CUT4 to remove the part and cut the third bridge pattern BYP3. Accordingly, a ninth via hole VH9 may be formed where the portion of the third bridge pattern BYP3 is removed, and accordingly the third bridge pattern BYP3 can be cut.

Subsequently, a laser is irradiated to portions of the second connection electrode CNE2 and the sixth electrode pattern RMP6 disposed at the fourth repair portion CON4, so that a tenth via hole VH10 penetrating through the second connection electrode CNE2, the first insulating layer PAS1, the second insulating layer PAS2, the third insulating layer PAS3, and the sixth electrode pattern RMP6 is formed. Accordingly, the second connection electrode CNE2 and the sixth electrode pattern RMP6 are brought into contact with each other on the side surface of the tenth via hole VH10. Accordingly, the second connection electrode CNE2 and the sixth electrode pattern RMP6 are brought into contact with each other and electrically connected with each other.

In the sub-pixel SPXn thus repaired, the current transmitted to the seventh connection electrode CNE7 is transmitted to the sixth electrode pattern RMP6 through the eighteenth contact hole CT18, and is transmitted to the second connection electrode CNE2 through the tenth via hole VH10 formed at one end of the sixth electrode pattern RMP6. That is to say, when no fourth light-emitting diode ED4 is disposed, the current cannot be transmitted to the eighth connection electrode CNE8 but is transmitted to the third bridge pattern BYP3. However, the third bridge pattern BYP3 is cut, and thus the current can flow through the second connection electrode CNE2. In this manner, no light is emitted between the second connection electrode CNE2 and the eighth connection electrode CNE8, while electric current flows between the first connection electrode CNE1 and the third connection electrode CNE3, between the fourth connection electrode CNE4 and the fifth connection electrode CNE5, and between the sixth connection electrode CNE6 and the seventh connection electrode CNE7 so that light can be emitted normally.

According to one or more embodiments of the present disclosure, when no fourth light-emitting diode ED4 is disposed, the second connection electrode CNE2 and the sixth electrode pattern RMP6 are connected with each other while the third bridge pattern BYP3 is cut, so that the first, second, and third light-emitting diodes ED1, ED2, and ED4 can emit light normally. By doing so, it is possible to repair a dark spot defect, i.e., to prevent that all of the light-emitting diodes ED do not emit light.

According to one or more embodiments of the present disclosure, the numbers of the electrode patterns and bridge patterns in a display device can be increased. Hereinafter, a display device according to one or more embodiments of the present disclosure will be described with reference to other drawings.

Figure 31:
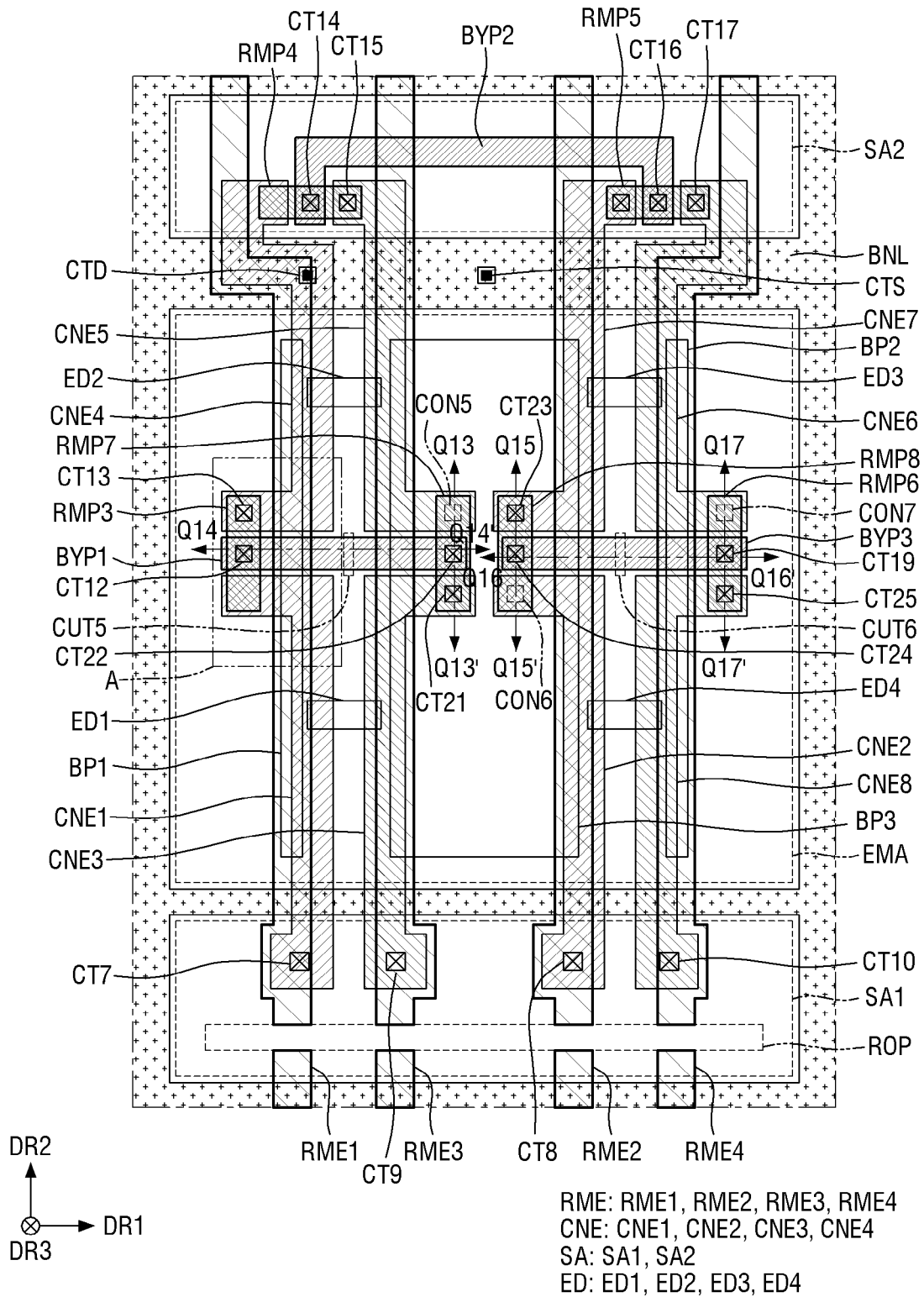
FIG. 31 is a plan view showing a sub-pixel according to one or more embodiments of the present disclosure.
Figure 32:
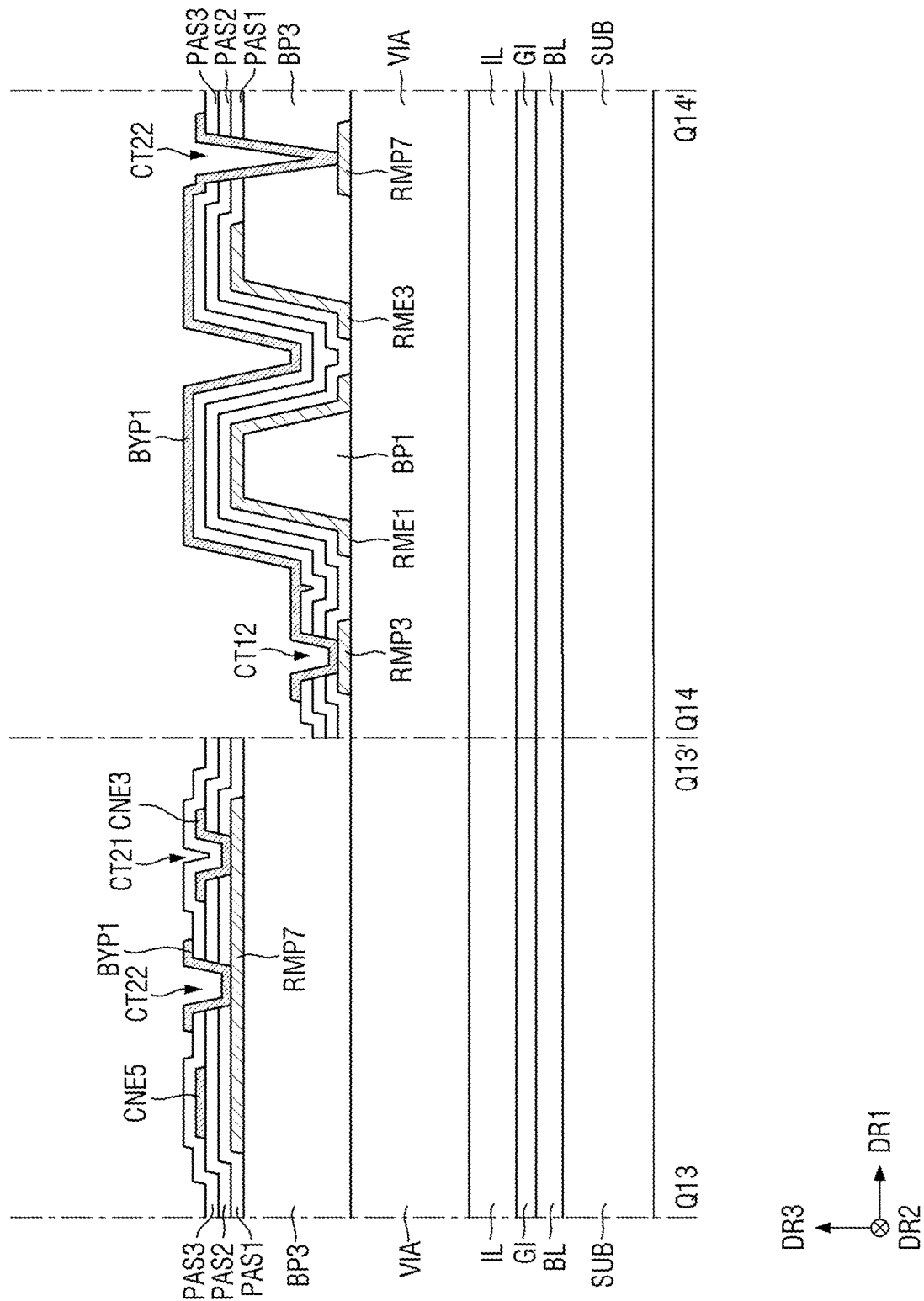
FIG. 32 is a cross-sectional view taken along the lines Q13-Q13' and Q14-Q14' of FIG. 31.
Figure 33:
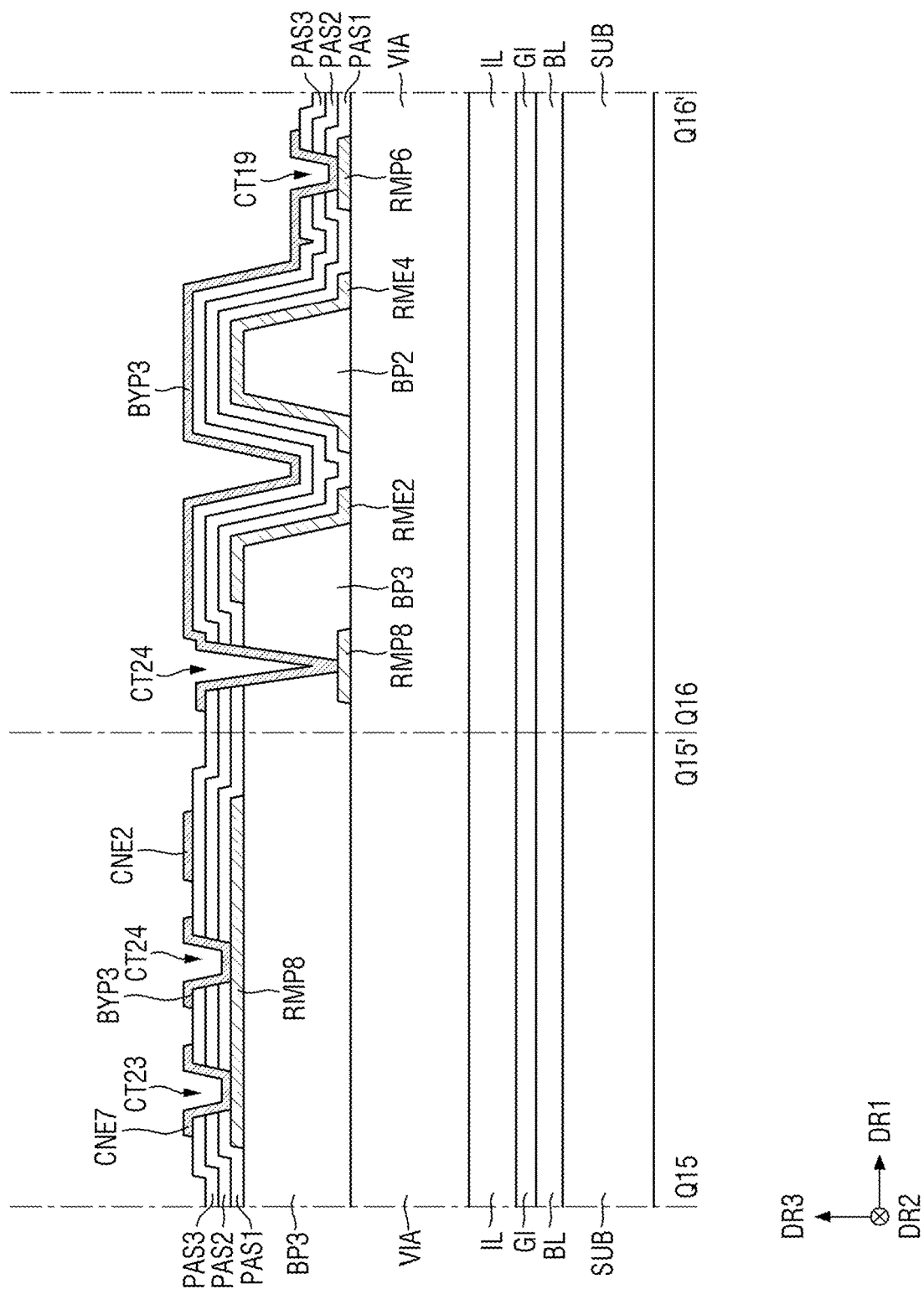
FIG. 33 is a cross-sectional view taken along the lines Q15-Q15' and Q16-Q16' of FIG. 31.
Figure 34:
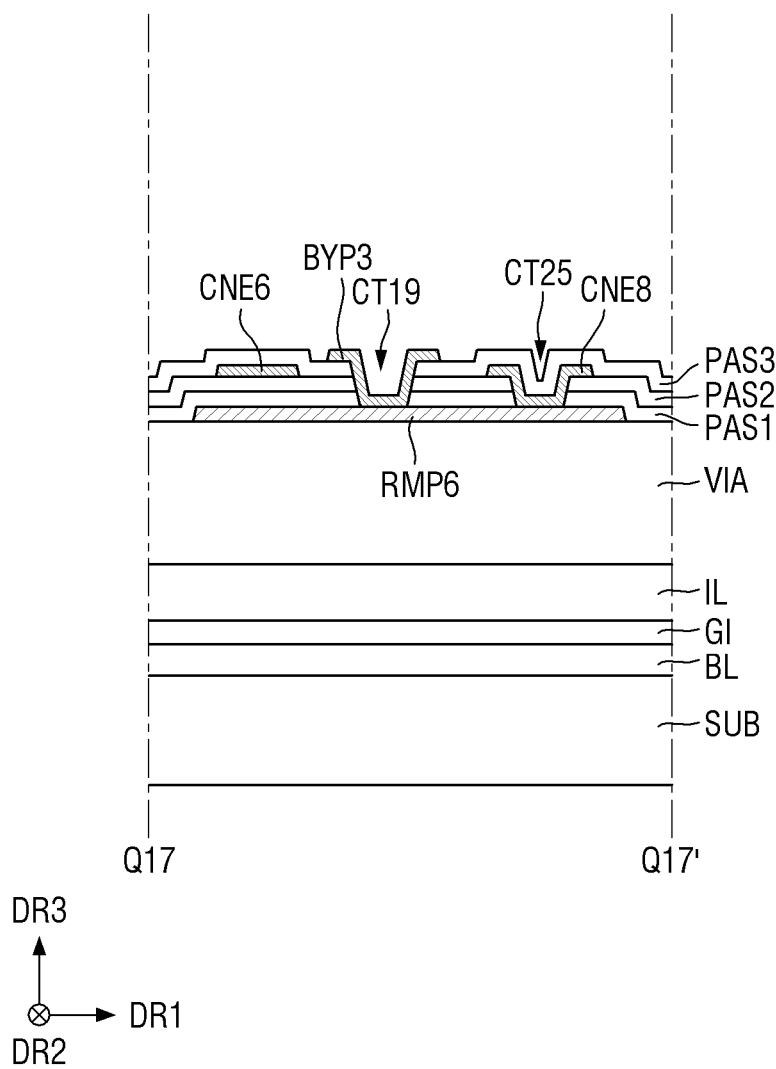
FIG. 34 is a cross-sectional view taken along the line Q17-Q17' of FIG. 31.

FIG. 31 is a plan view showing a sub-pixel according to one or more embodiments of the present disclosure. FIG. 32 is a cross-sectional view taken along the lines Q13-Q13' and Q14-Q14' of FIG. 31. FIG. 33 is a cross-sectional view taken along the lines Q15-Q15' and Q16-Q16' of FIG. 31. FIG. 34 is a cross-sectional view taken along the line Q17-Q17' of FIG. 31.

The embodiment of FIGS. 31 to 34 is different from the above-described embodiments of FIGS. 20 to 30 in that the former further includes a seventh electrode pattern RMP7 and an eighth electrode pattern RMP8. In the following description, the description will focus on the difference and the redundant description will be omitted.

According to one or more embodiments, the shape of the second connection electrode CNE2, the third connection electrode CNE3, the fifth connection electrode CNE5, and the seventh connection electrode CNE7 may be altered, in order to be connected to the seventh electrode pattern RMP7, and the eighth electrode pattern RMP8.

The third connection electrode CNE3 may be extended in the second direction DR2 and bent in the first direction DR1 in the emission area EMA. The fifth connection electrode CNE5 may be extended in the opposite direction to the second direction DR2 and bent in the first direction DR1 in the emission area EMA. The bent portion of the third connection electrode CNE3 and the bent portion of the fifth connection electrode CNE5 may be extended in parallel to each other and may face (or may be opposite) each other.

In addition, the second connection electrode CNE2 may be extended in the second direction DR2 and bent in the opposite direction to the first direction DR1 in the emission area EMA. The seventh connection electrode CNE7 may be extended in the opposite direction to the second direction DR2 and bent in the opposite direction to the first direction DR1 in the emission area EMA. The bent portion of the second connection electrode CNE2 and the bent portion of the seventh connection electrode CNE7 may be extended in parallel to each other and may face (or may be opposite) each other.

The display device 10 may further include the seventh electrode pattern RMP7 and the eighth electrode pattern RMP8 in the emission area EMA.

The seventh electrode pattern RMP7 may be disposed between the third connection electrode CNE3 and the fifth connection electrode CNE5 in the emission area EMA. The seventh electrode pattern RMP7 may have an island-shaped pattern extended in the second direction DR2, and one side thereof may overlap the third connection electrode CNE3 and the other side thereof may overlap the fifth connection electrode CNE5. For example, the seventh electrode pattern RMP7 may be connected to the third connection electrode CNE3 through a twenty-first contact hole CT21 penetrating the first insulating layer PAS1 and the second insulating layer PAS2. In addition, the seventh electrode pattern RMP7 may cross and overlap the first bridge pattern BYP1, and may be connected to the first bridge pattern BYP1 through a twenty-second contact hole CT22 penetrating the first insulating layer PAS1, the second insulating layer PAS2, and the third insulating layer PAS3. The seventh electrode pattern RMP7 may be disposed directly on the third bank pattern BP3, and may be made of the same material as the above-described electrodes RME.

The eighth electrode pattern RMP8 may be disposed between the second connection electrode CNE2 and the seventh connection electrode CNE7. The eighth electrode pattern RMP8 may have an island-shaped pattern extended in the second direction DR2, and one side thereof may overlap the second connection electrode CNE2 and the other side thereof may overlap the seventh connection electrode CNE7. For example, the eighth electrode pattern RMP8 may be connected to the seventh connection electrode CNE7 through a twenty-third contact hole CT23 penetrating the first insulating layer PAS1, the second insulating layer PAS2, and the third insulating layer PAS3. In addition, the eighth electrode pattern RMP8 may cross and overlap the third bridge pattern BYP3, and may be connected to the third bridge pattern BYP3 through a twenty-fourth contact hole CT24 penetrating the first insulating layer PAS1, the second insulating layer PAS2, and the third insulating layer PAS3. The eighth electrode pattern RMP8 may be disposed directly on the third bank pattern BP3, and may be made of the same material as the above-described electrodes RME.

Unlike the above-described embodiments according to FIGS. 20-30, the sixth electrode pattern RMP6 may be disposed between the sixth connection electrode CNE6 and the eighth connection electrode CNE8. One side of the sixth electrode pattern RMP6 may overlap the sixth connection electrode CNE6 and the other side thereof may overlap the eighth connection electrode CNE8. The sixth electrode pattern RMP6 may be connected to the eighth connection electrode CNE8 through a twenty-fifth contact hole CT25 penetrating the first insulating layer PAS1 and the second insulating layer PAS2. The sixth electrode pattern RMP6 may cross and overlap the third bridge pattern BYP3. The sixth electrode pattern RMP6 may be connected to the third bridge pattern BYP3 through a nineteenth contact hole CT19 penetrating the first insulating layer PAS1, the second insulating layer PAS2, and the third insulating layer PAS3.

Referring to FIG. 31, in the sub-pixel SPXn of the display device 10 according to one or more embodiments, electric current may flow through the electrodes RME, the connection electrodes CNE, and the light-emitting diodes ED so that the light-emitting diodes ED can emit light.

For example, the electric current transmitted to the first electrode RME1 through the transistor is transmitted to the first connection electrode CNE1 through the seventh contact hole CT7. The first light-emitting diode ED1 can emit light as electric current flows in the first connection electrode CNE1 connected to the first end and the third connection electrode CNE3 connected to the second end. One end of the third connection electrode CNE3 is connected to the seventh electrode pattern RMP7 through the twenty-first contact hole CT21 to transmit electric current to the seventh electrode pattern RMP7. The current transmitted to the seventh electrode pattern RME7 is transmitted to the first bridge pattern BYP1 through the twenty-second contact hole CT22 and is transmitted to the third electrode pattern RMP3 through the twelfth contact hole CT12. One end of the third electrode pattern RMP3 is connected to the fourth connection electrode CNE4 through the thirteenth contact hole CT13, and current is transferred to the fourth connection electrode CNE4. One end of the second light-emitting diode ED2 is connected to the fourth connection electrode CNE4 and the other end thereof is connected to the fifth connection electrode CNE5, so that current flows in the fourth connection electrode CNE4, the second light-emitting diode ED2, and the fifth connection electrode CNE5 to emit light. The fifth connection electrode CNE5 transmits current to the fourth electrode pattern RMP4 through the fifteenth contact hole CT15 disposed at one end, and the fourth electrode pattern RMP4 transmits the current to the second bridge pattern BYP2 through the fourteenth contact hole CT14. The second bridge pattern BYP2 transmits current to the fifth electrode pattern RMPS through the sixteenth contact hole CT16 formed at the other end, and transmits the current to the sixth connection electrode CNE6 through the seventeenth contact hole CT17 formed at one end of the fifth electrode pattern RMPS. One end of the third light-emitting diode ED3 is connected to the sixth connection electrode CNE6 and the other end thereof is connected to the seventh connection electrode CNE7, so that current flows in the sixth connection electrode CNE6, the third light-emitting diode ED3, and the seventh connection electrode CNE7 to emit light. One end of the seventh connection electrode CNE7 is connected to the eighth electrode pattern RMP8 through the twenty-third contact hole CT23 to transmit electric current to the eighth electrode pattern RMP8. The eighth electrode pattern RMP8 transmits current to the third bridge pattern BYP3 through the twenty-fourth contact hole CT24, and transmits the current to the sixth electrode pattern RMP6 through the nineteenth contact hole CT19 formed at one end of the third bridge pattern BYP3. The current transmitted to the sixth electrode pattern RMP6 is transmitted to the eighth connection electrode CNE8 through the twenty-fifth contact hole CT25 formed at one end of the sixth electrode pattern RMP6. One end of the fourth light-emitting diode ED4 is connected to the eighth connection electrode CNE8 and the other end thereof is connected to the second connection electrode CNE2, so that current flows in the eighth connection electrode CNE8, the fourth light-emitting diode ED4, and the second connection electrode CNE2 to emit light. The current transmitted to the second connection electrode CNE2 flows through the third conductive layer connected to the second electrode RME2 through the eighth contact hole CTB. Accordingly, all of the first to fourth light-emitting diodes ED1, ED2, ED3, and ED4 of the sub-pixel SPXn can emit light normally.

According to one or more embodiments of the present disclosure, it is possible to repair a dark spot defect of a sub-pixel by using a method different from the method described above with reference to FIGS. 20-30, in which no light-emitting diode ED is disposed between the fourth connection electrode CNE4 and the fifth connection electrode CNE5 or between the second connection electrode CNE2 and the eighth connection electrode CNE8. Hereinafter, more detailed description thereon will be made with reference to the accompanying drawings.

Figure 35:
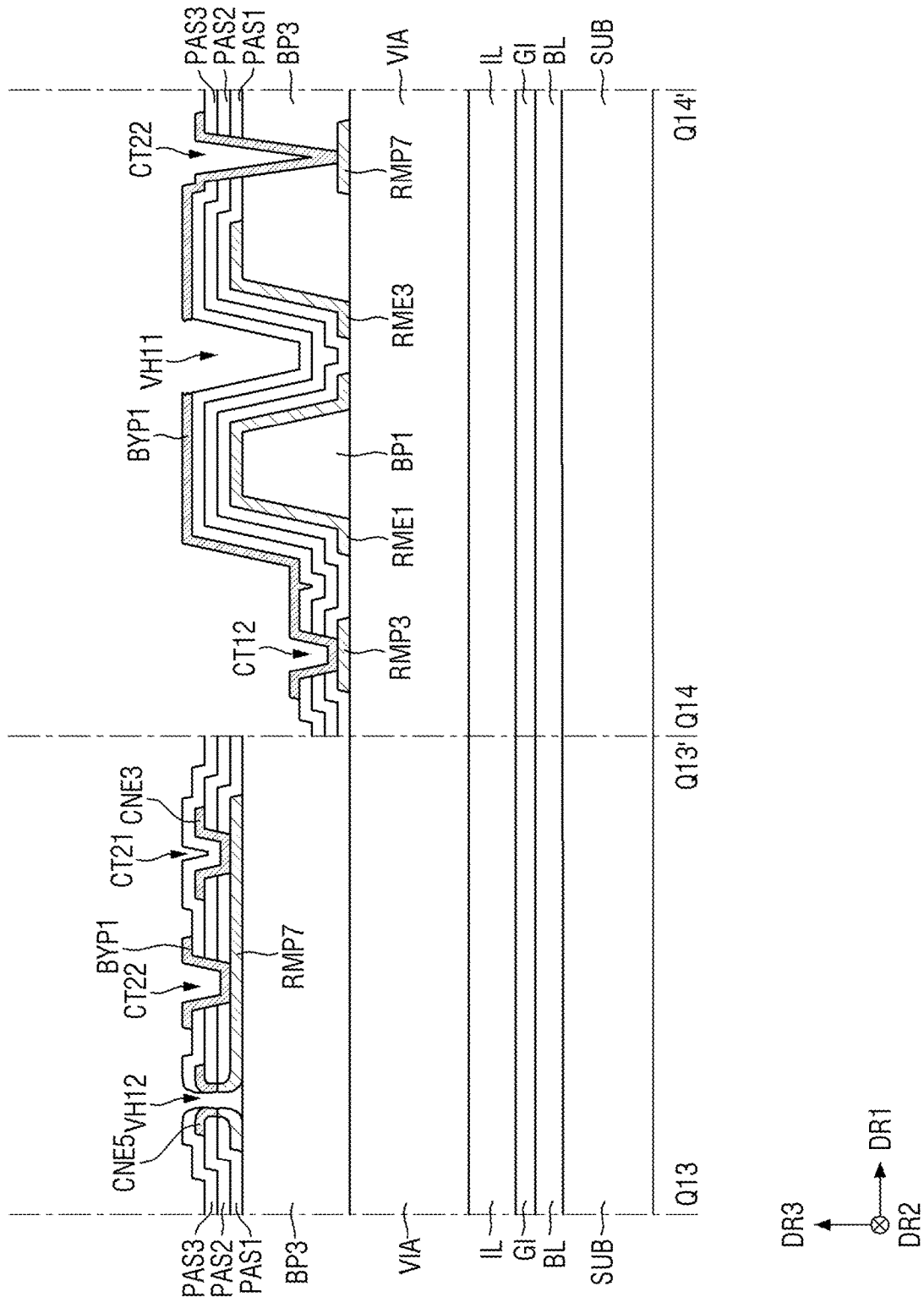
FIG. 35 is a cross-sectional view of the repaired sub-pixel, taken along the lines Q13-Q13' and Q14-Q14' of FIG. 31.
Figure 36:
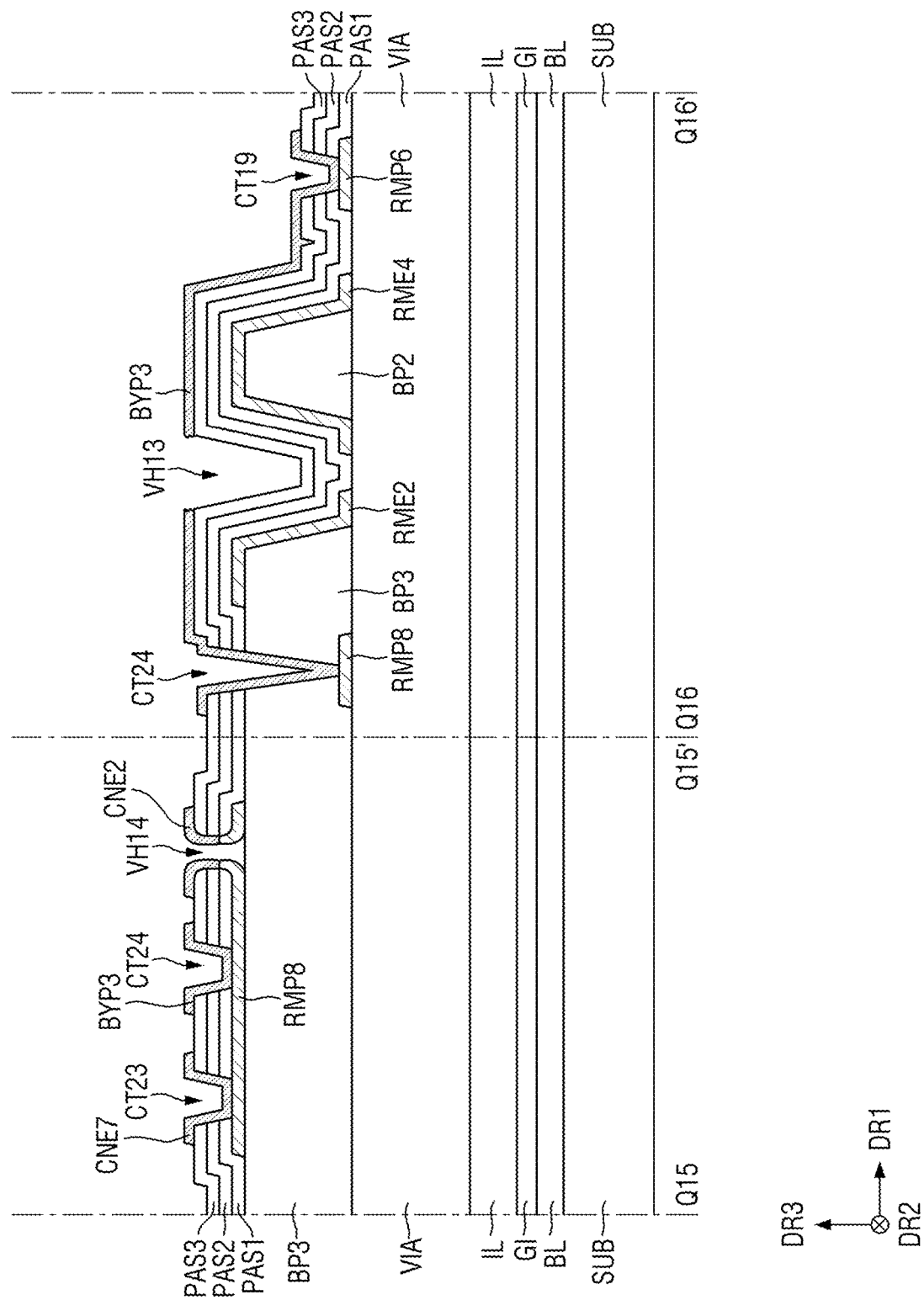
FIG. 36 is a cross-sectional view of the repaired sub-pixel, taken along the lines Q15-Q15' and Q16-Q16' of FIG. 31.
Figure 37:
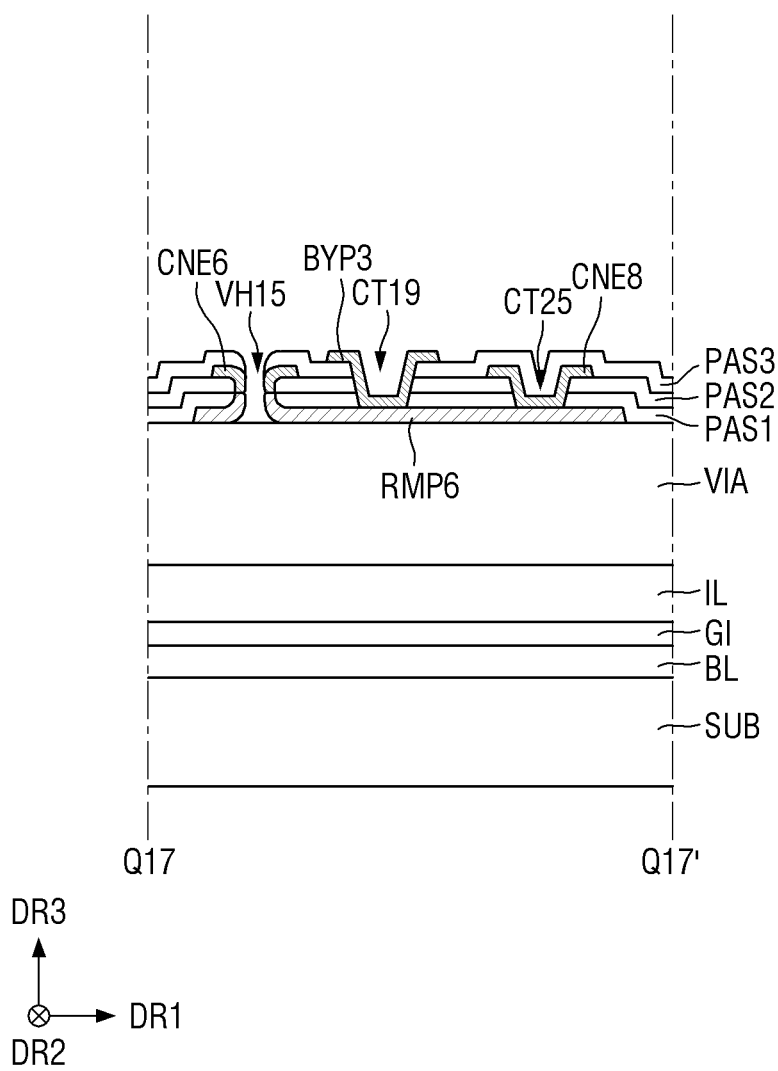
FIG. 37 is a cross-sectional view showing the repaired sub-pixel, taken along the line Q17-Q17' of FIG. 31.

FIG. 35 is a cross-sectional view of the repaired sub-pixel, taken along the lines Q13-Q13' and Q14-Q14' of FIG. 31. FIG. 36 is a cross-sectional view of the repaired sub-pixel, taken along the lines Q15-Q15' and Q16-Q16' of FIG. 31. FIG. 37 is a cross-sectional view showing the repaired sub-pixel, taken along the line Q17-Q17' of FIG. 31.

Referring to FIG. 31, according to one or more embodiments of the present disclosure, a repair process for forming a path through which electric current can flow may be conducted when no light-emitting diode ED is disposed. The sub-pixel SPXn may include a fifth repair portion CON5 in which the fifth connection electrode CNE5 and the seventh electrode pattern RMP7 overlap each other, a sixth repair portion CON6 in which the second connection electrode CNE2 and the eighth electrode pattern RMP8 overlap each other, and a seventh repair portion CON7 in which the sixth connection electrode CNE6 and the sixth electrode pattern RMP6 overlap each other. In addition, the sub-pixel SPXn may include a fifth cutting portion CUT5 located at the first bridge pattern BYP1, and a sixth cutting portion CUT6 located at the third bridge pattern BYP3.

Hereinafter, a process of repairing a defect caused when no light-emitting diode ED is disposed between the fourth connection electrode CNE4 and the fifth connection electrode CNE5 or between the second connection electrode CNE2 and the eighth connection electrode CNE8 will be described.

Referring to FIG. 35 in conjunction with FIG. 31, no second light-emitting diode ED2 may be disposed between the fourth connection electrode CNE4 and the fifth connection electrode CNE5, resulting in a dark spot defect. In such case, laser is irradiated to a portion of the first bridge pattern BYP1 that is located at the fifth cutting portion CUT5 to remove the part and cut the first bridge pattern BYP1. When the laser is irradiated to a portion of the first bridge pattern BYP1, the portion of the first bridge pattern BYP1 may be removed by high heat of the laser. Accordingly, an eleventh via hole VH11 may be formed where the portion of the first bridge pattern BYP1 is removed, and accordingly the first bridge pattern BYP1 can be cut.

Subsequently, a laser is irradiated to portions of the fifth connection electrode CNE5 and the seventh electrode pattern RMP7 disposed at the fifth repair portion CON5, so that a twelfth via hole VH12 penetrating through the fifth connection electrode CNE5, the first insulating layer PAS1, the second insulating layer PAS2, the third insulating layer PAS3, and the seventh electrode pattern RMP7 is formed. Accordingly, the fifth connection electrode CNE5 and the seventh electrode pattern RMP7 are brought into contact with each other on the side surface of the twelfth via hole VH12. Accordingly, the fifth connection electrode CNE5 and the seventh electrode pattern RMP7 are brought into contact with each other and electrically connected with each other.

In the sub-pixel SPXn thus repaired, the current transmitted to the third connection electrode CNE3 is transmitted to the seventh electrode pattern RMP7 through the twenty-first contact hole CT21, and is transmitted to the fifth connection electrode CNE5 through the twelfth via hole VH12 formed at one end of the seventh electrode pattern RMP7. That is to say, when no second light-emitting diode ED2 is disposed, the current cannot be transmitted to the fourth connection electrode CNE4 but is transmitted to the seventh electrode pattern RMP7. However, the first bridge pattern BYP1 connected to the seventh electrode pattern RMP7 is cut, and thus the current can flow through the fifth connection electrode CNE5. In this manner, no light is emitted between the fourth connection electrode CNE4 and the fifth connection electrode CNE5, while electric current flows between the first connection electrode CNE1 and the third connection electrode CNE3, between the sixth connection electrode CNE6 and the seventh connection electrode CNE7, and between the second connection electrode CNE2 and the eighth connection electrode CNE8 so that light can be emitted normally.

According to one or more embodiments of the present disclosure, when no second light-emitting diode ED2 is disposed, the fifth connection electrode CNE5 and the seventh electrode pattern RMP7 are connected with each other while the first bridge pattern BYP1 is cut, so that the first, third, and fourth light-emitting diodes ED1, ED3, and ED4 can emit light normally. By doing so, it is possible to repair a dark spot defect, i.e., to prevent that all of the light-emitting diodes ED do not emit light.

Referring to FIG. 36 in conjunction with FIG. 31, no fourth light-emitting diode ED4 may be disposed between the second connection electrode CNE2 and the eighth connection electrode CNE8, resulting in a dark spot defect. In such case, laser is irradiated to a portion of the third bridge pattern BYP3 that is located at the sixth cutting portion CUT6 to remove the part and cut the third bridge pattern BYP3. Accordingly, a thirteenth via hole VH13 may be formed where the portion of the third bridge pattern BYP3 is removed, and accordingly the third bridge pattern BYP3 can be cut.

Subsequently, a laser is irradiated to portions of the second connection electrode CNE2 and the eighth electrode pattern RMP8 disposed at the sixth repair portion CON6, so that a fourteenth via hole VH14 penetrating through the second connection electrode CNE2, the first insulating layer PAS1, the second insulating layer PAS2, the third insulating layer PAS3, and the eighth electrode pattern RMP8 is formed. Accordingly, the second connection electrode CNE2 and the eighth electrode pattern RMP8 are brought into contact with each other on the side surface of the fourteenth via hole VH14. Accordingly, the second connection electrode CNE2 and the eighth electrode pattern RMP8 are brought into contact with each other and electrically connected with each other.

In the sub-pixel SPXn thus repaired, the current transmitted to the seventh connection electrode CNE7 is transmitted to the eighth electrode pattern RMP8 through the twenty-third contact hole CT23, and is transmitted to the second connection electrode CNE2 through fourteenth via hole VH14 formed at one end of the eighth electrode pattern RMP8. That is to say, if the fourth light-emitting diode ED4 is not disposed, current cannot be transmitted to the second connection electrode CNE2 from the eighth connection electrode CNE8. The current transmitted to the third bridge pattern BYP3 through the eighth electrode pattern RMP8 cannot flow because the third bridge pattern BYP3 is cut, but flows back to the eighth electrode pattern RMP8 and flows to the second connection electrode CNE2 through the fourteenth via hole VH14. In this manner, no light is emitted between the second connection electrode CNE2 and the eighth connection electrode CNE8, while electric current flows between the first connection electrode CNE1 and the third connection electrode CNE3, between the fourth connection electrode CNE4 and the fifth connection electrode CNE5, and between the sixth connection electrode CNE6 and the seventh connection electrode CNE7 so that light can be emitted normally.

According to one or more embodiments of the present disclosure, when no fourth light-emitting diode ED4 is disposed, the second connection electrode CNE2 and the eighth electrode pattern RMP8 are connected with each other while the third bridge pattern BYP3 is cut, so that the first, second, and third light-emitting diodes ED1, ED2, and ED4 can emit light normally. By doing so, it is possible to repair a dark spot defect, i.e., to prevent that all of the light-emitting diodes ED do not emit light.

Referring to FIG. 37 in conjunction with FIG. 31, no third light-emitting diode ED3 may be disposed between the sixth connection electrode CNE6 and the seventh connection electrode CNE7, resulting in a dark spot defect. In such case, laser is irradiated to a portion of the third bridge pattern BYP3 that is located at the sixth cutting portion CUTE to remove the part and cut the third bridge pattern BYP3. Accordingly, a thirteenth via hole VH13 may be formed where the portion of the third bridge pattern BYP3 is removed, and accordingly the third bridge pattern BYP3 can be cut.

Subsequently, a laser is irradiated to portions of the sixth connection electrode CNE6 and the sixth electrode pattern RMP6 disposed at the seventh repair portion CON7, so that a fifteenth via hole VH15 penetrating through the sixth connection electrode CNE6, the first insulating layer PAS1, the second insulating layer PAS2, the third insulating layer PAS3, and the sixth electrode pattern RMP6 is formed. Accordingly, the sixth connection electrode CNE6 and the sixth electrode pattern RMP6 are brought into contact with each other on the side surface of the fifteenth via hole VH15. Accordingly, the sixth connection electrode CNE6 and the sixth electrode pattern RMP6 are brought into contact with each other and electrically connected with each other.

In the sub-pixel SPXn thus repaired, the current transmitted to the sixth connection electrode CNE6 is transmitted to the sixth electrode pattern RMP6 through the fifteenth via hole VH15, and is transmitted to the eighth connection electrode CNE8 through the twenty-fifth contact hole CT25 formed at one end of the sixth electrode pattern RMP6. That is to say, when no third light-emitting diode ED3 is disposed, the current cannot be transmitted to the seventh connection electrode CNE7 but is transmitted to the third bridge pattern BYP3. However, the third bridge pattern BYP3 is cut, and thus the current can flow through the eighth connection electrode CNE8. In this manner, no light is emitted between the sixth connection electrode CNE6 and the seventh connection electrode CNE7, while electric current flows between the first connection electrode CNE1 and the third connection electrode CNE3, between the fourth connection electrode CNE4 and the fifth connection electrode CNE5, and between the second connection electrode CNE2 and the eighth connection electrode CNE8 so that light can be emitted normally.

According to one or more embodiments of the present disclosure, when no third light-emitting diode ED3 is disposed, the sixth connection electrode CNE6 and the sixth electrode pattern RMP6 are connected with each other while the third bridge pattern BYP3 is cut, so that the first, second, and fourth light-emitting diodes ED1, ED2, and ED4 can emit light normally. By doing so, it is possible to repair a dark spot defect, i.e., to prevent that all of the light-emitting diodes ED do not emit light.

In the above-described embodiments, the connection electrodes CNE are connected with one another through the bridge patterns BYP and the electrode patterns RMP. It should be understood that the present disclosure is not limited thereto. The bridge patterns BYP may directly connect between the connection electrodes CNE.

Figure 38:
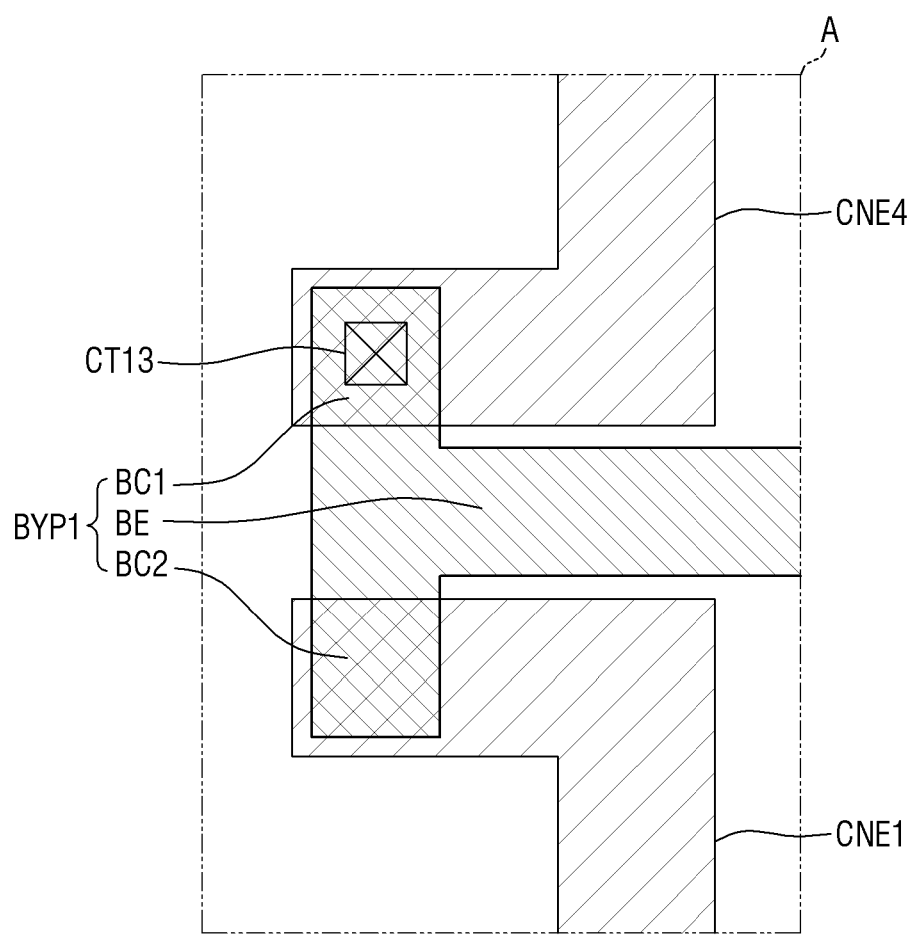
FIG. 38 is a plan view showing an example of area A of FIG. 31.
Figure 39:
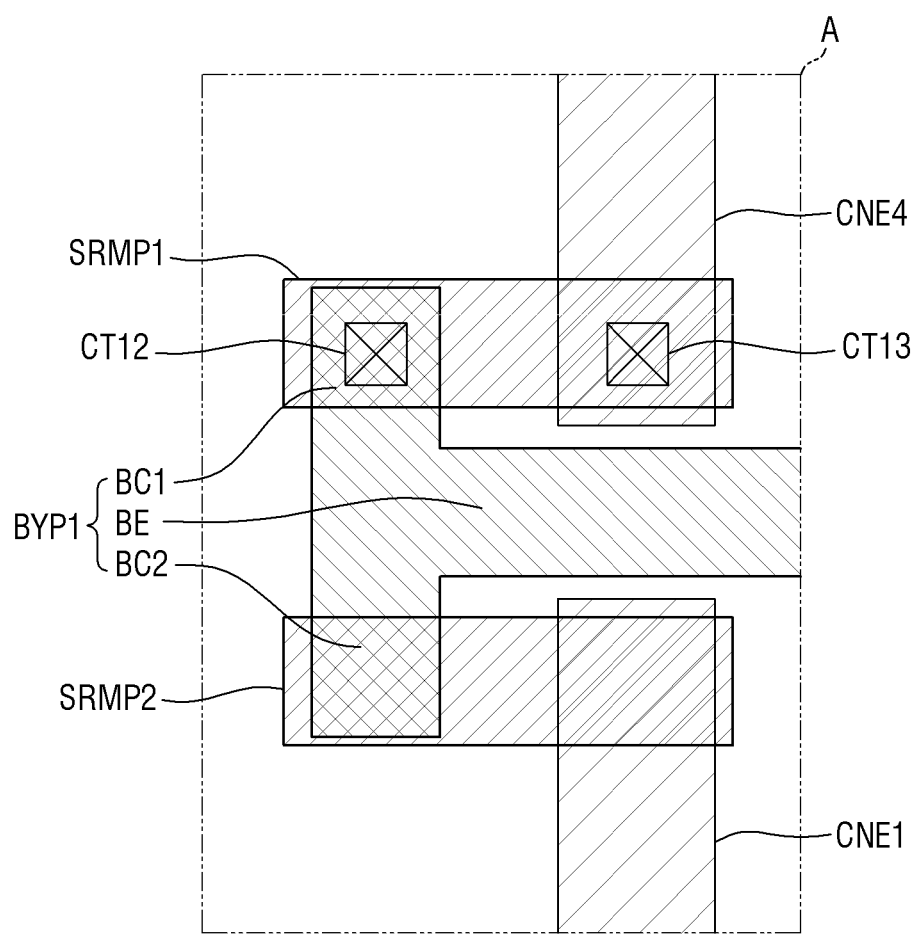
FIG. 39 is a plan view showing an example of area A of FIG. 31.

FIG. 38 is a plan view showing an example of area A of FIG. 31. FIG. 39 is a plan view showing yet another example of area A of FIG. 31.

Referring to FIG. 38, the first connection electrode CNE1 and the fourth connection electrode CNE4 may be connected with each other directly by the first bridge pattern BYP1. The first bridge pattern BYP1 may include a bridge extended portion BE extended in the first direction DR1, a first bent portion BC1 bent in the second direction DR2 from one end of the bridge extended portion BE, and a second bent portion BC2 bent in the opposite direction to the second direction DR2 from the one end of the bridge extended portion BE. The one end of the first bent portion BC1 may be connected to the fourth connection electrode CNE4 through the thirteenth contact hole CT13. When a repair process is conducted, one end of the second bent portion BC1 may be connected to the first connection electrode CNE1 through a via hole formed by irradiating a laser.

On the other hand, referring to FIG. 39, a first subsidiary electrode pattern SRMP1 may be disposed between one end of the first bent portion BC1 of the bridge pattern BYP1 and the fourth connection electrode CNE4, to connect the first bent portion BC1 with the fourth connection electrode CNE4. The one end of the first subsidiary electrode pattern SRMP1 may overlap the first bent portion BC1 and may be connected to the first bent portion BC1 through the twelfth contact hole CT12. The other end of the first subsidiary electrode SRMP1 may overlap the fourth connection electrode CNE4 and may be connected to the fourth connection electrode CNE4 through the thirteenth contact hole CT13.

A second subsidiary electrode pattern SRMP2 may be disposed between one end of the second bent portion BC2 of the bridge pattern BYP1 and the first connection electrode CNE1, to connect the second bent portion BC2 with the first connection electrode CNE1. One end of the second subsidiary electrode pattern SRMP2 may overlap the second bent portion BC2, and the other end thereof may overlap the first connection electrode CNE1. When a repair process is conducted, the one end of the second subsidiary electrode pattern SRMP2 may be connected to the second bent portion BC2 through a via hole formed by a laser. When a repair process is conducted, the other end of the second subsidiary electrode pattern SRMP2 may be connected to the first connection electrode CNE1 through a via hole formed by a laser.

FIGS. 38 and 39 shows examples of area A of FIG. 31, which may be applied to all portions to which the connection electrodes are connected through the bridge patterns and the electrode patterns.

Table 1 below shows an example where dark spot defects occur in the sub-pixels that do not include the bridge patterns and the electrode patterns in the structure of FIG. 4. Table 2 below shows an example where dark spot defects occur in the sub-pixels that include the bridge patterns and the electrode patterns in the structure of FIG. 4. In Table 2, if a dark spot defect occurred and then the sub-pixel was repaired to eliminate the defect, it was expressed as "normal". In the following tables, a first area refer to an area where the first light-emitting diodes are disposed between the first connection electrode and the third connection electrode in FIG. 4, and a second area refers to an area where the second light-emitting diodes are disposed between the second connection electrode and the fourth connection electrode. In addition, the term "open" means that light-emitting diodes are not disposed in the first or second area, and the term "connect" means that light-emitting diodes are disposed in the first or second area and thus current flows normally. The following tables show states of emission for different cases.

TABLE 1

| # | First Area | Second Area | States of Sub-pixel (Fail/Normal) |
|---|---|---|---|
| 1 | Open | Open | Fail |
| 2 | Open | Connect | Fail |
| 3 | Connect | Open | Fail |
| 4 | Connect | Connect | Normal |

TABLE 2

| # | First Area | Second Area | States of Sub-pixel (Fail/Normal) |
|---|---|---|---|
| 1 | Open | Open | Fail |
| 2 | Open | Connect | Normal |
| 3 | Connect | Open | Normal |
| 4 | Connect | Connect | Normal |

Referring to Tables 1 and 2, only 25% of the sub-pixels of the display device that do not include the bridge patterns and electrode patterns according to one or more embodiments of the present disclosure were normal, whereas 75% of the sub-pixels of the display device that include the bridge patterns and electrode patterns according to one or more embodiments of the present disclosure were normal because the dark spot defect was repaired even if it occurred.

Table 3 below shows an example where dark spot defects occur in the sub-pixels that do not include the bridge patterns and the electrode patterns in the structure of FIG. 20. Table 4 below shows an example where dark spot defects occur in the sub-pixels that include the bridge patterns and the electrode patterns in the structure of FIG. 20. In addition, in the tables below, for example, in FIG. 20, a first area refers to an area where the first light-emitting diodes are disposed between the first connection electrode and the third connection electrode, a second area refers to an area where the second light-emitting diodes are disposed between the fourth connection electrode and the fifth connection electrode, a third area refers to an area where the third light-emitting diodes are disposed between the sixth connection electrode and the seventh connection electrode, and a fourth area refers to an area where the fourth light-emitting diodes are disposed between the second connection electrode and the eighth connection electrode.

TABLE 3

| # | First Area | Second Area | Third area | Fourth Area | Fail/Normal |
|---|---|---|---|---|---|
| 1 | open | open | open | open | Fail |
| 2 | open | open | open | connect | Fail |
| 3 | open | open | connect | open | Fail |
| 4 | open | open | connect | connect | Fail |
| 5 | open | connect | open | open | Fail |
| 6 | open | connect | open | connect | Fail |
| 7 | open | connect | connect | open | Fail |
| 8 | open | connect | connect | connect | Fail |
| 9 | connect | open | open | open | Fail |
| 10 | connect | open | open | connect | Fail |
| 11 | connect | open | connect | open | Fail |
| 12 | connect | open | connect | connect | Fail |
| 13 | connect | connect | open | open | Fail |
| 14 | connect | connect | open | connect | Fail |
| 15 | connect | connect | connect | open | Fail |
| 16 | connect | connect | connect | connect | Normal |

TABLE 4

| # | First Area | Second Area | Third area | Fourth Area | Fail/Normal |
|---|---|---|---|---|---|
| 1 | open | open | open | open | Fail |
| 2 | open | open | open | connect | Normal |
| 3 | open | open | connect | open | Normal |
| 4 | open | open | connect | connect | Normal |
| 5 | open | connect | open | open | Normal |
| 6 | open | connect | open | connect | Normal |
| 7 | open | connect | connect | open | Normal |
| 8 | open | connect | connect | connect | Normal |
| 9 | connect | open | open | open | Normal |
| 10 | connect | open | open | connect | Normal |
| 11 | connect | open | connect | open | Normal |
| 12 | connect | open | connect | connect | Normal |
| 13 | connect | connect | open | open | Normal |
| 14 | connect | connect | open | connect | Normal |
| 15 | connect | connect | connect | open | Normal |
| 16 | connect | connect | connect | connect | Normal |

Referring to Tables 3 and 4, only 6.25% of the sub-pixels of the display device that do not include the bridge patterns and electrode patterns according to one or more embodiments of the present disclosure were normal, whereas 93.75% of the sub-pixels of the display device that include the bridge patterns and electrode patterns according to one or more embodiments of the present disclosure were normal because the dark spot defect was repaired even if it occurred.

In this manner, if no light-emitting diode is disposed between the connection electrodes in the display device according to one or more embodiments of the present disclosure, the dark spot defects can be solved by repairing the sub-pixel.

According to one or more embodiments of the present disclosure, when a current path is disconnected as no light-emitting element is disposed between connection electrodes, an alternative path can be formed between the connection electrodes so that electric current can flow through an electrode pattern and a bridge pattern. For example, in the connection electrodes where no light-emitting element is disposed, the current can be guided to other connection electrodes, so that it can be repaired such that light can be emitted normally in the region where the other light-emitting diodes are disposed. In this manner, it is possible to address the issue of a dark spot of the sub-pixel, thereby improving the productivity.

In concluding the detailed description, those skilled in the art will appreciate that many variations and modifications can be made to the embodiments without substantially departing from the spirit and scope of the present invention. Therefore, the embodiments of the present disclosure are used in a generic and descriptive sense only and not for purposes of limitation.

What is claimed is:

1. A display device comprising:
a first electrode, a second electrode, and a third electrode extending in one direction on a substrate and being spaced from one another;
a first light-emitting element between the first electrode and the second electrode, and a second light-emitting element between the second electrode and the third electrode;
a first connection electrode on the first electrode and in contact with a first end of the first light-emitting element, a second connection electrode on one side of the second electrode and in contact with a first end of the second light-emitting element, a third connection electrode on an opposite side of the second electrode and in contact with a second end of the first light-emitting element, and a fourth connection electrode on the third electrode and in contact with a second end of the second light-emitting element;
a first electrode pattern between the first connection electrode and the third connection electrode and overlapping one end of the first connection electrode and one end of the third connection electrode, and a second electrode pattern between the second connection electrode and the fourth connection electrode and overlapping one end of the second connection electrode and one end of the fourth connection electrode; and
a bridge pattern connecting the first electrode pattern with the second electrode pattern.

2. The display device of claim 1, further comprising: a bank defining an emission area in which the first light-emitting element and the second light-emitting element are located, and at least one subsidiary area spaced from the emission area,
wherein the first electrode pattern, the second electrode pattern, and the bridge pattern are in the subsidiary area.

3. The display device of claim 2, further comprising: one or more insulating layers between the first connection electrode and the first electrode pattern, between the third connection electrode and the first electrode pattern, between the second connection electrode and the second electrode pattern, and between the fourth connection electrode and the second electrode pattern,
wherein the first electrode pattern is connected to the third connection electrode and the second electrode pattern is connected to the fourth connection electrode through contact holes penetrating through the one or more insulating layers.

4. The display device of claim 3, wherein the bridge pattern is connected to the first electrode pattern and the second electrode pattern through other contact holes penetrating through the one or more insulating layers.

5. The display device of claim 3, wherein the first electrode, the second electrode, and the third electrode are under the one or more insulating layers, and
wherein the first electrode pattern and the second electrode pattern are at a same layer as the first electrode, the second electrode, and the third electrode.

6. The display device of claim 3, wherein the first connection electrode, the second connection electrode, the third connection electrode, and the fourth connection electrode are on the one or more insulating layers, and
wherein the bridge pattern is at a same layer as one of the first connection electrode, the second connection electrode, the third connection electrode, and the fourth connection electrode.

7. The display device of claim 6, wherein the one or more insulating layers comprise a first insulating layer on the first electrode, a second insulating layer on the first insulating layer, and a third insulating layer on the second insulating layer,
wherein the first connection electrode and the second connection electrode are on the third insulating layer, wherein the third connection electrode and the fourth connection electrode are between the second insulating layer and the third insulating layer, and
wherein the bridge pattern is on the third insulating layer.

8. The display device of claim 6, wherein the one or more insulating layers comprise a first insulating layer on the first electrode and a second insulating layer on the first insulating layer, wherein the first connection electrode, the second connection electrode, the third connection electrode, and the fourth connection electrode are on the second insulating layer, and
wherein the bridge pattern is on the second insulating layer.

9. A display device comprising:
a first electrode, a second electrode, and a third electrode extending in one direction on a substrate and being spaced from one another;
a first light-emitting element between the first electrode and the second electrode, and a second light-emitting element between the second electrode and the third electrode;
a first connection electrode on the first electrode and in contact with a first end of the first light-emitting element, a second connection electrode on one side of the second electrode and in contact with a first end of the second light-emitting element, a third connection electrode on an opposite side of the second electrode and in contact with a second end of the first light-emitting element, and a fourth connection electrode on the third electrode and in contact with a second end of the second light-emitting element;
a first electrode pattern between the first connection electrode and the third connection electrode and overlapping one end of the first connection electrode and one end of the third connection electrode, and a second electrode pattern between the second connection electrode and the fourth connection electrode and overlapping one end of the second connection electrode and one end of the fourth connection electrode; and
a bridge pattern connecting the first electrode pattern with the second electrode pattern,
wherein one end of the first electrode pattern is connected to the first connection electrode, and an opposite end of the first electrode pattern is connected to the bridge pattern.

10. The display device of claim 9, further comprising: one or more insulating layers between the first connection electrode and the first electrode pattern, between the third connection electrode and the first electrode pattern, between the second connection electrode and the second electrode pattern, and between the fourth connection electrode and the second electrode pattern, respectively,
wherein the first electrode pattern is cut at a first via hole penetrating through the one or more insulating layers, and
wherein the first electrode pattern is connected to the first connection electrode through a second via hole penetrating through the one or more insulating layers, the first electrode pattern, and the first connection electrode.

11. The display device of claim 10, wherein the first electrode pattern and the first connection electrode come in contact with each other on a side surface of the second via hole.

12. The display device of claim 10, wherein one end of the second electrode pattern is connected to the fourth connection electrode and an opposite end of the bridge pattern is connected to the second electrode pattern through other contact holes penetrating through the one or more insulating layers.

13. A display device comprising:
a first electrode and a second electrode extending in one direction on a substrate and being spaced from each other, a third electrode between the first electrode and the second electrode, and a fourth electrode on one side of the second electrode, the fourth electrode opposing the second electrode;

a first connection electrode on the first electrode, a second connection electrode on the second electrode, a third connection electrode on the third electrode and opposing the first connection electrode, a fourth connection electrode on the first electrode and spaced from the first connection electrode in the one direction, and a fifth connection electrode on the third electrode and spaced from the third connection electrode in the one direction;

a first light-emitting element having respective ends in contact with the first connection electrode and the third connection electrode, and a second light-emitting element having respective ends in contact with the fourth connection electrode and the fifth connection electrode;

a first electrode pattern between the first connection electrode and the fourth connection electrode and overlapping one end of the first connection electrode and one end of the fourth connection electrode; and a first bridge pattern between the first connection electrode and the fourth connection electrode, the first bridge pattern crossing the first electrode pattern and the third electrode and connecting the first electrode pattern with the third electrode, wherein the one end of the first electrode pattern is connected to the fourth connection electrode.

14. The display device of claim 13, wherein one or more insulating layers are located between the fourth connection electrode and the first electrode pattern, between the first electrode pattern and the first bridge pattern, and between the first bridge pattern and the third electrode, respectively, and wherein the first electrode pattern is connected to each of the fourth connection electrode and the first bridge pattern through respective contact holes penetrating through the one or more insulating layers, and the first bridge pattern is connected to the third electrode.

15. The display device of claim 14, wherein the third connection electrode is connected to the third electrode through a contact hole penetrating through the one or more insulating layers, and wherein the third connection electrode is electrically connected to the third electrode, the first bridge pattern, the first electrode pattern, and the fourth connection electrode.

16. The display device of claim 15, further comprising: a sixth connection electrode on the fourth electrode, a seventh connection electrode on the second electrode and opposing the sixth connection electrode, and an eighth connection electrode on the fourth electrode and spaced from the seventh connection electrode in the one direction; and a third light-emitting element between the sixth connection electrode and the seventh connection electrode, and a fourth light-emitting diode between the second connection electrode and the eighth connection electrode.

17. The display device of claim 16, further comprising: a second electrode pattern between the fourth connection electrode and the fifth connection electrode and overlapping one end of the fourth connection electrode and one end of the fifth connection electrode;

a third electrode pattern between the sixth connection electrode and the seventh connection electrode and overlapping one end of the sixth connection electrode and one end of the seventh connection electrode; and a second bridge pattern adjacent to the fifth connection electrode and the seventh connection electrode and connected to the second electrode pattern and the third electrode pattern.

18. The display device of claim 17, wherein the second electrode pattern is connected to the fifth connection electrode and the second bridge pattern and the third electrode pattern is connected to a sixth electrode pattern and the second bridge pattern through other contact holes penetrating through the one or more insulating layers.

19. The display device of claim 18, further comprising: a fourth electrode pattern between the seventh connection electrode and the second connection electrode and overlapping one end of the seventh connection electrode and one end of the second connection electrode; and a third bridge pattern between the seventh connection electrode and the second connection electrode, the third bridge pattern crossing the fourth electrode pattern and the fourth electrode, and connecting the fourth electrode pattern with the fourth electrode, wherein the fourth electrode pattern is connected to the seventh connection electrode and the third bridge pattern through respective contact holes penetrating through the one or more insulating layers.

20. A display device comprising:

a first electrode and a second electrode extending in one direction on a substrate and being spaced from each other, a third electrode between the first electrode and the second electrode, and a fourth electrode on one side of the second electrode, the fourth electrode being opposing the second electrode;

a first connection electrode on the first electrode, a second connection electrode on the second electrode, a third connection electrode on the third electrode and opposing the first connection electrode, a fourth connection electrode on the first electrode and spaced from the first connection electrode in the one direction, and a fifth connection electrode on the third electrode and spaced from the third connection electrode in the one direction;

a first light-emitting element having respective ends in contact with the first connection electrode and the third connection electrode, and a second light-emitting element having respective ends in contact with the fourth connection electrode and the fifth connection electrode;

a first electrode pattern between the first connection electrode and the fourth connection electrode, the first electrode pattern overlapping one end of the first connection electrode and one end of the third connection electrode, and connected to one end of the third connection electrode;

a first bridge pattern between the first connection electrode and the fourth connection electrode, the first bridge pattern crossing the first electrode pattern and the third electrode, and connecting the first electrode pattern with the third electrode; and one or more insulating layers between the first connection electrode and the first electrode pattern, between the fourth connection electrode and the first electrode pattern, and between the first bridge pattern and the third electrode, wherein the first bridge pattern is cut at a first via hole penetrating through the one or more insulating layers and the first bridge pattern, and wherein the first electrode pattern is connected to the first connection electrode through a second via hole penetrating through the one or more insulating layers, the first electrode pattern, and the first connection electrode.

\* \* \* \* \*